United States Patent
Yamazaki et al.

(10) Patent No.: US 9,136,390 B2
(45) Date of Patent: Sep. 15, 2015

(54) SEMICONDUCTOR DEVICE AND MANUFACTURING METHOD THEREOF

(75) Inventors: Shunpei Yamazaki, Setagaya (JP); Junichiro Sakata, Atsugi (JP); Jun Koyama, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/104,546

(22) Filed: May 10, 2011

(65) Prior Publication Data

US 2011/0215319 A1    Sep. 8, 2011

Related U.S. Application Data

(63) Continuation of application No. 12/646,085, filed on Dec. 23, 2009, now Pat. No. 8,222,092.

(30) Foreign Application Priority Data

Dec. 26, 2008    (JP) ................................. 2008-333788

(51) Int. Cl.
| | |
|---|---|
| H01L 29/10 | (2006.01) |
| H01L 29/786 | (2006.01) |
| H01L 27/12 | (2006.01) |
| H01L 29/66 | (2006.01) |
| H01L 21/02 | (2006.01) |

(52) U.S. Cl.
CPC ........ *H01L 29/7869* (2013.01); *H01L 27/1225* (2013.01); *H01L 29/66969* (2013.01);
(Continued)

(58) Field of Classification Search
USPC ................ 257/43, 52, 57, E29.095, E31.109, 257/E21.126, 213
See application file for complete search history.

(56) References Cited

U.S. PATENT DOCUMENTS

| | | | |
|---|---|---|---|
| 5,616,935 A | 4/1997 | Koyama et al. | |
| 5,731,856 A | 3/1998 | Kim et al. | |

(Continued)

FOREIGN PATENT DOCUMENTS

| | | |
|---|---|---|
| CN | 1941299 | 4/2007 |
| CN | 1988169 | 6/2007 |

(Continued)

OTHER PUBLICATIONS

Nomura et al., "Room-Temperature Fabrication of Transparent Flexible Thin-Film Transistors Using Amorphous Oxide Semiconductors," Nature, Nov. 25, 2004, vol. 432, pp. 488-492.

(Continued)

*Primary Examiner* — Julia Slutsker
(74) *Attorney, Agent, or Firm* — Eric J. Robinson; Robinson Intellectual Property Law Office, P.C.

(57) ABSTRACT

A semiconductor device which includes a thin film transistor having an oxide semiconductor layer and excellent electrical characteristics is provided. Further, a method for manufacturing a semiconductor device in which plural kinds of thin film transistors of different structures are formed over one substrate to form plural kinds of circuits and in which the number of steps is not greatly increased is provided. After a metal thin film is formed over an insulating surface, an oxide semiconductor layer is formed thereover. Then, oxidation treatment such as heat treatment is performed to oxidize the metal thin film partly or entirely. Further, structures of thin film transistors are different between a circuit in which emphasis is placed on the speed of operation, such as a logic circuit, and a matrix circuit.

13 Claims, 24 Drawing Sheets

(52) U.S. Cl.
CPC ..... *H01L29/78696* (2013.01); *H01L 21/02554* (2013.01); *H01L 21/02565* (2013.01); *H01L 21/02631* (2013.01)

(56) References Cited

U.S. PATENT DOCUMENTS

| | | | |
|---|---|---|---|
| 5,744,864 A | 4/1998 | Cillessen et al. | |
| 5,847,410 A | 12/1998 | Nakajima | |
| 5,877,513 A | 3/1999 | Koyama et al. | |
| 5,946,544 A | 8/1999 | Estes et al. | |
| 6,124,603 A | 9/2000 | Koyama et al. | |
| 6,294,274 B1 | 9/2001 | Kawazoe et al. | |
| 6,492,685 B1 | 12/2002 | Koyama et al. | |
| 6,563,174 B2 | 5/2003 | Kawasaki et al. | |
| 6,586,346 B1 | 7/2003 | Yamazaki et al. | |
| 6,680,242 B2 | 1/2004 | Ohtsu et al. | |
| 6,727,522 B1 | 4/2004 | Kawasaki et al. | |
| 6,838,308 B2* | 1/2005 | Haga | 438/104 |
| 6,875,999 B2 | 4/2005 | Koyama et al. | |
| 6,960,812 B2 | 11/2005 | Yamazaki et al. | |
| 7,049,187 B2 | 5/2006 | Yamamoto et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,067,843 B2 | 6/2006 | Carcia et al. | |
| 7,105,868 B2 | 9/2006 | Nause et al. | |
| 7,144,766 B2 | 12/2006 | Yamamoto et al. | |
| 7,145,174 B2 | 12/2006 | Chiang et al. | |
| 7,151,520 B2 | 12/2006 | Maki | |
| 7,211,825 B2 | 5/2007 | Shih et al | |
| 7,227,229 B2 | 6/2007 | Koyma et al. | |
| 7,245,342 B2* | 7/2007 | Shin et al. | 349/152 |
| 7,262,463 B2 | 8/2007 | Hoffman | |
| 7,282,782 B2 | 10/2007 | Hoffman et al. | |
| 7,297,977 B2 | 11/2007 | Hoffman et al. | |
| 7,298,084 B2 | 11/2007 | Baude et al. | |
| 7,300,833 B2 | 11/2007 | Yamamoto et al. | |
| 7,301,211 B2 | 11/2007 | Yamazaki et al. | |
| 7,323,356 B2 | 1/2008 | Hosono et al. | |
| 7,339,187 B2 | 3/2008 | Wager et al. | |
| 7,339,269 B2 | 3/2008 | Matsuki et al. | |
| 7,382,421 B2 | 6/2008 | Hoffman et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,427,776 B2 | 9/2008 | Hoffman et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,470,607 B2 | 12/2008 | Carcia et al. | |
| 7,479,419 B2 | 1/2009 | Cho et al. | |
| 7,501,293 B2 | 3/2009 | Ito et al. | |
| 7,507,618 B2 | 3/2009 | Dunbar | |
| 7,544,967 B2 | 6/2009 | Kim et al. | |
| 7,566,904 B2 | 7/2009 | Ishii | |
| 7,575,966 B2 | 8/2009 | Lai et al. | |
| 7,576,394 B2 | 8/2009 | Furuta et al. | |
| 7,601,984 B2 | 10/2009 | Sano et al. | |
| 7,608,531 B2 | 10/2009 | Isa et al. | |
| 7,622,371 B2 | 11/2009 | Pan et al. | |
| 7,635,889 B2 | 12/2009 | Isa et al. | |
| 7,645,478 B2 | 1/2010 | Thelss et al. | |
| 7,651,899 B2 | 1/2010 | Lim | |
| 7,663,302 B2 | 2/2010 | Shin et al. | |
| 7,674,650 B2 | 3/2010 | Akimoto et al. | |
| 7,691,666 B2 | 4/2010 | Levy et al. | |
| 7,719,185 B2 | 5/2010 | Jin et al. | |
| 7,732,251 B2 | 6/2010 | Hoffman et al. | |
| 7,732,819 B2 | 6/2010 | Akimoto et al. | |
| 7,733,015 B2 | 6/2010 | Saito | |
| 7,767,106 B2 | 8/2010 | Chang | |
| 7,772,021 B2 | 8/2010 | Lee et al. | |
| 7,777,224 B2 | 8/2010 | Hosoya et al. | |
| 7,791,072 B2 | 9/2010 | Kumomi et al. | |
| 7,791,074 B2 | 9/2010 | Iwasaki | |
| 7,791,082 B2 | 9/2010 | Iwasaki | |
| 7,795,613 B2 | 9/2010 | Ito et al. | |
| 7,829,444 B2 | 11/2010 | Yabuta et al. | |
| 7,859,510 B2 | 12/2010 | Umezaki | |
| 7,863,611 B2 | 1/2011 | Abe et al. | |
| 7,867,636 B2 | 1/2011 | Nakagawara et al. | |
| 7,868,326 B2 | 1/2011 | Sano et al. | |
| 7,872,259 B2 | 1/2011 | Den et al. | |
| 7,884,360 B2 | 2/2011 | Takechi et al. | |
| 7,910,490 B2 | 3/2011 | Akimoto et al. | |
| 7,910,920 B2 | 3/2011 | Park et al. | |
| 7,923,722 B2 | 4/2011 | Ryu et al. | |
| 7,932,521 B2 | 4/2011 | Akimoto et al. | |
| 7,935,641 B2 | 5/2011 | Kim et al. | |
| 7,939,822 B2 | 5/2011 | Maekawa et al. | |
| 7,940,345 B2 | 5/2011 | Yamazaki | |
| 7,982,215 B2 | 7/2011 | Inoue et al. | |
| 8,030,195 B2 | 10/2011 | Inoue et al. | |
| 8,039,835 B2 | 10/2011 | Ichikiwa et al. | |
| 8,039,836 B2 | 10/2011 | Chang | |
| 8,070,917 B2 | 12/2011 | Tsukamoto | |
| 8,093,112 B2 | 1/2012 | Miyairi et al. | |
| 8,093,589 B2 | 1/2012 | Sugihara et al. | |
| 8,143,115 B2 | 3/2012 | Omura et al. | |
| 8,143,678 B2 | 3/2012 | Kim et al. | |
| 8,148,721 B2 | 4/2012 | Hayashi et al. | |
| 8,154,017 B2 | 4/2012 | Yabuta et al. | |
| 8,178,883 B2 | 5/2012 | Cho et al. | |
| 8,188,467 B2 | 5/2012 | Itagaki et al. | |
| 8,193,045 B2 | 6/2012 | Omura et al. | |
| 8,232,552 B2 | 7/2012 | Yano et al. | |
| 8,273,614 B2 | 9/2012 | Hosoya et al. | |
| 8,274,077 B2 | 9/2012 | Akimoto et al. | |
| 8,304,298 B2 | 11/2012 | Ofuji et al. | |
| 8,304,359 B2 | 11/2012 | Yano et al. | |
| 8,304,765 B2 | 11/2012 | Yamazaki et al. | |
| 8,349,647 B2 | 1/2013 | Ryu et al. | |
| 8,420,442 B2 | 4/2013 | Takechi et al. | |
| 8,502,222 B2 | 8/2013 | Yabuta et al. | |
| 8,558,323 B2 | 10/2013 | Kim et al. | |
| 2001/0046027 A1 | 11/2001 | Tai et al. | |
| 2002/0056838 A1 | 5/2002 | Ogawa | |
| 2003/0020853 A1* | 1/2003 | Park et al. | 349/113 |
| 2003/0189401 A1 | 10/2003 | Kido et al. | |
| 2005/0199880 A1 | 9/2005 | Hoffman et al. | |
| 2005/0208329 A1 | 9/2005 | Conley | |
| 2005/0275038 A1 | 12/2005 | Shih et al. | |
| 2006/0008952 A1 | 1/2006 | Wu et al. | |
| 2006/0027804 A1* | 2/2006 | Yamazaki et al. | 257/59 |
| 2006/0063346 A1 | 3/2006 | Lee et al. | |
| 2006/0113565 A1* | 6/2006 | Abe et al. | 257/197 |
| 2006/0163655 A1 | 7/2006 | Hoffman et al. | |
| 2006/0197092 A1 | 9/2006 | Hoffman et al. | |
| 2006/0208977 A1 | 9/2006 | Kimura | |
| 2006/0238135 A1 | 10/2006 | Kimura | |
| 2006/0244107 A1 | 11/2006 | Sugihara et al. | |
| 2007/0052025 A1 | 3/2007 | Yabuta | |
| 2007/0063211 A1 | 3/2007 | Iwasaki | |
| 2007/0072439 A1 | 3/2007 | Akimoto et al. | |
| 2007/0090365 A1 | 4/2007 | Hayashi et al. | |
| 2007/0108446 A1 | 5/2007 | Akimoto | |
| 2007/0146591 A1 | 6/2007 | Kimura et al. | |
| 2007/0152214 A1* | 7/2007 | Hoffman et al. | 257/43 |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0194379 A1 | 8/2007 | Hosono et al. | |
| 2007/0196962 A1* | 8/2007 | Morisue et al. | 438/149 |
| 2007/0252928 A1 | 11/2007 | Ito et al. | |
| 2007/0254456 A1 | 11/2007 | Maruyama et al. | |
| 2007/0262352 A1* | 11/2007 | Hirabayashi et al. | 257/213 |
| 2007/0264699 A1 | 11/2007 | Bussiere et al. | |
| 2007/0267699 A1* | 11/2007 | Hoffman | 257/347 |
| 2007/0272922 A1 | 11/2007 | Kim et al. | |
| 2007/0275166 A1 | 11/2007 | Thridandam et al. | |
| 2007/0287296 A1 | 12/2007 | Chang | |
| 2008/0006877 A1 | 1/2008 | Mardilovich et al. | |
| 2008/0048190 A1* | 2/2008 | Ishii | 257/71 |
| 2008/0106191 A1 | 5/2008 | Kawase | |

(56) References Cited

U.S. PATENT DOCUMENTS

| | | | |
|---|---|---|---|
| 2008/0129195 A1 | 6/2008 | Ishizaki et al. | |
| 2008/0182358 A1 | 7/2008 | Cowdery-Corvan et al. | |
| 2008/0203387 A1 | 8/2008 | Kang et al. | |
| 2008/0204850 A1 | 8/2008 | Agrawal et al. | |
| 2008/0206935 A1 | 8/2008 | Jang et al. | |
| 2008/0224133 A1 | 9/2008 | Park et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0277658 A1 | 11/2008 | Lee et al. | |
| 2008/0296568 A1 | 12/2008 | Ryu et al. | |
| 2008/0308796 A1 | 12/2008 | Akimoto et al. | |
| 2008/0308805 A1 | 12/2008 | Akimoto et al. | |
| 2008/0308806 A1 | 12/2008 | Akimoto et al. | |
| 2009/0002348 A9* | 1/2009 | Morita et al. | 345/204 |
| 2009/0002357 A1 | 1/2009 | John et al. | |
| 2009/0008639 A1 | 1/2009 | Akimoto et al. | |
| 2009/0065771 A1 | 3/2009 | Iwasaki et al. | |
| 2009/0073325 A1 | 3/2009 | Kuwabara et al. | |
| 2009/0101895 A1* | 4/2009 | Kawamura et al. | 257/43 |
| 2009/0114910 A1 | 5/2009 | Chang | |
| 2009/0134399 A1 | 5/2009 | Sakakura et al. | |
| 2009/0179199 A1 | 7/2009 | Sano et al. | |
| 2009/0186437 A1 | 7/2009 | Akimoto | |
| 2009/0186445 A1 | 7/2009 | Akimoto | |
| 2009/0189155 A1 | 7/2009 | Akimoto | |
| 2009/0189156 A1 | 7/2009 | Akimoto | |
| 2009/0278122 A1 | 11/2009 | Hosono et al. | |
| 2009/0280600 A1 | 11/2009 | Hosono et al. | |
| 2009/0305461 A1 | 12/2009 | Akimoto et al. | |
| 2010/0025678 A1 | 2/2010 | Yamazaki et al. | |
| 2010/0073268 A1 | 3/2010 | Matsunaga et al. | |
| 2010/0136743 A1 | 6/2010 | Akimoto et al. | |
| 2010/0163868 A1 | 7/2010 | Yamazaki et al. | |
| 2010/0163876 A1 | 7/2010 | Inoue et al. | |
| 2010/0285632 A1 | 11/2010 | Inoue et al. | |
| 2011/0042669 A1 | 2/2011 | Kim et al. | |
| 2011/0104851 A1 | 5/2011 | Akimoto et al. | |
| 2011/0117697 A1 | 5/2011 | Akimoto et al. | |
| 2011/0121290 A1 | 5/2011 | Akimoto et al. | |
| 2011/0133183 A1 | 6/2011 | Yamazaki et al. | |
| 2011/0141100 A1 | 6/2011 | Park et al. | |
| 2011/0163311 A1 | 7/2011 | Akimoto et al. | |
| 2011/0175090 A1 | 7/2011 | Sugihara et al. | |
| 2011/0187694 A1 | 8/2011 | Umezaki | |
| 2011/0210328 A1 | 9/2011 | Yamazaki et al. | |
| 2011/0212571 A1 | 9/2011 | Yamazaki et al. | |
| 2011/0215318 A1 | 9/2011 | Yamazaki et al. | |
| 2011/0291089 A1 | 12/2011 | Akimoto et al. | |
| 2012/0068173 A1 | 3/2012 | Umezaki | |
| 2012/0132908 A1 | 5/2012 | Sugihara et al. | |
| 2012/0168750 A1 | 7/2012 | Hayashi et al. | |
| 2013/0277672 A1 | 10/2013 | Sano et al. | |

FOREIGN PATENT DOCUMENTS

| | | |
|---|---|---|
| CN | 001992236 | 7/2007 |
| CN | 101036232 | 9/2007 |
| CN | 101258606 | 9/2008 |
| CN | 101273153 | 9/2008 |
| CN | 101283388 | 10/2008 |
| CN | 101304046 | 11/2008 |
| EP | 1432027 A | 6/2004 |
| EP | 1 737 044 A | 12/2006 |
| EP | 1770788 A | 4/2007 |
| EP | 1801881 A | 6/2007 |
| EP | 1804290 A | 7/2007 |
| EP | 1933293 | 6/2008 |
| EP | 1953813 A | 8/2008 |
| EP | 1983499 A | 10/2008 |
| EP | 1995787 A | 11/2008 |
| EP | 1998373 A | 12/2008 |
| EP | 1998374 A | 12/2008 |
| EP | 1998375 A | 12/2008 |
| EP | 2 226 847 A | 9/2010 |
| EP | 2453480 A | 5/2012 |
| EP | 2453481 A | 5/2012 |
| EP | 2455975 A | 5/2012 |
| JP | 60-017962 | 1/1985 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-231472 A | 10/1991 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 | 5/2000 |
| JP | 2002-076356 A | 3/2002 |
| JP | 2002-289859 A | 10/2002 |
| JP | 2002-372722 | 12/2002 |
| JP | 2003-086000 A | 3/2003 |
| JP | 2003-086808 A | 3/2003 |
| JP | 2003-122313 | 4/2003 |
| JP | 2003-208132 | 7/2003 |
| JP | 2004-103957 | 4/2004 |
| JP | 2004-104146 A | 4/2004 |
| JP | 2004-273614 A | 9/2004 |
| JP | 2004-273732 A | 9/2004 |
| JP | 2005-252284 A | 9/2005 |
| JP | 2005-257997 | 9/2005 |
| JP | 2006-165529 A | 6/2006 |
| JP | 2007-073701 A | 3/2007 |
| JP | 2007-073705 A | 3/2007 |
| JP | 2007-096055 | 4/2007 |
| JP | 2007-123861 | 5/2007 |
| JP | 2007-150158 | 6/2007 |
| JP | 2007-212699 A | 8/2007 |
| JP | 2007-250983 A | 9/2007 |
| JP | 2007-299913 A | 11/2007 |
| JP | 2007-318105 A | 12/2007 |
| JP | 2008-042088 A | 2/2008 |
| JP | 2008-085048 A | 4/2008 |
| JP | 2008-153535 A | 7/2008 |
| JP | 2008-199005 A | 8/2008 |
| JP | 2008-205469 A | 9/2008 |
| JP | 2008-241789 A | 10/2008 |
| JP | 2008-243928 A | 10/2008 |
| JP | 2008-276211 A | 11/2008 |
| JP | 2008-277326 A | 11/2008 |
| JP | 2008-300518 A | 12/2008 |
| KR | 2005-0117286 A | 12/2005 |
| KR | 2006-0073539 A | 6/2006 |
| KR | 2006-0119218 A | 11/2006 |
| KR | 2007-0090182 A | 9/2007 |
| KR | 2008-0104860 A | 12/2008 |
| TW | 200849475 | 12/2008 |
| WO | WO-03/032385 | 4/2003 |
| WO | WO 2004/114391 | 12/2004 |
| WO | WO-2006/041578 | 4/2006 |
| WO | WO-2006/051993 | 5/2006 |
| WO | WO-2007/029584 | 3/2007 |
| WO | WO 2007/119386 | 10/2007 |
| WO | WO-2008/069056 | 6/2008 |
| WO | WO-2008/069255 | 6/2008 |
| WO | WO-2008/126883 | 10/2008 |
| WO | WO-2008/133220 | 11/2008 |
| WO | WO-2008/143304 | 11/2008 |
| WO | WO-2008/149754 | 12/2008 |
| WO | WO-2008/149873 | 12/2008 |

OTHER PUBLICATIONS

Prins et al., "A Ferroelectric Transparent Thin-Film Transistor," Appl. Phys. Lett. (Applied Physics Letters), Jun. 17, 1996, vol. 68, No. 25, pp. 3650-3652.

Nakamura et al., "The Phase Relations in the $In_2O_3$—$Ga_2ZnO_4$—Zno System at 1350° C.," Journal of Solid State Chemistry, Aug. 1, 1991, vol. 93, No. 2, pp. 298-315.

(56) References Cited

OTHER PUBLICATIONS

Kimizuka et al., "Syntheses and Single-Crystal Data of Homologous Compounds, $In_2O_3(ZnO)m$ ($m$ = 3, 4, and 5), $InGaO_3(ZnO)_3$, and $Ga_2O_3(ZnO)m$ ($m$ = 7, 8, 9, and 16) in the $In_2O_3$—$ZnGa_2O_4$—ZnO System," Journal of Solid State Chemistry, Apr. 1, 1995, vol. 116, No. 1, pp. 170-178.

Nomura et al., "Thin-Film Transistor Fabricated in Single-Crystalline Transparent Oxide Semiconductor," Science, May 23, 2003, vol. 300, pp. 1269-1272.

Nakamura et al., "Syntheses and crystal structures of new homologous compounds, indium iron zinc oxides ($InFeO_3(ZnO)m$) ($m$: natural number) and related compounds," Kotai Butsuri (Solid State Physics), 1993, vol. 28, No. 5, pp. 317-327.

Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.

Ikeda et al., "Full-Functional System Liquid Crystal Display Using CG-Silicon TechnologY," SID Digest '04: SID International Symposium Digest of Technical Papers, 2004, vol. 35, pp. 860-863.

Takahashi et al., "Theoretical Analysis of IGZO Transparent Amorphous Oxide Semiconductor," IDW '08: Proceedings of the $15^{th}$ International Display Workshops, Dec. 3, 2008, pp. 1637-1640.

Osada et al., "15.2: Development of Driver-Integrated Panel using Amorphous In—Ga—Zn—Oxide TFT," SID Digest '09: SID International Symposium Digest of Technical Papers, May 31, 2009, pp. 184-187.

Li et al., "Modulated Structures of Homologous Compounds $InMO_3(ZnO)m$ (M=In,Ga; m=Integer) Described by Four-Dimensional Superspace Group," Journal of Solid State Chemistry, 1998, vol. 139, pp. 347-355.

Lee et al., "World's Largest (15-Inch) XGA AMLCD Panel using IGZO Oxide TFT," SID Digest '08: SID International Symposium Digest of Technical Papers, May 20, 2008, vol. 39, pp. 625-628.

Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.

Kanno et al., "White Stacked Electrophosphorecent Organic Light-Emitting Devices Employing $MoO_3$ as a Charge-Generation Layer," Adv. Mater. (Advanced Materials), 2006, vol. 18, No. 3, pp. 339-342.

Tsuda et al., "Ultra Low Power Consumption Technologies for Mobile TFT-LCDs," IDW '02: Proceedings of the $9^{th}$ International Display Workshops, Dec. 4, 2002, pp. 295-298.

Jeong et al., "3.1: Distinguished Paper: 12.1-Inch WXGA AMOLED Display Driven by Indium—Gallium—Zinc Oxide TFTs Array," SID Digest '08: SID International Symposium Digest of Technical Papers, May 20, 2008, vol. 39, No. 1, pp. 1-4.

Park et al., "High performance amorphous oxide thin film transistors with self-aligned top-gate structure," IEDM 09: Technical Digest of International Electron Devices Meeting, Dec. 7, 2009, pp. 191-194.

Kurokawa et al., "UHF RFCPUS on Flexible and Glass Substrates for Secure RFID Systems," Journal of Solid-State Circuits, 2008, vol. 43, No. 1, pp. 292-299.

Ohara et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Coates et al., "Optical Studies of the Amorphous Liquid-Cholesteric Liquid Crystal Transition: the "Blue Phase"," Physics Letters, Sep. 10, 1973, vol. 45A, No. 2, pp. 115-116.

Cho et al., "21.2: AL and SN-Doped Zinc Indium Oxide Thin Film Transistors for AMOLED Back-Plane," SID Digest '09: SID International Symposium Digest of Technical Papers, May 31, 2009, pp. 280-283.

Lee et al., "15.4: Excellent Performance of Indium—Oxide-Based Thin-Film Transistors by DC Sputtering," SID Digest '09: SID International Symposium Digest of Technical Papers, May 31, 2009, pp. 191-193.

Jin et al., "65.2: Distinguished Paper: World-Largest (6.5") Flexible Full Color Top Emission AMOLED Display on Plastic Film and its Bending Properties," SID Digest '09: SID International Symposium Digest of Technical Papers, May 31, 2009, pp. 983-985.

Sakata et al., "Development of 4.0-in. AMOLED Display with Driver Circuit using Amorphous In—Ga—Zn—Oxide TFTs," IDW '09: Proceedings of the $16^{th}$ International Display Workshops, 2009, pp. 689-692.

Park et al., "Amorphous Indium—Gallium—Zinc Oxide TFTs and their Application for Large Size AMOLED," AM-FPD '08 Digest of Technical Papers, Jul. 2, 2008, pp. 275-278.

Park et al., "Challenge to Future Displays: Transparent AM-OLED Driven by PEALD Grown ZnO TFT," IMID '07 Digest, 2007, pp. 1249-1252.

Godo et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Osada et al., "Development of Driver-Integrated Panel Using Amorphous In—Ga—Zn—Oxide TFT," AM-FPD '09 Digest of Technical Papers, Jul. 1, 2009, pp. 33-36.

Hirao et al., "Novel Top-Gate Zinc Oxide Thin-Film Transistors (ZnO TFTS) for AMLCDS," Journal of the SID, 2007, vol. 15, No. 1, pp. 17-22.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Godo et al., "P-9: Numerical Analysis on Temperature Dependence of Characteristics of Amorphous In—Ga—Zn—Oxide TFT," SID Digest '09: SID International Symposium Digest of Technical Papers, May 31, 2009, pp. 1110-1112.

Ohara et al., "21.3: 4.0 in. QVGA AMOLED Display Using In—Ga—Zn—Oxide TFTS With a Novel Passivation Layer," SID Digest '09: SID International Symposium Digest of Technical Papers, May 31, 2009, pp. 284-287.

Miyasaka, "58.2 Invited Paper: Suftla Flexible Microelectronics on Their Way to Business," SID Digest '07: SID International Symposium Digest of Technical Papers, 2007, vol. 38, pp. 1673-1676.

Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Asaoka et al., "29.1: Polarizer-Free Reflective LCD Combined With Ultra Low-Power Driving Technology," SID Digest '09: SID International Symposium Digest of Technical Papers, 2009, pp. 395-398.

Lee et al., "Current Status of, Challenges to, and Perspective View of AM-OLED," IDW '06: Proceedings of the $13^{th}$ International Display Workshops, Dec. 7, 2006, pp. 663-666.

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Kikuchi et al., "Polymer-Stabilized Liquid Crystal Blue Phases," Nature Materials, Sep. 2, 2002, vol. 1, pp. 64-68.

Kimizuka et al., "Spinel, $YbFe_2O_4$, and $Yb_2Fe_3O_7$ Types of Structures for Compounds in the $In_2O_3$ and $Sc_2O_3$—$A_2O_3$—BO Systems [A: Fe, Ga, or Al; B: Mg, Mn, Fe, Ni, Cu, or Zn] at Temperatures Over 1000° C.," Journal of Solid State Chemistry, 1985, vol. 60, pp. 382-384.

Kitzerow et al., "Observation of Blue Phases in Chiral Networks," Liquid Crystals, 1993, vol. 14, No. 3, pp. 911-916.

Costello et al., "Electron Microscopy of a Cholesteric Liquid Crystal and Its Blue Phase," Phys. Rev. A (Physical Review A), May 1, 1984, vol. 29, No. 5, pp. 2957-2959.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

Fortunato et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

(56) References Cited

OTHER PUBLICATIONS

Park et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.
Hayashi et al., "42.1: Invited Paper: Improved Amorphous In—Ga—Zn—O TFTs," SID Digest '08: SID International Symposium Digest of Technical Papers, May 20, 2008, vol. 39, pp. 621-624.
Masuda et al., "Transparent thin film transistors using ZnO as an active channel layer and their electrical properties," J. Appl. Phys. (Journal of Applied Physics), Feb. 1, 2003, vol. 93, No. 3, pp. 1624-1630.
Asakuma et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.
Nomura et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995.
Son et al., "42.4L: Late-News Paper: 4 Inch QVGA AMOLED Driven by the Threshold Voltage Controlled Amorphous GIZO ($Ga_2O_3$—$In_2O_3$—ZnO) TFT," SID Digest '08: SID International Symposium Digest of Technical Papers, May 20, 2008, vol. 39, pp. 633-636.
Van de Walle, "Hydrogen as a Cause of Doping in Zinc Oxide," Phys. Rev. Lett. (Physical Review Letters), Jul. 31, 2000, vol. 85, No. 5, pp. 1012-1015.
Fung et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.
Nakamura, "Synthesis of Homologous Compound with New Long-Period Structure," Nirim Newsletter, Mar. 1, 1995, vol. 150, pp. 1-4.
Park et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.
Orita et al., "Mechanism of Electrical Conductivity of Transparent $InGaZnO_4$," Phys. Rev. B (Physical Review. B), Jan. 15, 2000, vol. 61, No. 3, pp. 1811-1816.
Nomura et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.
Janotti et al., "Native Point Defects in ZnO," Phys. Rev. B (Physical Review. B), 2007, vol. 76, pp. 165202-1-165202-22.
Park et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.
Hsieh et al., "P-29: Modeling of Amorphous Oxide Semiconductor Thin Film Transistors and Subgap Density of States," SID Digest '08: SID International Symposium Digest of Technical Papers, 2008, vol. 39, pp. 1277-1280.
Janotti et al., "Oxygen Vacancies in ZnO," Appl. Phys. Lett. (Applied Physics Letters), 2005, vol. 87, pp. 122102-1-122102-3.
Oba et al., "Defect energetics in ZnO: A hybrid Hartree-Fock density functional study," Phys. Rev. B (Physical Review. B), 2008, vol. 77, pp. 245202-1-245202-6.
Orita et al., "Amorphous transparent conductive oxide $InGaO3(ZnO)m$ (m<4): a Zn4s conductor," Philosophical Magazine, 2001, vol. 81, No. 5, pp. 501-515.
Hosono et al., "Working hypothesis to explore novel wide band gap electrically conducting amorphous oxides and examples," J. Non-Cryst. Solids (Journal of Non-Crystalline Solids), 1996, vol. 198-200, pp. 165-169.
Mo et al., "Amorphous Oxide TFT Backplanes for Large Size AMOLED Displays," IDW '08: Proceedings of the 6th International Display Workshops, Dec. 3, 2008, pp. 581-584.
Kim et al., "High-Performance oxide thin film transistors passivated by various gas plasmas," $214^{th}$ ECS Meeting, 2008, No. 2317.
Clark et al., "First Principles Methods Using CASTEP," Zeitschrift fur Kristallographie, 2005, vol. 220, pp. 567-570.
Lany et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.
Park et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.
Oh et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.
Ueno et al., "Field-Effect Transistor on $SrTiO_3$ with Sputtered $Al_2O_3$ Gate Insulator," Appl. Phys. Lett. (Applied Physics Letters), Sep. 1, 2003, vol. 83, No. 9, pp. 1755-1757.
Office Action (U.S. Appl. No. 13/104,540) dated Oct. 3, 2011.
Office Action (U.S. Appl. No. 12/646,085) dated Aug. 29, 2011.
Office Action (U.S. Appl. No. 12/646,085) dated Jul. 8, 2011.
Office Action (U.S. Appl. No. 13/104,548) dated Jun. 15, 2012.
Office Action (U.S. Appl. No. 13/104,551) dated Aug. 10, 2012.
Notice of Allowance (U.S. Appl. No. 12/646,085) dated Apr. 18, 2012.
Office Action (U.S. Appl. No. 13/104,548) dated May 14, 2012.
Notice of Allowance (U.S. Appl. No. 12/646,085) dated Feb. 2, 2012.
Office Action (U.S. Appl. No. 13/104,540) dated Feb. 23, 2012.
Office Action (U.S. Appl. No. 13/104,551) dated Apr. 25, 2012.
Korean Office Action (Application No. 2011-0055776) Dated Sep. 17, 2012.
Korean Office Action (Application No. 2011-0055781) Dated Sep. 18, 2012.
Korean Office Action (Application No. 2011-0055788) Dated Sep. 21, 2012.
Korean Office Action (Application No. 2011-0055794) Dated Sep. 21, 2012.
Office Action (U.S. Appl. No. 13/104,548) dated Nov. 26, 2012.
Office Action (U.S. Appl. No. 13/104,540) dated Sep. 21, 2012.
Korean Office Action (Application No. 2011-0055776) Dated Jan. 17, 2013.
Chinese Office Action (Application No. 201110144092.7) Dated Jan. 25, 2013.
Korean Office Action (Application No. 2011-0055781) Dated Mar. 22, 2013.
Chinese Office Action (Application No. 201110144189.8) Dated Nov. 30, 2012.
Korean Office Action (Application No. 2011-0055794; KR12114D4) Dated Mar. 11, 2013.
Chinese Office Action (Application No. 201110144158.2; CN12114D4) Dated Mar. 4, 2013.
Taiwanese Office Action (Application No. 100118209; TW12114D1) Dated Sep. 18, 2013.
Chinese Office Action (Application No. 201110143920.5; CN12114D2) Dated Nov. 1, 2013.
Chinese Office Action (Application No. 200910262560.3) Dated Jul. 18, 2013.
Chinese Office Action (Application No. 201110144189.8) Dated Feb. 21, 2014.
Song et al. "Short Channel Characteristics of Gallium-Indium-Zinc-Oxide Thin Film Transistors for Three-Dimensional Stacking Memory", pp. 549-552, IEEE Electron Device Letters, Jun. 2008, vol. 29, No. 6.
Taiwanese Office Action (Application No. 100118210) Dated May 12, 2014.
Taiwanese Office Action (Application No. 98143357) Dated Sep. 5, 2014.

* cited by examiner

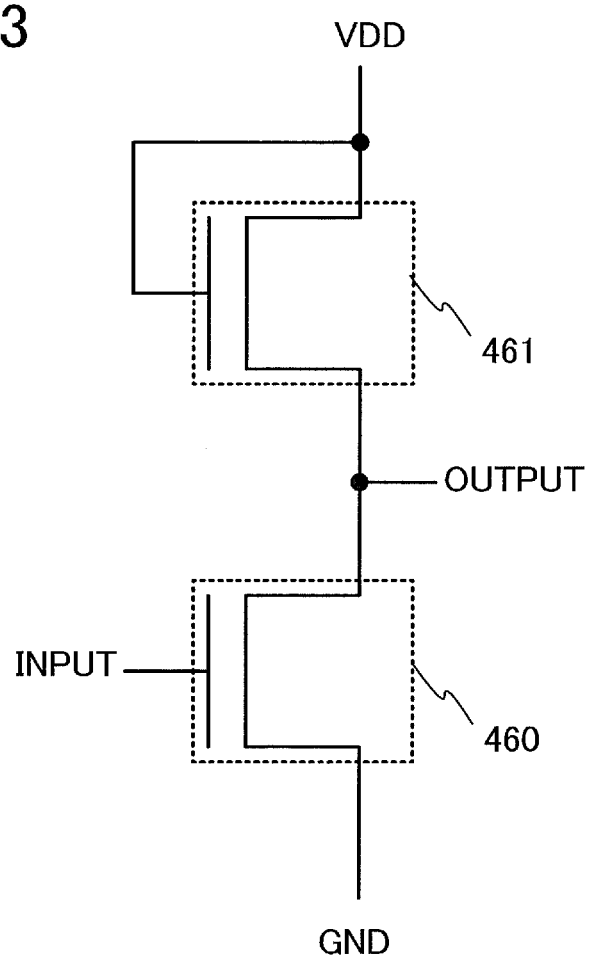

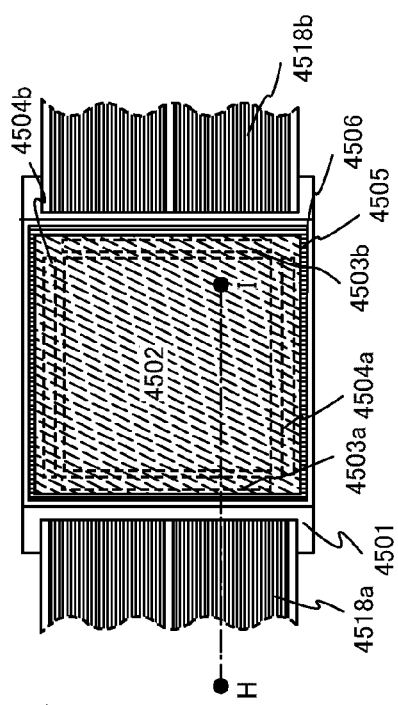
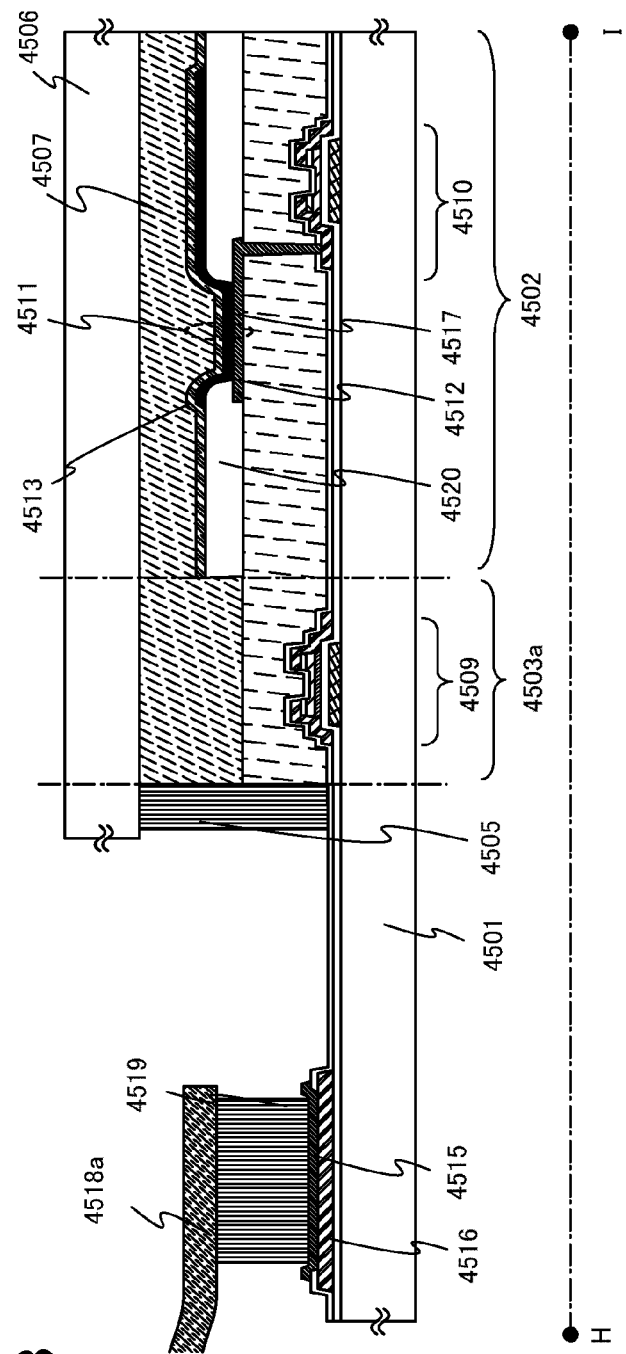
FIG. 12A
FIG. 12B

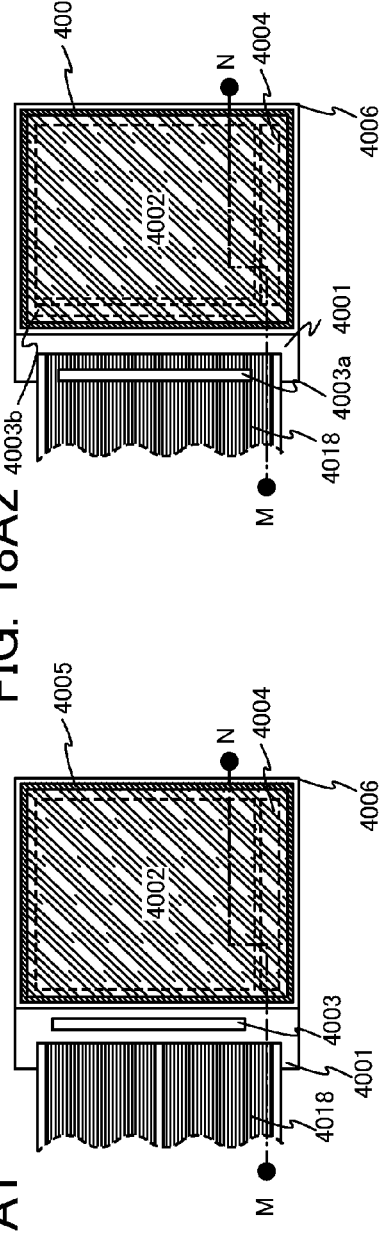
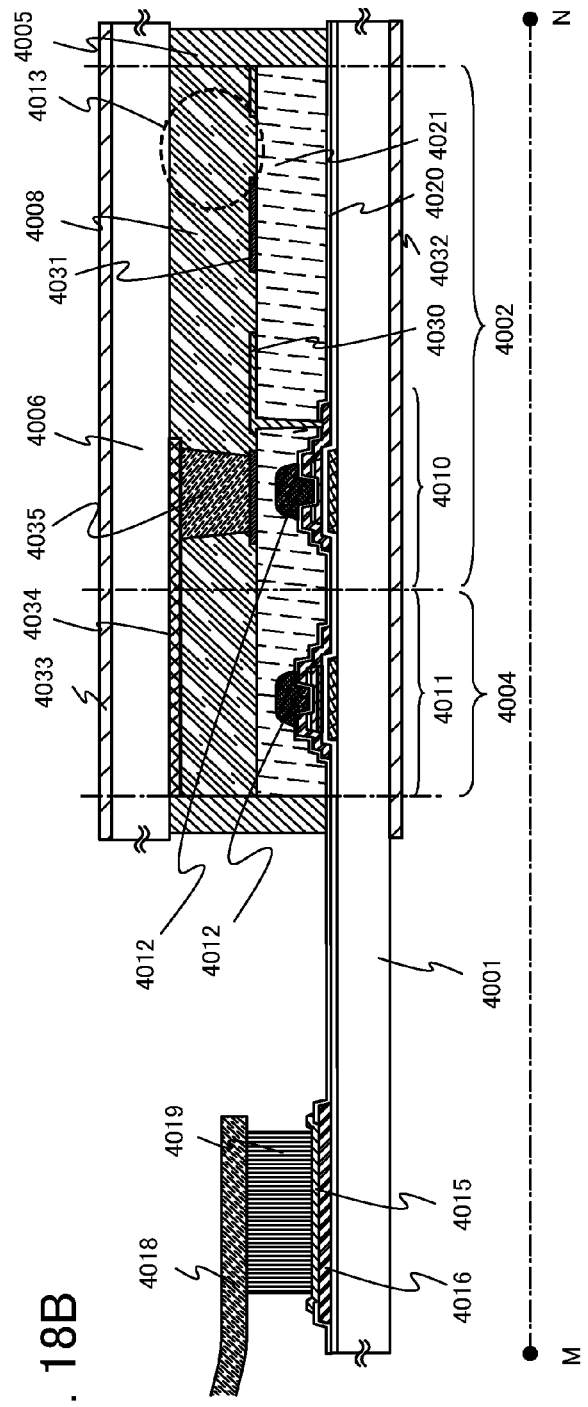
FIG. 18A1
FIG. 18A2
FIG. 18B

FIG. 23A
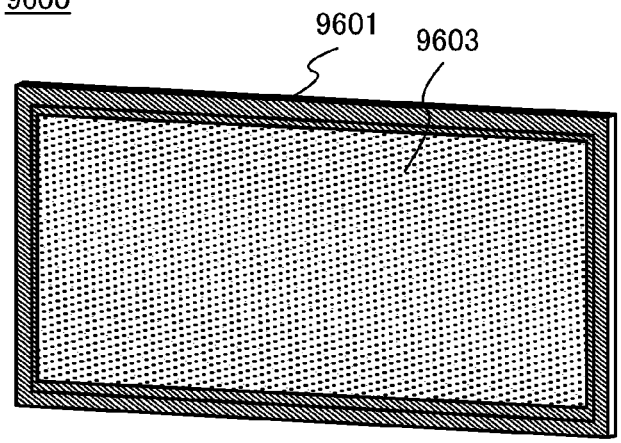
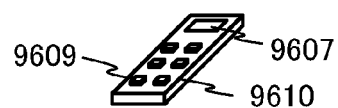
FIG. 23B
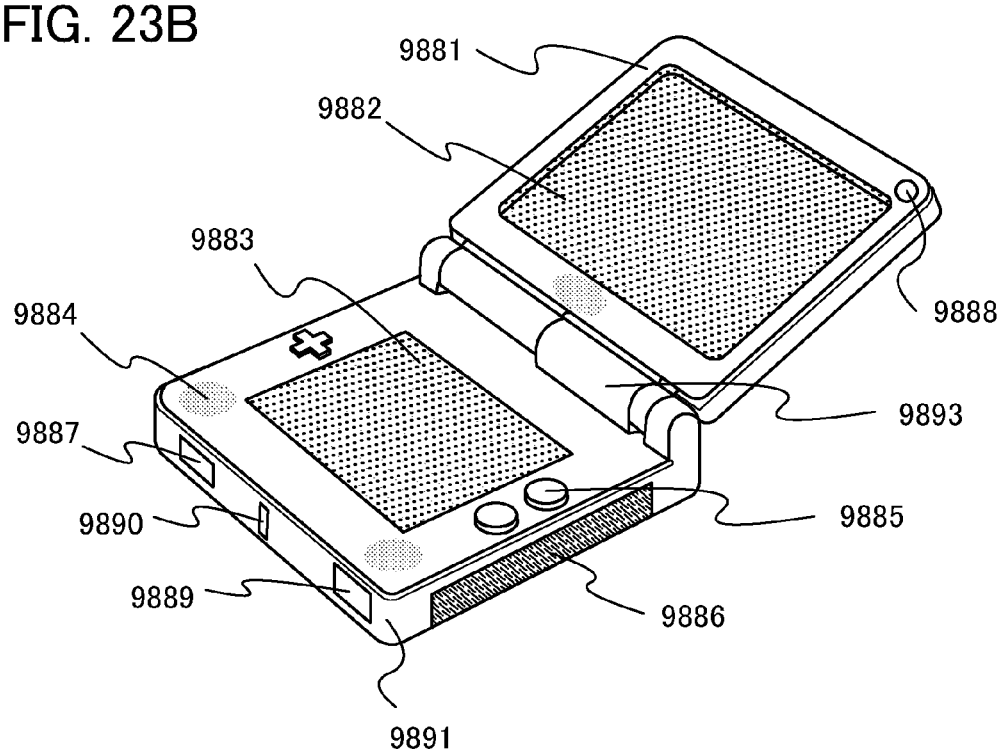

SEMICONDUCTOR DEVICE AND MANUFACTURING METHOD THEREOF

BACKGROUND OF THE INVENTION

1. Field of the Invention

The present invention relates to a semiconductor device having a circuit formed using a thin film transistor (hereinafter referred to as TFT) and a manufacturing method thereof. For example, the present invention relates to an electronic appliance in which an electro-optical device typified by a liquid crystal display panel or a light-emitting display device including an organic light-emitting element is mounted as its component.

Note that the semiconductor device in this specification refers to all the devices which can operate by using semiconductor characteristics, and an electro-optical device, a semiconductor circuit, and an electronic appliance are all semiconductor devices.

2. Description of the Related Art

Various metal oxides are used for a variety of applications. Indium oxide is a well-known material and is used as a transparent electrode material which is necessary for liquid crystal displays and the like.

Some metal oxides have semiconductor characteristics. Metal oxides having semiconductor characteristics are a kind of compound semiconductor. The compound semiconductor is a semiconductor formed using two or more kinds of atoms bonded together. In general, metal oxides become insulators. However, it is known that metal oxides become semiconductors depending on the combination of elements included in the metal oxides.

For example, it is known that tungsten oxide, tin oxide, indium oxide, zinc oxide, and the like are metal oxides which have semiconductor characteristics. A thin film transistor in which a transparent semiconductor layer which is formed using such a metal oxide serves as a channel formation region is disclosed (Patent Documents 1 to 4 and Non-Patent Document 1).

Further, not only single-component oxides but also multi-component oxides are known as metal oxides. For example, $InGaO_3(ZnO)_m$ (m is a natural number), which is a homologous compound, is a known material (Non-Patent Documents 2 to 4).

Furthermore, it is confirmed that such an In—Ga—Zn-based oxide is applicable to a channel layer of a thin film transistor (Patent Document 5 and Non-Patent Documents 5 and 6).

Further, attention has been drawn to a technique for manufacturing a thin film transistor using an oxide semiconductor, and applying the thin film transistor to an electronic device or an optical device. For example, Patent Document 6 and Patent Document 7 disclose a technique by which a thin film transistor is manufactured using zinc oxide or an In—Ga—Zn—O-based oxide semiconductor as an oxide semiconductor film and such a thin film transistor is used as a switching element or the like of an image display device.

PATENT DOCUMENT

[Patent Document 1] Japanese Published Patent Application No. S60-198861
[Patent Document 2] Japanese Published Patent Application No. H8-264794
[Patent Document 3] Japanese Translation of PCT International Application No. H11-505377
[Patent Document 4] Japanese Published Patent Application No. 2000-150900
[Patent Document 5] Japanese Published Patent Application No. 2004-103957
[Patent Document 6] Japanese Published Patent Application No. 2007-123861
[Patent Document 7] Japanese Published Patent Application No. 2007-096055

NON-PATENT DOCUMENT

[Non-Patent Document 1] M. W. Prins, K. O. Grosse-Holz, G Muller, J. F. M. Cillessen, J. B. Giesbers, R. P. Weening, and R. M. Wolf, "A ferroelectric transparent thin-film transistor", *Appl. Phys. Lett.*, 17 Jun. 1996, Vol. 68 pp. 3650-3652

[Non-Patent Document 2] M. Nakamura, N. Kimizuka, and T. Mohri, "The Phase Relations in the $In_2O_3$—$Ga_2ZnO_4$—ZnO System at 1350° C.", *J. Solid State Chem.*, 1991, Vol. 93, pp. 298-315

[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", *J. Solid State Chem.*, 1995, Vol. 116, pp. 170-178

[Non-Patent Document 4] M. Nakamura, N. Kimizuka, T. Mohri, and M. Isobe, "Homologous Series, Synthesis and Crystal Structure of $InFeO_3(ZnO)_m$ (m: natural number) and its Isostructural Compound", *KOTAI BUTSURI (SOLID STATE PHYSICS)*, 1993, Vol. 28, No. 5, pp. 317-327

[Non-Patent Document 5] K. Nomura, H. Ohta, K. Ueda, T. Kamiya, M. Hirano, and H. Hosono, "Thin-film transistor fabricated in single-crystalline transparent oxide semiconductor", *SCIENCE*, 2003, Vol. 300, pp. 1269-1272

[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", *NATURE*, 2004, Vol. 432 pp. 488-492

SUMMARY OF THE INVENTION

An object is to provide a semiconductor device which includes a thin film transistor having an oxide semiconductor layer and excellent electrical characteristics.

Further, another object is to provide a method for manufacturing a semiconductor device in which plural kinds of thin film transistors of different structures are formed over one substrate to form plural kinds of circuits and in which the number of steps is not greatly increased.

After a metal thin film is formed over an insulating surface, an oxide semiconductor layer which is thicker than the metal thin film is formed thereover. Then, oxidation treatment such as heat treatment is performed to oxidize the metal thin film partly or entirely. As the metal thin film, a material which serves as a semiconductor after the oxidation treatment can be used, for example, indium, zinc, tin, molybdenum, or tungsten is preferable. The oxidized metal thin film becomes a first oxide semiconductor layer, whereby a stack of the first oxide semiconductor layer and the overlaying second oxide semiconductor layer is obtained. Note that the first oxide semiconductor layer has lower electrical resistivity (that is, higher electrical conductivity) than the second oxide semiconductor layer. Further, the distance between the first oxide semiconductor layer and a gate electrode is shorter than the distance between the second oxide semiconductor layer and the gate electrode. The first oxide semiconductor layer is in contact with at least a gate insulating film. By manufacturing a thin film transistor using this stack of layers, a thin film transistor with excellent electrical characteristics (e.g., electrical field mobility) can be obtained.

A structure according to an embodiment of the present invention disclosed by this specification is a method for manufacturing a semiconductor device, which includes the steps of forming a gate electrode over an insulating surface, forming an insulating layer over the gate electrode, forming a metal thin film over the insulating layer, forming an oxide semiconductor layer over the metal thin film, and performing oxidation treatment for oxidizing the metal thin film at least partly after formation of the oxide semiconductor layer.

With the above structure, at least one of the above problems can be resolved.

The metal thin film is formed by a sputtering method, a vacuum vapor deposition method, a coating method, or the like. The thickness of the metal thin film is more than 0 nm and equal to or less than 10 nm, preferably, 3 nm to 5 nm inclusive. A stack of different metal thin films may alternatively be used, the total thickness of which is equal to or less than 10 nm Note that to oxidize the metal thin film at least partly means to oxidize the metal thin film to the extent that the thin film transistor can function and exhibit switching characteristics. In other words, the metal thin film is oxidized so as not to cause a state in which there is hardly any difference between the amount of current flowing between a source electrode and a drain electrode between when voltage is applied to a gate and when voltage is not applied to the gate or a state in which the source electrode and the drain electrode are electrically conducted.

Further, the oxidation treatment is heat treatment (at 200° C. to 600° C.) which is performed in any one of an atmosphere containing oxygen, air, and a nitrogen atmosphere. Even in a nitrogen atmosphere, by heat treatment, the metal thin film combines with oxygen in the oxide semiconductor layer (the second oxide semiconductor layer) which is on and in contact with the metal thin film and thus the metal thin film is oxidized. In this case, due to the presence of the metal thin film, oxygen in the second oxide semiconductor layer is extracted, whereby an oxygen deficient region can be formed in the second oxide semiconductor layer. In addition, without limitation to heat treatment in a nitrogen atmosphere, oxygen in the second oxide semiconductor layer is extracted due to the presence of the metal thin film also by heat treatment in an atmosphere containing oxygen or in air, whereby an oxygen deficient region can be formed in the second oxide semiconductor layer. By forming the oxygen deficient region in the second oxide semiconductor layer, electrical field mobility can be improved. Although the interface between the metal thin film and the upper oxide semiconductor layer becomes unclear by this heat treatment in some cases depending on a material of the metal thin film, the oxide semiconductor layer near the gate insulating layer, which is the lower oxide semiconductor layer, and the upper oxide semiconductor layer have different electrical characteristics.

Note that the second oxide semiconductor layer is an oxide semiconductor containing at least one of In, M, and Zn and M is one or a plurality of elements selected from Ga, Fe, Ni, Mn, Co, and the like. Note that M does not include an element such as Cd or Hg, that is, a substance harmful to the human body. In this specification, if Ga is employed as M, the thin film is referred to as an In—Ga—Zn—O-based non-single-crystal film. In this specification, a semiconductor layer formed using an oxide semiconductor film containing In, Ga, and Zn is also referred to as an "IGZO semiconductor layer". Moreover, in the oxide semiconductor, in some cases, a transition metal element such as Fe or Ni or an oxide of the transition metal is contained as an impurity element in addition to a metal element contained as M. Further, the second oxide semiconductor layer may contain an insulating impurity. As the impurity, insulating oxide typified by silicon oxide, germanium oxide, aluminum oxide, or the like; insulating nitride typified by silicon nitride, aluminum nitride, or the like; or insulating oxynitride such as silicon oxynitride or aluminum oxynitride is applied. The insulating oxide, the insulating nitride, or the insulating oxynitride is added to the oxide semiconductor at a concentration at which electrical conductivity of the oxide semiconductor does not deteriorate. By containing such an insulating impurity, the oxide semiconductor becomes difficult to crystallize; thus, characteristics of the thin film transistor can be stabilized.

Because the In—Ga—Zn—O-based oxide semiconductor contains the impurity such as silicon oxide, crystallization of the oxide semiconductor or generation of microcrystal grains can be prevented even when the oxide semiconductor is subjected to heat treatment at 300° C. to 600° C. In a manufacturing process of the thin film transistor in which an In—Ga—Zn—O-based oxide semiconductor layer is a channel formation region, an S value (a subthreshold swing value) or an electrical field effect mobility can be improved by heat treatment. Even in such a case, the thin film transistor can be prevented from being normally-on. Further, even if heat stress or bias stress is added to the thin film transistor, a change in threshold voltage can be prevented.

As the oxide semiconductor which is applied to the channel formation region of the thin film transistor, any of the following oxide semiconductors can be applied in addition to the above: an In—Sn—Zn—O-based oxide semiconductor, an In—Al—Zn—O-based oxide semiconductor, an Sn—Ga—Zn—O-based oxide semiconductor, an Al—Ga—Zn—O-based oxide semiconductor, an Sn—Al—Zn—O-based oxide semiconductor, an In—Zn—O-based oxide semiconductor, an Sn—Zn—O-based oxide semiconductor, an Al—Zn—O-based oxide semiconductor, an In—O-based oxide semiconductor, an Sn—O-based oxide semiconductor, and a Zn—O-based oxide semiconductor. In other words, by addition of an impurity which suppresses crystallization to keep an amorphous state to these oxide semiconductors, characteristics of the thin film transistor can be stabilized. As the impurity, insulating oxide typified by silicon oxide, germanium oxide, aluminum oxide, or the like; insulating nitride typified by silicon nitride, aluminum nitride, or the like; or insulating oxynitride such as silicon oxynitride or aluminum oxynitride is applied.

For example, in the case where a film of an In—Sn—Zn—O-based oxide semiconductor to which silicon oxide is added is formed by a sputtering method, a target in which $In_2O_3$, $SnO_2$, ZnO, and $SiO_2$ are sintered at predetermined percentages is used. In the case of the In—Al—Zn—O-based oxide semiconductor to which silicon oxide is added, a film is formed using a target in which $In_2O_3$, $Al_2O_3$, ZnO, and $SiO_2$ are sintered at predetermined percentages.

Further, as an oxide semiconductor for an $n^+$-type layer of the thin film transistor, an In—Ga—Zn—O-based non-single-crystal film containing nitrogen, that is, an In—Ga—Zn—O—N-based non-single-crystal film (also referred to as an IGZON film) may be used. This In—Ga—Zn—O—N-based non-single-crystal film is obtained by forming a film of oxynitride containing indium, gallium, and zinc using a target including oxide containing indium, gallium, and zinc in an atmosphere containing a nitrogen gas and then by performing heat treatment on the film.

Further, the thickness of the second oxide semiconductor layer is preferably larger than at least that of the metal thin film, for example, two or more times that of the metal thin film. Specifically, the thickness of the second oxide semiconductor layer is 30 nm or more and preferably 60 nm to 150 nm inclusive. In addition, the second oxide semiconductor layer preferably contains at least one of the elements contained in the metal thin film. If the second oxide semiconductor layer contains at least one of the elements contained in the metal thin film, the second oxide semiconductor layer and the metal thin film can be etched in the same etching step using the same etchant or the same etching gas, which results in a decrease in the number of manufacturing steps.

Further, by manufacturing a matrix circuit and a driver circuit over one substrate, manufacturing cost of the semiconductor device is reduced. The driver circuit includes, for example, a logic circuit in which emphasis is placed on the speed of operation. A thin film transistor including a stack of the first oxide semiconductor layer and the second oxide semiconductor layer is used in such a circuit while a thin film transistor including a single layer of a third oxide semiconductor layer is used in a matrix circuit forming a pixel portion. In such a manner, structures of the thin film transistors are different between the circuit in which emphasis is placed on the speed of operation, such as a logic circuit, and the matrix circuit.

Another structure according to an embodiment of the present invention is a semiconductor device which includes a matrix circuit and a driver circuit which drives the matrix circuit over an insulating surface. In the semiconductor device, the driver circuit has a first thin film transistor including a stack of a first oxide semiconductor layer and a second oxide semiconductor layer which overlaps with a first gate electrode with a first gate insulating film interposed therebetween, and the matrix circuit includes a second thin film transistor which includes a third oxide semiconductor layer overlapping with a second gate electrode with a second gate insulating film interposed therebetween. A material of the first oxide semiconductor layer and a material of the second oxide semiconductor layer are different from each other, and the material of the second oxide semiconductor layer and a material of the third oxide semiconductor layer are the same.

With the above structure, at least one of the above problems can be resolved.

In the above structure, the first thin film transistor includes the first gate insulating film over the first gate electrode, the first oxide semiconductor layer over the first gate insulating film, and the second oxide semiconductor layer over the first oxide semiconductor layer. The electrical resistivity of the first oxide semiconductor layer is lower than the electrical resistivity of the second oxide semiconductor layer. In addition, in the above structure, the second thin film transistor includes the second gate insulating film over the second gate electrode and the third oxide semiconductor layer over the second gate insulating film.

Methods for manufacturing the above structures are also included in an embodiment of the present invention. One of the methods is a method for manufacturing a semiconductor device including a matrix circuit and a driver circuit for driving the matrix circuit over one substrate. The method includes the steps of forming a first oxide semiconductor layer over both a matrix circuit region and a driver circuit region of the substrate, removing the first oxide semiconductor layer over the matrix circuit region by etching, and forming a second oxide semiconductor layer over the first oxide semiconductor layer in the driver circuit region and a third oxide semiconductor layer in the matrix circuit region to form a first thin film transistor including a stack of the first oxide semiconductor layer and the second oxide semiconductor layer in the driver circuit region and a second thin film transistor including the third oxide semiconductor layer in the matrix circuit region.

Further, it is also possible to form the first oxide semiconductor layer by oxidizing a metal thin film which is formed as selected. The manufacturing method in such a case is also included in an embodiment of the present invention. The method is for manufacturing a semiconductor device including a matrix circuit and a driver circuit for driving the matrix circuit over one substrate. The method includes the steps of forming a metal thin film over both a matrix circuit region and a driver circuit region of the substrate, removing the metal thin film over the matrix circuit region by etching, forming an oxide semiconductor layer over the metal thin film in the driver circuit region and in the matrix circuit region, and performing oxidation treatment for oxidizing the metal thin film after formation of the oxide semiconductor layer to form a first thin film transistor including a stack of a first oxide semiconductor layer and a second oxide semiconductor layer in the driver circuit region and a second thin film transistor including a third oxide semiconductor layer in the matrix circuit region.

In each of the structures manufactured by the above methods, the electrical resistivity of the first oxide semiconductor layer is lower than the electrical resistivity of the second oxide semiconductor layer. Further, in each of the structures manufactured by the above methods, a material of the first oxide semiconductor layer and a material of the second oxide semiconductor layer are different from each other, and the material of the second oxide semiconductor layer and a material of the third oxide semiconductor layer are the same.

A term indicating a direction such as "on", "over", "under", "below", "side", "horizontal", or "perpendicular" in this specification is based on the assumption that a device is provided over a substrate surface.

With a stack of oxide semiconductor layers, a semiconductor device including a thin film transistor with excellent electrical characteristics can be realized.

Further, a thin film transistor including a stack of oxide semiconductor layers and a thin film transistor including a single layer of an oxide semiconductor layer are formed over one substrate, whereby plural kinds of circuits can be manufactured.

BRIEF DESCRIPTION OF THE DRAWINGS

FIG. 3 is an equivalent circuit diagram of an example of a semiconductor device.

FIGS. 12A and 12B are respectively a top view and a cross-sectional view of an example of a semiconductor device.

FIGS. 18A1 and 18A2 are top views and FIG. 18B is a cross-sectional view of examples of semiconductor devices.

FIGS. 23A and 23B are examples of electronic appliances.

DETAILED DESCRIPTION OF THE INVENTION

Figure 1A:
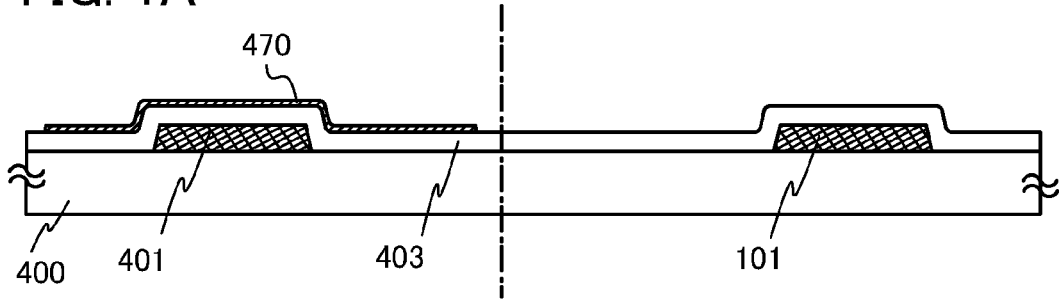
FIGS. 1A to 1D are cross-sectional views of an example of a manufacturing process of a semiconductor device.

Hereinafter, an embodiment of the present invention will be described.

An embodiment will be described in detail with reference to the drawings. Note that the present invention is not limited to the following description and it will be readily appreciated by those skilled in the art that modes and details can be modified in various ways without departing from the spirit and the scope of the present invention. Accordingly, the present invention should not be construed as being limited to the description of the embodiments to be given below. Note that in structures described below, like portions or portions having like functions in different drawings are designated by the like reference numerals and repeated description thereof is omitted.

Embodiment 1

FIGS. 1A to 1D illustrate an example of a manufacturing process in which a first thin film transistor 430 for a driver circuit and a second thin film transistor 170 for a pixel portion (also called a matrix circuit) are formed over the same substrate.

In this embodiment, a novel structure and its manufacturing method is provided in which thin film transistors with different structures are formed over the same substrate to form a driver circuit capable of high-speed operation and a pixel portion including a thin film transistor with a high on/off ratio. Further, in this embodiment, a novel method for manufacturing a thin film transistor in which a stack of oxide semiconductor layers is used as a channel formation region is also provided.

A driver circuit for driving a pixel portion, which should be capable of high-speed operation, is formed using an inverter circuit, a capacitor, a resistor, and the like. When two n-channel TFTs are combined to form an inverter circuit, there are following combinations: a combination of an enhancement type transistor and a depletion type transistor (hereinafter, a circuit formed by such a combination is referred to as an EDMOS circuit) and a combination of enhancement type TFTs (hereinafter, a circuit formed by such a combination is referred to as an EEMOS circuit). Note that an n-channel TFT whose threshold voltage is positive is defined as an enhancement type transistor, while an n-channel TFT whose threshold voltage is negative is defined as a depletion type transistor. This specification follows these definitions.

A thin film transistor in the pixel portion serves as a switch of voltage application to a pixel electrode and therefore should have a high on/off ratio. The on/off ratio is a ratio of on current to off current ($I_{ON}/I_{OFF}$), and the higher the value of the $I_{ON}/I_{OFF}$ is, the better the switching characteristics is. Thus, the high on/off ratio contributes to improvement of display contrast. Note that on current is current which flows between a source electrode and a drain electrode when a transistor is in an on state. Meanwhile, off current is current which flows between the source electrode and the drain electrode when the transistor is in an off state. For example, in an n-channel transistor, off current is current which flows between a source electrode and a drain electrode when a gate voltage is lower than a threshold voltage of the transistor. Therefore, an enhancement type transistor is preferably used for the pixel portion to achieve high contrast and low-power-consumption driving.

As described above, the electrical characteristics on which emphasis is placed are different between the pixel portion and the driver circuit. Accordingly, thin film transistors with different structures are preferably used in the pixel portion and in the driver circuit. In this embodiment, an example of a manufacturing method for such a case will be described below.

First, a first gate electrode 401 and a second gate electrode 101 are provided over a substrate 400 having an insulating surface. The first gate electrode 401 and the second gate electrode 101 can be formed to have a single-layer structure or a stacked-layer structure using a metal material such as molybdenum, titanium, chromium, tantalum, tungsten, aluminum, copper, neodymium, or scandium, or an alloy material containing any of these materials as the main component.

For example, as a two-layer structure of each of the first gate electrode 401 and the second gate electrode 101, the following structures are preferable: a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, and a two-layer structure of a titanium nitride layer and a molybdenum layer. Alternatively, a stack including a copper layer containing Ca and a copper oxide layer containing Ca thereover, which serves as a barrier layer, or a stack including a copper layer containing Mg and a copper oxide layer containing Mg thereover, which serves as a barrier layer, can be employed. As a three-layer structure, a stack of a tungsten layer or a tungsten nitride layer, a layer of an alloy of aluminum and silicon or an alloy of aluminum and titanium, and a titanium nitride layer or a titanium layer is preferable.

Then, a gate insulating layer 403 covering the first gate electrode 401 and the second gate electrode 101 is formed. The gate insulating layer 403 is formed to a thickness of 50 nm to 400 nm by a sputtering method, a PCVD method, or the like.

For example, a 100-nm-thick silicon oxide film is formed by a sputtering method as the gate insulating layer 403. Needless to say, the gate insulating layer 403 is not limited to such a silicon oxide film and may be a single layer or a stack of other insulating films such as a silicon oxynitride film, a silicon nitride film, an aluminum oxide film, an aluminum nitride film, an aluminum oxynitride film, or a tantalum oxide film. In a case of forming a stack of layers, for example, a silicon nitride film may be formed by a PCVD method and then a silicon oxide film may be formed thereover by a sputtering method. If a silicon oxynitride film, a silicon nitride film, or the like is used as the gate insulating layer 403, an impurity like sodium can be prevented from diffusing from the glass substrate and entering an oxide semiconductor to be formed later over the substrate.

Alternatively, the gate insulating layer 403 can be formed of a silicon oxide layer by a CVD method using an organosilane gas. As the organosilane gas, a silicon-containing compound such as tetraethoxysilane (TEOS: chemical formula, $Si(OC_2H_5)_4$), tetramethylsilane (TMS: chemical formula, $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$) can be used.

Then, a metal thin film of indium, zinc, tin, molybdenum, tungsten, or the like is formed over the gate insulating layer 403. Alternatively, an alloy thin film or a stacked-layer of any of those elements can be formed. The metal thin film is formed by a sputtering method, a vacuum vapor deposition method, or a coating method. Here, an indium film is formed by a vapor deposition method to have a thickness of more than 0 nm and equal to or less than 10 nm, preferably, 3 nm to 5 nm inclusive. Note that for the metal thin film, a material is selected such that the metal thin film becomes an oxide by heat treatment which is performed later and the oxide has a lower electrical resistivity than an oxide semiconductor layer subsequently formed on and in contact with the metal thin film. Further, depending on a material or film-forming condition for the metal thin film, the metal thin film does not cover a surface of the gate insulating layer 403 and part of the gate insulating layer 403 may be exposed in some cases; for example, clusters of the metal may be dispersed over the gate insulating layer 403. Also in the case where clusters of the metal are dispersed, the electrical field mobility of the thin film transistor can be improved as long as the metal becomes an oxide semiconductor by oxidation treatment which is performed later. Further, in the case where clusters of the metal are dispersed, the metal is not limited to the above materials; aluminum, copper, and the like can be used. Further, a metal thin film of indium may be formed over the clusters in order to improve electrical characteristics of the thin film transistor.

Then, the metal thin film is removed as selected by a photolithography technique. Wet etching or dry etching can be used here. Thus, a metal thin film 470 is formed in the driver circuit region. FIG. 1A is a cross-sectional view of this stage. Note that when a photolithography technique is employed, the metal thin film is exposed to air, whereby a native oxide film may be formed on a surface of the metal thin film depending on its material. If a native oxide film is formed, it can be used as part of the oxide semiconductor layer.

Alternatively, the metal thin film may be formed only in a desired region by employing a sputtering method using a shadow mask by which a region other than the desired region is covered. Further, by a sputtering method using the shadow mask, the oxide semiconductor layer can be formed over the metal thin film without exposure to air. In such a manner, an interface between the metal thin film and the oxide semiconductor layer can be kept clean and the number of photomasks can be reduced.

Then, the oxide semiconductor layer is formed over the metal thin film 470 and the gate insulating layer 403. The thickness of the oxide semiconductor layer is preferably larger than that of the metal thin film 470. Specifically, the thickness of the oxide semiconductor layer is equal to or larger than 30 nm, preferably, 60 nm to 150 nm inclusive. In this embodiment, a first In—Ga—Zn—O-based non-single-crystal film is formed as the oxide semiconductor layer. The first In—Ga—Zn—O-based non-single-crystal film is formed in an argon or oxygen atmosphere using an oxide semiconductor target having a diameter of 8 inches and containing In (indium), Ga (gallium), and Zn (zinc) (the ratio of $In_2O_3$ to $Ga_2O_3$ to ZnO is 1:1:1 in molar ratio), with the distance between the substrate and the target set to 170 mm, under a pressure of 0.4 Pa, and with a direct-current (DC) power source of 0.5 kW. Note that a pulsed direct current (DC) power source is preferably used so that dust can be reduced and uniform thickness can be achieved.

In the case where an In—Ga—Zn—O-based oxide semiconductor layer is formed by a sputtering method, an oxide semiconductor target containing In, Ga, and Zn may contain an insulating impurity. The impurity is insulating oxide typified by silicon oxide, germanium oxide, aluminum oxide, or the like; insulating nitride typified by silicon nitride, aluminum nitride, or the like; insulating oxynitride such as silicon oxynitride or aluminum oxynitride; or the like. For example, $SiO_2$ is preferably mixed into the oxide semiconductor target at 0.1 wt % to 10 wt % inclusive, more preferably 1 wt % to 6 wt % inclusive.

When the insulating impurity is contained in the oxide semiconductor, a film of the oxide semiconductor is made amorphous easily. In addition, in the case where the oxide semiconductor film is subjected to heat treatment, crystallization of the oxide semiconductor film can be suppressed.

In addition to the In—Ga—Zn—O-based oxide semiconductor, a similar effect can be obtained by an In—Sn—Zn—O-based oxide semiconductor, an In—Al—Zn—O-based oxide semiconductor, an Sn—Ga—Zn—O-based oxide semiconductor, an Al—Ga—Zn—O-based oxide semiconductor, an Sn—Al—Zn—O-based oxide semiconductor, an In—Zn—O-based oxide semiconductor, an Sn—Zn—O-based oxide semiconductor, an Al—Zn—O-based oxide semiconductor, an In—O-based oxide semiconductor, an Sn—O-based oxide semiconductor, and a Zn—O-based oxide semiconductor which contain an insulating impurity.

For example, in the case where a film of an In—Sn—Zn—O-based oxide semiconductor to which silicon oxide is added is formed by a sputtering method, a target in which $In_2O_3$, $SnO_2$, ZnO, and $SiO_2$ are sintered at predetermined percentages is used. In the case of the In—Al—Zn—O-based oxide semiconductor to which silicon oxide is added, a film is formed using a target in which $In_2O_3$, $Al_2O_3$, ZnO, and $SiO_2$ are sintered at predetermined percentages.

Next, an oxide semiconductor film (in this embodiment, a second In—Ga—Zn—O-based non-single-crystal film) which has lower resistivity than the first In—Ga—Zn—O-based non-single-crystal film is formed by a sputtering method without exposure to air. Here, sputtering is performed using a target in which the ratio of $In_2O_3$ to $Ga_2O_3$ to ZnO is 1:1:1 under deposition conditions where the pressure is 0.4 Pa, the power is 500 W, the deposition temperature is room temperature, and an argon gas is introduced at a flow rate of 40 sccm. Despite the intentional use of the target in which the ratio of $In_2O_3$ to $Ga_2O_3$ to ZnO is 1:1:1, an In—Ga—Zn—O- based non-single-crystal film including crystal grains with a size of 1 nm to 10 nm immediately after the film formation may be formed. Note that it can be said that the presence or absence of crystal grains or the density of crystal grains can be adjusted and the diameter size can be adjusted within the range of 1 nm to 10 nm by appropriate adjustment of the composition ratio in the target, the deposition pressure (0.1 Pa to 2.0 Pa), the power (250 W to 3000 W: 8 inches ø), the temperature (room temperature to 100° C.), the reactive sputtering conditions for deposition, or the like. The second In—Ga—Zn—O-based non-single-crystal film has a thickness of 5 nm to 20 nm. Needless to say, when the film includes crystal grains, the size of the crystal grains does not exceed the thickness of the film. In this embodiment, the thickness of the second In—Ga—Zn—O-based non-single-crystal film is 5 nm.

The first In—Ga—Zn—O-based non-single-crystal film is formed under conditions different from the conditions for the second In—Ga—Zn—O-based non-single-crystal film. For example, the first In—Ga—Zn—O-based non-single-crystal film is formed under conditions where the ratio of an oxygen gas flow rate to an argon gas flow rate is higher than the ratio of an oxygen gas flow rate to an argon gas flow rate under the conditions for the second In—Ga—Zn—O-based non-single-crystal film. Specifically, the second In—Ga—Zn—O-based non-single-crystal film is formed in a rare gas (e.g., argon or helium) atmosphere (or an atmosphere, equal to or less than 10% of which is an oxygen gas and equal to or greater than 90% of which is an argon gas), and the first In—Ga—Zn—O-based non-single-crystal film is formed in an oxygen atmosphere (or in an atmosphere in which an oxygen gas flow rate is equal to or more than an argon gas flow rate).

Note that an example in which the second In—Ga—Zn—O-based non-single-crystal film is provided is described without limitation in this embodiment. The second In—Ga—Zn—O-based non-single-crystal film is not necessarily provided.

Examples of a sputtering method include an RF sputtering method in which a high-frequency power source is used as a sputtering power source, a DC sputtering method, and a pulsed DC sputtering method in which a bias is applied in a pulsed manner.

In addition, there is also a multi-source sputtering apparatus in which a plurality of targets of different materials can be set. With the multi-source sputtering apparatus, films of different materials can be formed to be stacked in one chamber, or a film of plural kinds of materials can be formed by electric discharge at the same time in one chamber.

In addition, there are a sputtering apparatus provided with a magnet system inside the chamber and used for a magnetron sputtering method, and a sputtering apparatus used for an ECR sputtering method in which plasma generated with the use of microwaves is used without using glow discharge.

In addition, as a deposition method by a sputtering method, there are also a reactive sputtering method in which a target substance and a sputtering gas component are chemically reacted with each other during deposition to form a thin film of a compound thereof, and a bias sputtering method in which voltage is also applied to a substrate during deposition.

Figure 1B:
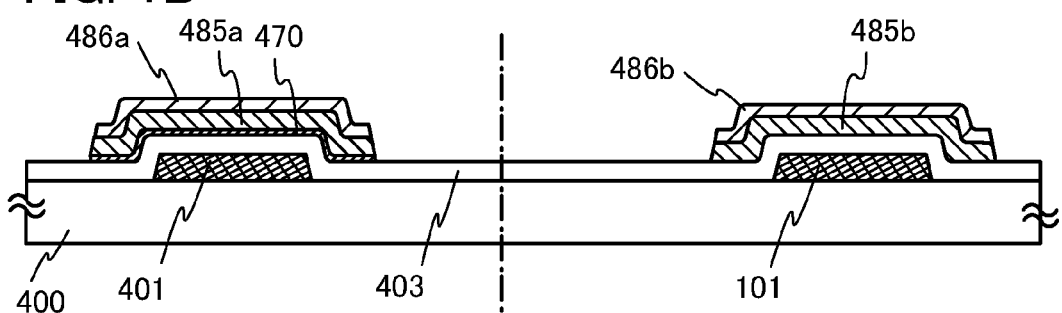

Next, a photolithography step is performed to form a resist mask, and the first In—Ga—Zn—O-based non-single-crystal film and the second In—Ga—Zn—O-based non-single-crystal film are etched. Here, unnecessary portions are removed by wet etching using ITO07N (product of KANTO CHEMICAL CO., INC.), thereby forming oxide semiconductor films 485a and 485b, which are the first In—Ga—Zn—O-based non-single-crystal films, and oxide semiconductor films 486a and 486b, which are the second In—Ga—Zn—O-based non-single-crystal films. If an indium film, a zinc film, or a tin film is used as the metal thin film 470, the metal thin film 470 is also etched with ITO07N (product of KANTO CHEMICAL CO., INC.). In this embodiment, an example in which an indium film is used is employed; thus, the metal thin film 470 has substantially the same top shape as the oxide semiconductor film 485a, which is the first In—Ga—Zn—O-based non-single-crystal film. Note that etching here is not limited to wet etching and may be dry etching. FIG. 1B is a cross-sectional view of this stage.

In the case where the metal thin film 470 remains in the above etching step, the metal thin film 470 is subjected to an etching step for removing the metal thin film 470 as selected by using the same resist mask which is used in the above etching step and a different etchant or a different etching gas.

Next, a photolithography step is performed to form a resist mask, and unnecessary portions are removed by etching, thereby forming a contact hole reaching a wiring or an electrode layer which is formed from the same material as the gate electrode layer. This contact hole is provided for direct contact with a conductive film formed later. For example, a contact hole is formed when a thin film transistor whose gate electrode layer is in direct contact with the source or drain electrode layer is formed in a driver circuit portion, or when a terminal that is electrically connected to a gate wiring of a terminal portion is formed. Note that an example in which a contact hole is formed by a photolithography step for direct connection with the conductive film to be formed later is described here without particular limitation. The contact hole reaching the gate electrode layer may be formed later in a step of forming a contact hole for connection with a pixel electrode and the same material as the pixel electrode may be used for electrical connection. In the case where the same material as the pixel electrode is used for electrical connection, the number of masks can be reduced by one.

Then, a conductive film is formed from a metal material by a sputtering method or a vacuum vapor deposition method over the oxide semiconductor films 486a and 486b, which are the second In—Ga—Zn—O-based non-single-crystal films, and over the gate insulating layer 403.

As the material of the conductive film, there are an element selected from Al, Cr, Ta, Ti, Mo, or W, an alloy including any of the elements, an alloy film including a combination of such elements, and the like. Further, if heat treatment is performed at 200° C. to 600° C., the conductive film preferably has heat resistance for such heat treatment. Since use of Al alone brings disadvantages such as low heat resistance and a tendency to be corroded, aluminum is used in combination with a conductive material having heat resistance. As a conductive material having heat resistance which is to be used in combination with Al, an element selected from titanium (Ti), tantalum (Ta), tungsten (W), molybdenum (Mo), chromium (Cr), neodymium (Nd), or scandium (Sc), or an alloy including any of the elements, an alloy including a combination of such elements, or nitride including any of the elements can be used.

Here, the conductive film has a single-layer structure of a titanium film. Alternatively, the conductive film may have a two-layer structure in which a titanium film is stacked on an aluminum film. Still alternatively, the conductive film may have a three-layer structure including a Ti film, an aluminum film containing Nd (Al—Nd) which is stacked on the Ti film, and a Ti film formed on these films. The conductive film may have a single-layer structure of an aluminum film containing silicon.

Figure 1C:
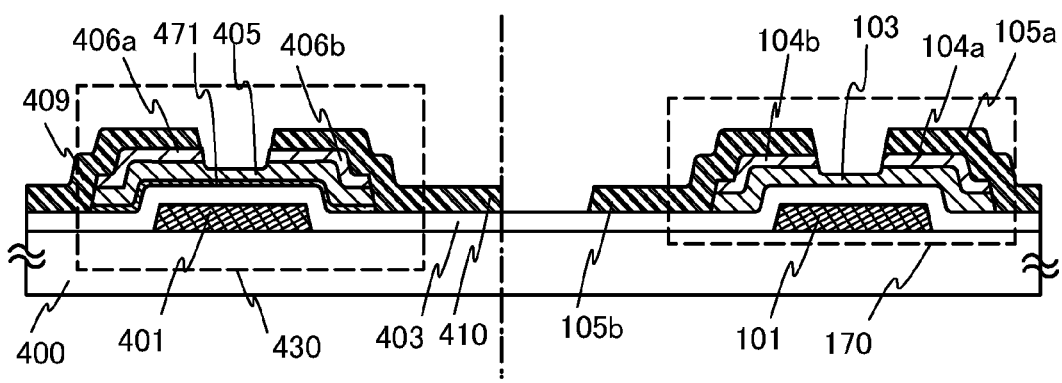

Then, a resist mask is formed by a photolithography step, and unnecessary portions are removed by etching. Thus, source and drain electrode layers 105a and 105b and n$^+$-type layers 104a and 104b serving as source and drain regions are formed in the pixel portion while first and second wirings 409 and 410 serving as source and drain electrode layers and n$^+$-type layers 406a and 406b serving as source and drain regions are formed in the driver circuit portion. Either wet etching or dry etching is used as an etching method at this time. For example, when an aluminum film or an aluminum-alloy film is used as the conductive film, wet etching using a mixed solution of phosphoric acid, acetic acid, and nitric acid can be carried out. Here, by wet etching using an ammonia hydrogen peroxide mixture (with the ratio of hydrogen peroxide to ammonia to water being 5:2:2), the conductive film of a Ti film is etched to form the source and drain electrode layers, and the second In—Ga—Zn—O-based non-single-crystal film is etched to form the n$^+$-type layers 104a and 104b. In this etching step, an exposed region of the oxide semiconductor film is partly etched to be an oxide semiconductor layer 103. Thus, a channel region of the oxide semiconductor layer 103 between the n$^+$-type layers 104a and 104b has a small thickness. The source and drain electrode layers 105a and 105b and the n$^+$-type layers 104a and 104b are etched in the same step by etching using an ammonia hydrogen peroxide mixture; therefore, the end portions of the source and drain electrode layers 105a and 105b are aligned with the end portions of the n$^+$-type layers 104a and 104b, so that the end portions are continuous as illustrated in FIG. 1C. Through the above steps, the second thin film transistor 170 including the oxide semiconductor layer 103 as its channel formation region can be formed in the pixel portion.

Next, heat treatment is preferably performed at 200° C. to 600° C., typically, 300° C. to 500° C. (the heat treatment may be annealing with light). Here, heat treatment is performed in a nitrogen atmosphere in a furnace at 350° C. for 1 hour. This heat treatment is also called oxidation treatment which oxidizes the metal thin film 470 partly or entirely. In this embodiment, the metal thin film 470 becomes an indium oxide film, a first oxide semiconductor layer 471. Through the above steps, the first thin film transistor 430 including a stack of the first oxide semiconductor layer 471 and a second oxide semiconductor layer 405 can be manufactured in the driver circuit. FIG. 1C is a cross-sectional view of this stage. Further, through this heat treatment, rearrangement at the atomic level occurs in the In—Ga—Zn—O-based non-single-crystal film. Note that there is no particular limitation on the timing of the heat treatment and the heat treatment may be performed anytime after formation of the second In—Ga—Zn—O-based non-single-crystal film, and for example, the heat treatment may be performed after formation of a pixel electrode.

Note that although the thickness of the metal thin film 470 before the heat treatment and the thickness of the first oxide semiconductor layer, which is the oxidized metal thin film 470, after the heat treatment are substantially the same in FIG. 1C, the thickness of the first oxide semiconductor layer 471 may be larger than that of the metal thin film before the heat treatment due to oxidation. Further, the thickness of the overlaying second oxide semiconductor layer 405 may be smaller than that before the heat treatment due to an increase in thickness of the first oxide semiconductor layer 471.

Next, the resist mask is removed, and a protective insulating layer 412 is formed to cover the first thin film transistor 430 and the second thin film transistor 170. For the protective insulating layer 412, a single layer or a stacked layer of a silicon nitride film, a silicon oxide film, a silicon oxynitride film, an aluminum oxide film, an aluminum nitride film, an aluminum oxynitride film, a tantalum oxide film, and/or the like which is formed by a sputtering method or the like can be used. The protective insulating layer 412 has a thickness of 50 nm to 400 nm.

Then, a photolithography step is performed to form a resist mask, and the protective insulating layer 412 is etched to form a contact hole which reaches the source or drain electrode layer 105b.

Figure 1D:
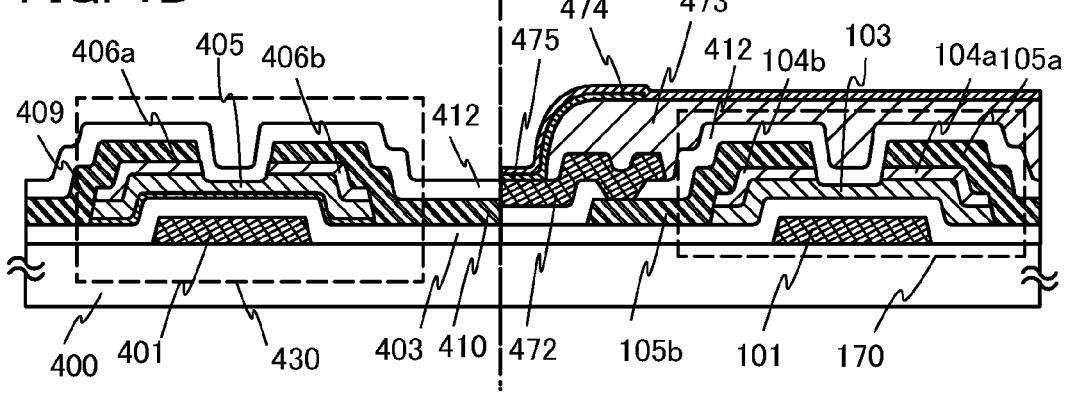

Next, the resist mask is removed. A conductive film is formed, then, a photolithography step is performed to form a resist mask and the conductive film is etched to form a first electrode 472 which is electrically connected to the source or drain electrode layer 105b. Then, an insulating layer 473 which serves as a partition wall for isolating first electrodes of neighboring pixels is formed. Then, an organic compound layer 475 including a light-emitting layer is formed over the first electrode 472 and then a second electrode 474 is formed thereover. A light-emitting element at least includes a first electrode 472, the organic compound layer 475 including a light-emitting layer, and the second electrode 474. FIG. 1D is a cross-sectional view of this stage.

Note that this embodiment gives an example of a light-emitting display device including a light-emitting element without particular limitation. A liquid crystal display device or an electronic paper can be manufactured.

By using the thin film transistor including a stack of oxide semiconductor layers for a peripheral circuit such as a gate line driver circuit or a source line driver circuit in a liquid crystal display device, a light-emitting display device, an electronic paper, or the like, an increase in driving speed and a reduction in power consumption can be achieved. Further, both the pixel portion and the driver circuit can be provided over the same substrate without greatly increasing the number of steps. By providing various circuits in addition to the pixel portion over the same substrate, manufacturing cost of the display device can be reduced.

Embodiment 2

In this embodiment, an example in which an inverter circuit is formed using two n-channel thin film transistors is described below. This inverter circuit is used as part of a driver circuit. Note that the first thin film transistor 430 in Embodiment 1 and the first thin film transistor 430 in FIG. 2A are the same; accordingly, a detailed description is omitted.

In this embodiment, a novel structure which includes a driver circuit capable of high-speed operation over a substrate having an insulating surface is provided. In addition, a novel manufacturing method of the structure is also provided. Further, a novel method for manufacturing a first thin film transistor in which a stack of oxide semiconductor layers is used as a channel formation region and a second thin film transistor in which a single layer of an oxide semiconductor layer is used as a channel formation region over one substrate is also provided.

Figure 2A:
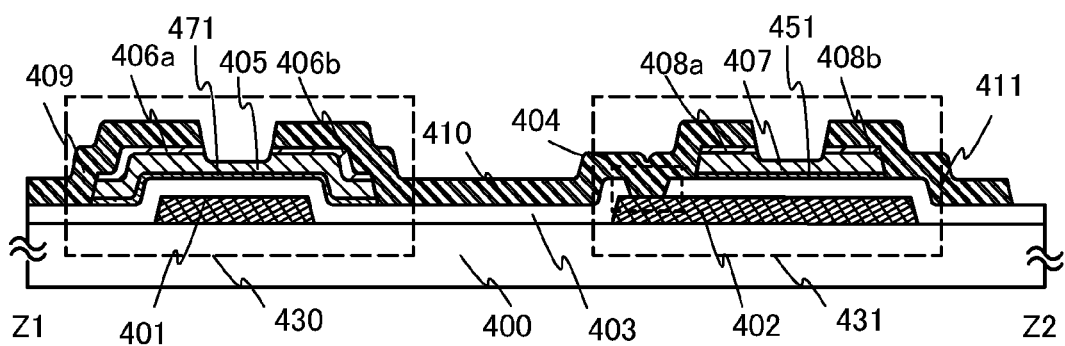
FIGS. 2A to 2C are a cross-sectional view, an equivalent circuit diagram, and a top view illustrating an example of a semiconductor device.

FIG. 2A illustrates a cross-sectional structure of the inverter circuit of the driver circuit. In FIG. 2A, the first gate electrode 401 and a second gate electrode 402 are provided over the substrate 400.

Additionally, the gate insulating layer 403 covering the first gate electrode 401 and the second gate electrode 402 is formed. A stack of the first oxide semiconductor layer 471 and the second oxide semiconductor layer 405 is provided over the gate insulating layer 403 and in a position overlapping with the first gate electrode 401. A stack of a third oxide semiconductor layer 451 and a fourth oxide semiconductor layer 407 is provided over the gate insulating layer 403 and in a position overlapping with the second gate electrode 402.

Further, over the second oxide semiconductor layer 405 and the fourth oxide semiconductor layer 407, the first wiring 409, the second wiring 410, and a third wiring 411 are provided. The second wiring 410 is directly connected to the second gate electrode 402 through a contact hole 404 formed in the gate insulating layer 403. Note that there is no particular limitation on the timing of formation of the contact hole 404 as long as it is performed after formation of the gate insulating layer 403. For example, the contact hole 404 may be formed after etching of an oxide semiconductor film which is performed later or even after a heat treatment which is performed after the etching. Note that the n$^+$-type layer 406a is provided between the second oxide semiconductor layer 405 and the first wiring 409 while the n$^+$-type layer 406b is provided between the second oxide semiconductor layer 405 and the second wiring 410. Further, an n$^+$-type layer 408a is provided between the fourth oxide semiconductor layer 407 and the second wiring 410 while an n$^+$-type layer 408b is provided between the fourth oxide semiconductor layer 407 and the third wiring 411.

The first thin film transistor 430 includes the first gate electrode 401 and a stack of the first oxide semiconductor layer 471 and the second oxide semiconductor layer 405 in a position overlapping with the first gate electrode 401 with the gate insulating layer 403 interposed therebetween, and the first wiring 409 is a power supply line at a ground potential (a ground power supply line). This power supply line at a ground potential may be a power supply line to which a negative voltage VDL is applied (a negative power supply line).

In addition, a second thin film transistor 431 includes the second gate electrode 402 and a stack of the third oxide semiconductor layer 451 and the fourth oxide semiconductor layer 407 in a position overlapping with the second gate electrode 402 with the gate insulating layer 403 interposed therebetween, and the third wiring 411 is a power supply line to which a positive voltage VDD is applied (a positive power supply line).

As illustrated in FIG. 2A, the second wiring 410 which is electrically connected to both the second oxide semiconductor layer 405 and the fourth oxide semiconductor layer 407 is directly connected to the second gate electrode 402 of the second thin film transistor 431 through the contact hole 404 formed in the gate insulating layer 403. By the direct connection between the second wiring 410 and the second gate electrode 402, favorable contact can be obtained, which leads to a reduction in contact resistance. In comparison with the case where the second gate electrode 402 and the second wiring 410 are connected to each other with another conductive film, e.g., a transparent conductive film, a reduction in the number of contact holes and a reduction in an area occupied due to the reduction in the number of contact holes can be achieved.

Figure 2B:
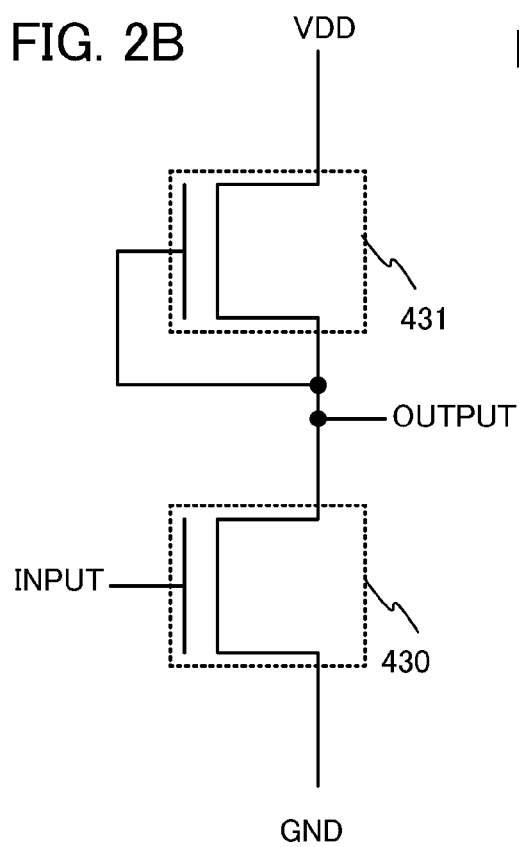
Figure 2C:
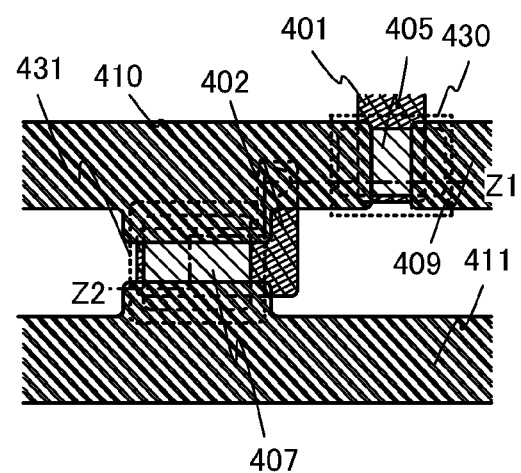

Further, FIG. 2C is a top view of the inverter circuit of the driver circuit. In FIG. 2C, a cross section taken along the chain line Z1-Z2 corresponds to FIG. 2A.

Further, FIG. 2B illustrates an equivalent circuit of an EDMOS circuit. The circuit connection illustrated in FIGS. 2A and 2C is illustrated in FIG. 2B. An example in which the first thin film transistor 430 is an n-channel enhancement transistor and the second thin film transistor 431 is an n-channel depletion transistor is illustrated.

Although the example of the EDMOS circuit is described in FIGS. 2A to 2C, an EEMOS circuit may alternatively be used. An equivalent circuit of the EEMOS circuit is illustrated in FIG. 3. In the equivalent circuit illustrated in FIG. 3, a driver circuit can be formed in either case: a case where a first thin film transistor 460 and a second thin film transistor 461 are both n-channel enhancement transistors, or a case where the first thin film transistor 460 is an n-channel enhancement transistor and the second thin film transistor 461, which is the other transistor, is an n-channel depletion transistor.

It can be said that it is preferable to use the circuit configuration illustrated in FIG. 3 in which n-channel enhancement transistors of the same type are combined for the driver circuit. This is because in such a case, a transistor used for the pixel portion is also formed of an n-channel enhancement transistor which is the same type as that used for the driver circuit, and therefore the number of manufacturing steps is not increased.

Further, in Embodiment 1, an example in which after the metal thin film and the oxide semiconductor layer are stacked, the metal thin film is oxidized to form a stack of the first oxide semiconductor layer and the second oxide semiconductor layer is given without particular limitation. The following manufacturing process may also be employed, for example: after the first oxide semiconductor layer is formed over the entire surface, the first oxide semiconductor layer in the driver circuit is covered with a resist and the first oxide semiconductor layer in the pixel portion is etched away; then, the resist is removed; and then, the second oxide semiconductor layer is formed over the entire surface. With such a manufacturing process, it is possible to form, over the same substrate, a pixel portion in which a thin film transistor including a single layer of an oxide semiconductor layer is provided and a driver circuit in which a thin film transistor including a stack of oxide semiconductor layers is provided.

Note that this embodiment mode can be arbitrarily combined with Embodiment 1.

Embodiment 3

A display device which is an example of a semiconductor device is described below. In that display device, at least part of a driver circuit and a thin film transistor in a pixel portion are formed over one substrate.

The thin film transistor in the pixel portion is formed according to Embodiment 1. The thin film transistor is an n-channel TFT; therefore, part of a driver circuit which can be formed using n-channel TFTs is formed over the same substrate as the thin film transistor in the pixel portion.

Figure 4A:
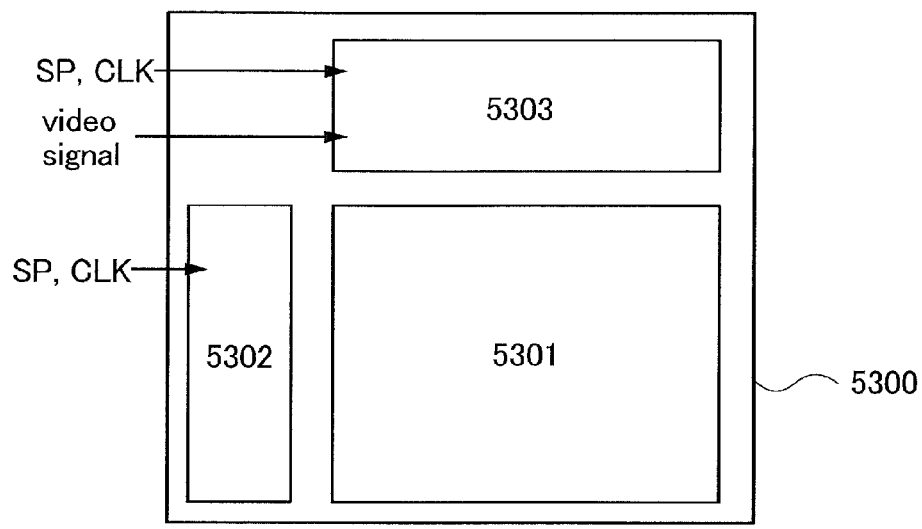
FIGS. 4A and 4B are examples of block diagrams of semiconductor devices.

FIG. 4A illustrates an example of a block diagram of an active matrix liquid crystal display device which is an example of a semiconductor device. The display device illustrated in FIG. 4A includes, over a substrate 5300, a pixel portion 5301 including a plurality of pixels each provided with a display element, a scan line driver circuit 5302 that selects a pixel, and a signal line driver circuit 5303 that controls a video signal input to the selected pixel.

The thin film transistor described in Embodiment 1 is an n-channel TFT. A signal line driver circuit including n-channel TFTs is described with reference to FIG. 5.

Figure 5:
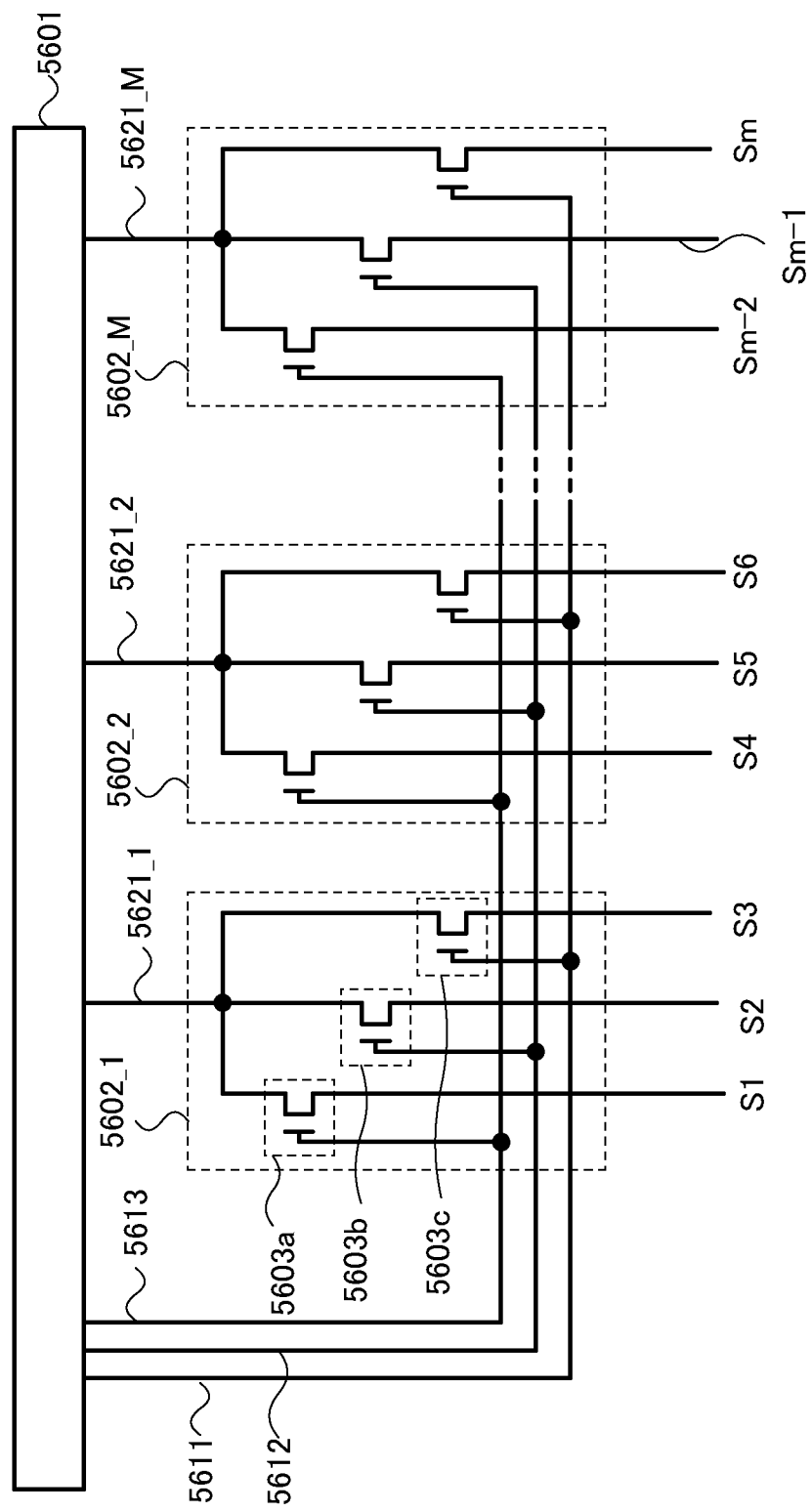
FIG. 5 illustrates an example of a structure of a signal line driver circuit.

The signal line driver circuit of FIG. 5 includes a driver IC 5601, switch groups 5602_1 to 5602_M, a first wiring 5611, a second wiring 5612, a third wiring 5613, and wirings 5621_1 to 5621_M. Each of the switch groups 5602_1 to 5602_M includes a first thin film transistor 5603a, a second thin film transistor 5603b, and a third thin film transistor 5603c.

The pixel portion 5301 is connected to the signal line driver circuit 5303 with a plurality of signal lines S1 to Sm (not shown) extending in a column direction from the signal line driver circuit 5303 and connected to the scan line driver circuit 5302 with a plurality of scan lines G1 to Gn (not shown) extending in a row direction from the scan line driver circuit 5302. The pixel portion 5301 includes a plurality of pixels (not shown) arranged in a matrix corresponding to the signal lines S1 to Sm and the scan lines G1 to Gn. In addition, each of the pixels is connected to a signal line Sj (any one of the signal lines S1 to Sm) and a scan line Gi (any one of the scan lines G1 to Gn).

The driver IC 5601 is connected to the first wiring 5611, the second wiring 5612, the third wiring 5613, and the wirings 5621_1 to 5621_M. Each of the switch groups 5602_1 to 5602_M is connected to the first wiring 5611, the second wiring 5612, and the third wiring 5613. In addition, the switch groups 5602_1 to 5602_M are connected to the wirings 5621_1 to 5621_M, respectively. Each of the wirings 5621_1 to 5621_M is connected to three signal lines through the first thin film transistor 5603a, the second thin film transistor 5603b, and the third thin film transistor 5603c. For example, the wiring 5621_J of the J-th column (one of the wirings 5621_1 to 5621_M) is connected to a signal line Sj−1, a signal line Sj, and a signal line Sj+1 through the first thin film transistor 5603a, the second thin film transistor 5603b, and the third thin film transistor 5603c of the switch group 5602_J, respectively.

Note that a signal is input to each of the first wiring 5611, the second wiring 5612, and the third wiring 5613.

Note that the driver IC 5601 is preferably formed over a single-crystal semiconductor substrate. The switch groups 5602_1 to 5602_M are preferably formed over the same substrate as the pixel portion. Therefore, the driver IC 5601 is preferably connected to the switch groups 5602_1 to 5602_M through an FPC or the like.

Figure 6:
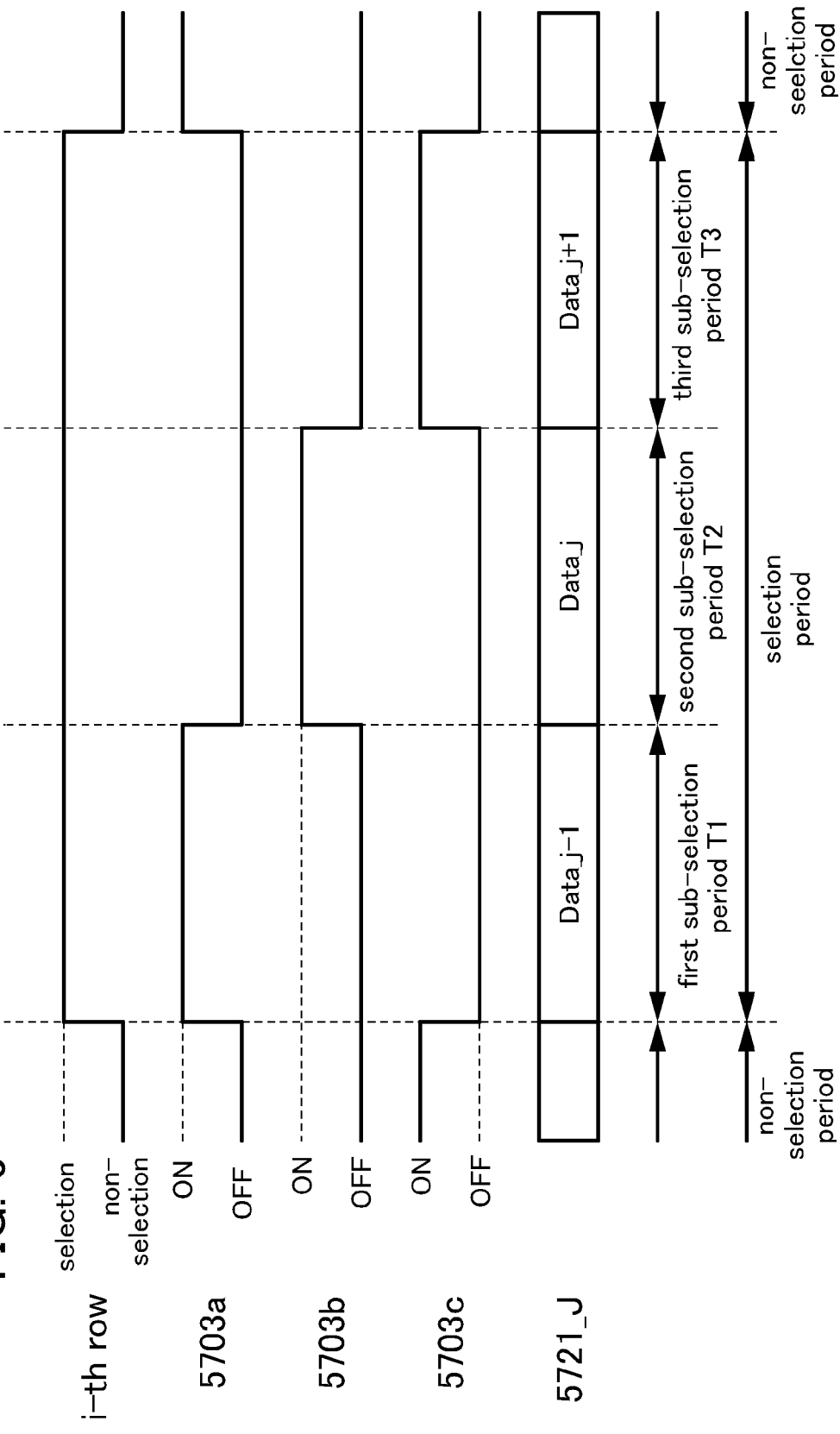
FIG. 6 is a timing diagram of an example of operation of a signal line driver circuit.

Next, operation of the signal line driver circuit of FIG. 5 is described with reference to a timing diagram of FIG. 6. FIG. 6 illustrates the timing diagram where a scan line Gi in the i-th row is selected. A selection period of the scan line Gi in the i-th row is divided into a first sub-selection period T1, a second sub-selection period T2, and a third sub-selection period T3. In addition, the signal line driver circuit of FIG. 5 operates as shown in FIG. 6 when a scan line in another row is selected.

Note that the timing diagram of FIG. 6 shows the case where the wiring 5621_J in the J-th column is connected to the signal line Sj−1, the signal line Sj, and the signal line Sj+1 through the first thin film transistor 5603a, the second thin film transistor 5603b, and the third thin film transistor 5603c, respectively.

The timing diagram of FIG. 6 shows timing at which the scan line Gi in the i-th row is selected, timing 5703a at which the first thin film transistor 5603a is turned on/off, timing 5703b at which the second thin film transistor 5603b is turned on/off, timing 5703c at which the third thin film transistor 5603c is turned on/off, and a signal 5721_J input to the wiring 5621_J in the J-th column.

In the first sub-selection period T1, the second sub-selection period T2, and the third sub-selection period T3, different video signals are input to the wirings 5621_1 to 5621_M. For example, a video signal input to the wiring 5621_J in the first sub-selection period T1 is input to the signal line Sj−1, a video signal input to the wiring 5621_J in the second sub-selection period T2 is input to the signal line Sj, and a video signal input to the wiring 5621_J in the third sub-selection period T3 is input to the signal line Sj+1. The video signals input to the wiring 5621_J in the first sub-selection period T1, the second sub-selection period T2, and the third sub-selection period T3 are denoted by Dataj−1, Data_j, and Dataj+1, respectively.

As shown in FIG. 6, in the first sub-selection period T1, the first thin film transistor 5603a is on, and the second thin film transistor 5603b and the third thin film transistor 5603c are off. At this time, Data_j−1 input to the wiring 5621_J is input to the signal line Sj−1 via the first thin film transistor 5603a. In the second sub-selection period T2, the second thin film transistor 5603b is on, and the first thin film transistor 5603a and the third thin film transistor 5603c are off. At this time, Data_j input to the wiring 5621_J is input to the signal line Sj via the second thin film transistor 5603b. In the third sub-selection period T3, the third thin film transistor 5603c is on, and the first thin film transistor 5603a and the second thin film transistor 5603b are off. At this time, Data_j+1 input to the wiring 5621_J is input to the signal line Sj+1 via the third thin film transistor 5603c.

As described above, in the signal line driver circuit of FIG. 5, one gate selection period is divided into three; thus, video signals can be input to three signal lines from one wiring 5621 in one gate selection period. Therefore, in the signal line driver circuit of FIG. 5, the number of connections between the substrate provided with the driver IC 5601 and the substrate provided with the pixel portion can be reduced to approximately one third of the number of signal lines. When the number of connections is reduced to approximately one third of the number of signal lines, the reliability, yield, and the like of the signal line driver circuit of FIG. 5 can be improved.

Note that there is no particular limitation on the arrangement, number, driving method, and the like of the thin film transistors, as long as one gate selection period is divided into a plurality of sub-selection periods and video signals are input to a plurality of signal lines from one wiring in the respective sub-selection periods as shown in FIG. 5.

For example, when video signals are input to three or more signal lines from one wiring in the respective sub-selection periods, it is only necessary to add a thin film transistor and a wiring for controlling the thin film transistor. Note that when one gate selection period is divided into four or more sub-selection periods, each sub-selection period becomes short. Therefore, one gate selection period is preferably divided into two or three sub-selection periods.

Figure 7:
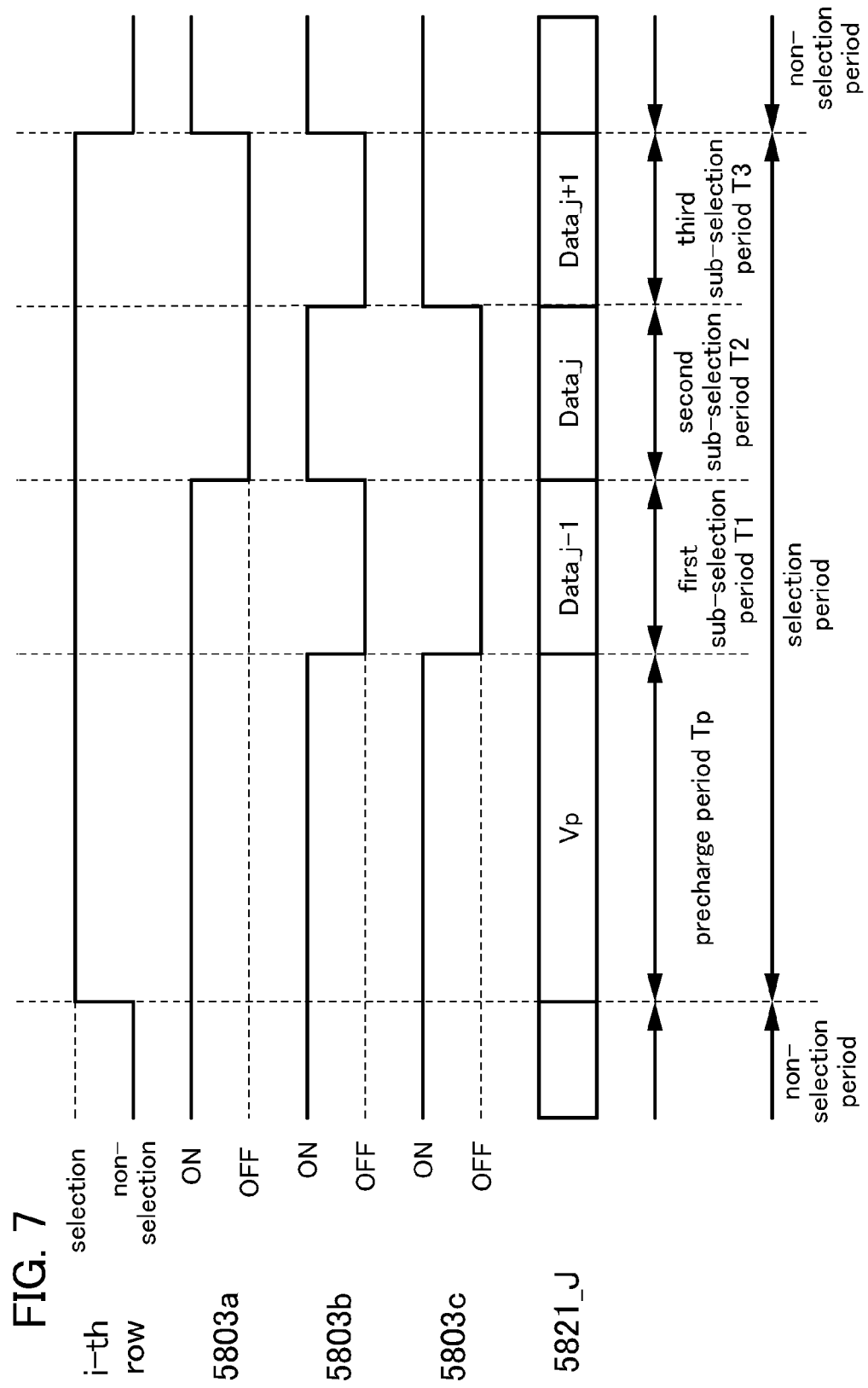
FIG. 7 is a timing diagram of an example of operation of a signal line driver circuit.

As another example, as shown in a timing diagram of FIG. 7, one selection period may be divided into a precharge period Tp, the first sub-selection period T1, the second sub-selection period T2, and the third sub-selection period T3. The timing diagram of FIG. 7 shows timing at which the scan line Gi in the i-th row is selected, timing 5803a at which the first thin film transistor 5603a is turned on/off, timing 5803b at which the second thin film transistor 5603b is turned on/off, timing 5803c at which the third thin film transistor 5603c is turned on/off, and a signal 5821_J input to the wiring 5621_J in the J-th column. As shown in FIG. 7, the first thin film transistor 5603a, the second thin film transistor 5603b, and the third thin film transistor 5603c are on in the precharge period Tp. At this time, a precharge voltage Vp input to the wiring 5621_J is input to the signal line Sj−1, the signal line Sj, and the signal line Sj+1 through the first thin film transistor 5603a, the second thin film transistor 5603b, and the third thin film transistor 5603c, respectively. In the first sub-selection period T1, the first thin film transistor 5603a is on, and the second thin film transistor 5603b and the third thin film transistor 5603c are off. At this time, Data_j−1 input to the wiring 5621_J is input to the signal line Sj−1 through the first thin film transistor 5603a. In the second sub-selection period T2, the second thin film transistor 5603b is on, and the first thin film transistor 5603a and the third thin film transistor 5603c are off. At this time, Data_j input to the wiring 5621_J is input to the signal line Sj through the second thin film transistor 5603b. In the third sub-selection period T3, the third thin film transistor 5603c is on, and the first thin film transistor 5603a and the second thin film transistor 5603b are off. At this time, Data_j+1 input to the wiring 5621_J is input to the signal line Sj+1 through the third thin film transistor 5603c.

As described above, in the signal line driver circuit of FIG. 5 to which the timing diagram of FIG. 7 is applied, the signal line can be precharged by providing the precharge period before the sub-selection periods. Thus, a video signal can be written to a pixel with high speed. Note that portions in FIG. 7 which are similar to those in FIG. 6 are denoted by the same reference numerals, and detailed description of the same portions or portions having similar functions is omitted.

Further, a constitution of the scan line driver circuit is described. The scan line driver circuit includes a shift register and a buffer. Also, the scan line driver circuit may include a level shifter in some cases. In the scan line driver circuit, when a clock signal (CLK) and a start pulse signal (SP) are input to the shift register, a selection signal is produced. The generated selection signal is buffered and amplified by the buffer, and the resulting signal is supplied to a corresponding scan line. Gate electrodes of transistors in pixels in one line are connected to the scan line. Further, since the transistors in the pixels in one line have to be turned on at the same time, a buffer which can feed a large amount of current is used.

An example of a shift register used as part of the scan line driver circuit is described with reference to FIG. 8 and FIG. 9.

Figure 8:
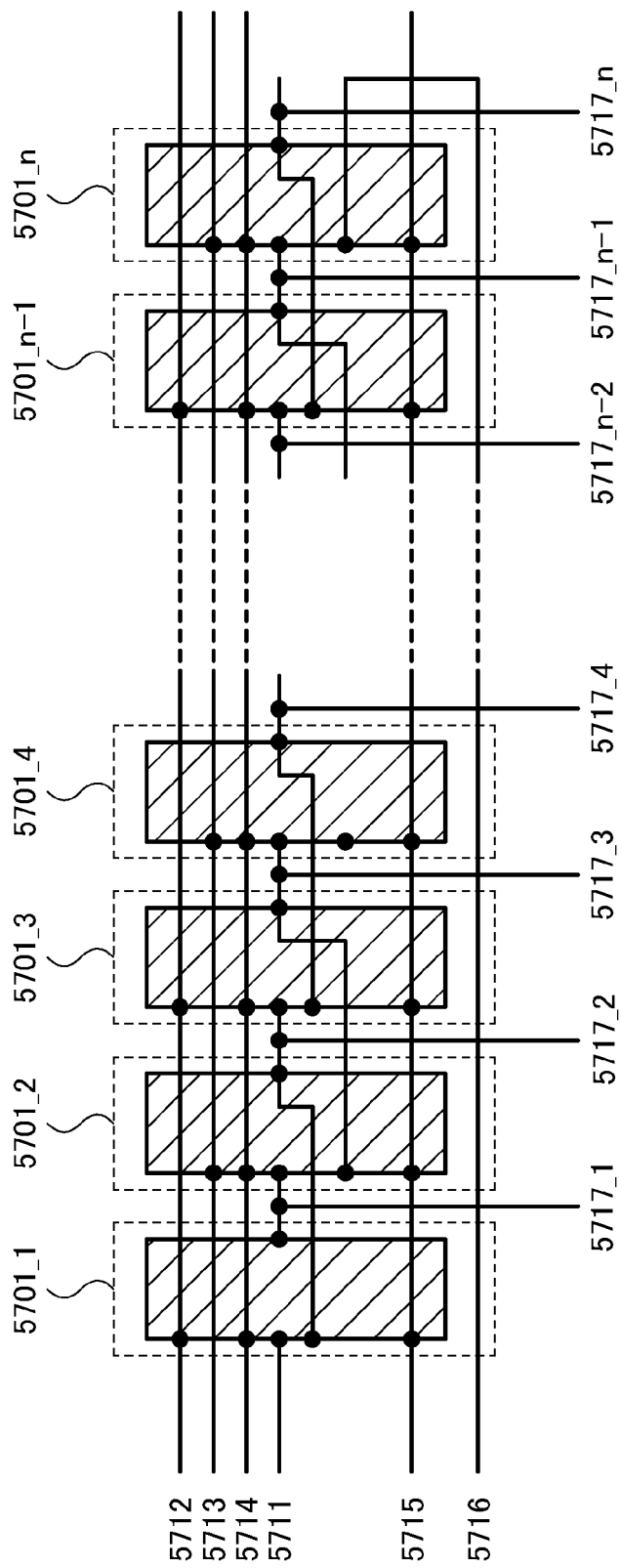
FIG. 8 illustrates an example of a structure of a shift register.

FIG. 8 illustrates a circuit configuration of the shift register. The shift register shown in FIG. 8 includes a plurality of flip-flops, flip-flops 5701_1 to 5701_n. The shift register operates by input of a first clock signal, a second clock signal, a start pulse signal, and a reset signal.

Connection relationships of the shift register of FIG. 8 are described. In the flip-flop 5701_i (one of the flip-flops 5701_1 to 5701_n) of the i-th stage in the shift register of FIG. 8, a first wiring 5501 shown in FIG. 9 is connected to a seventh wiring 5717_i−1, a second wiring 5502 shown in FIG. 9 is connected to a seventh wiring 5717_i+1, a third wiring 5503 shown in FIG. 9 is connected to a seventh wiring 5717_i, and a sixth wiring 5506 shown in FIG. 9 is connected to a fifth wiring 5715.

Figure 9:
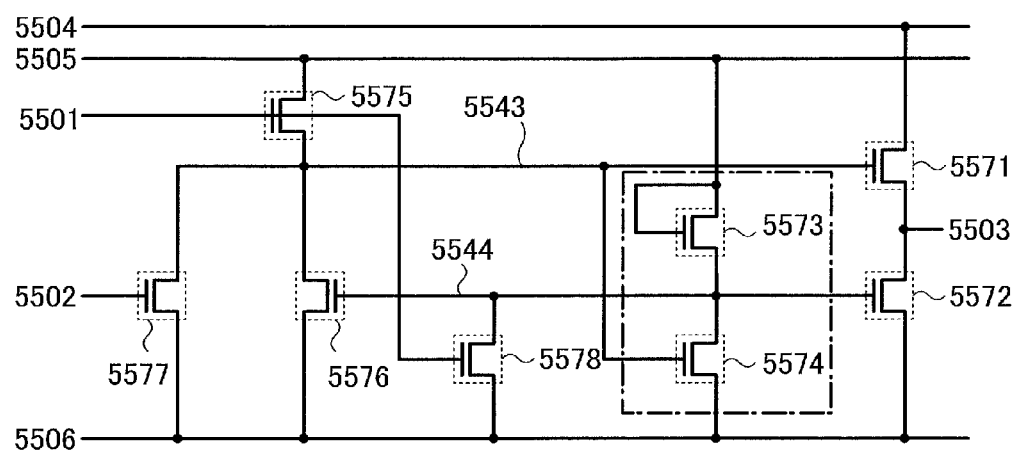
FIG. 9 illustrates an example of connection in a flip flop illustrated in FIG. 8.

Further, a fourth wiring 5504 shown in FIG. 9 is connected to a second wiring 5712 in flip-flops of odd-numbered stages, and is connected to a third wiring 5713 in flip-flops of even-numbered stages. A fifth wiring 5505 shown in FIG. 9 is connected to a fourth wiring 5714.

Note that the first wiring 5501 shown in FIG. 9 of the flip-flop 5701_1 of a first stage is connected to a first wiring 5711, and the second wiring 5502 shown in FIG. 9 of the flip-flop 5701_n of an n-th stage is connected to a sixth wiring 5716.

Note that the first wiring 5711, the second wiring 5712, the third wiring 5713, and the sixth wiring 5716 may be referred to as a first signal line, a second signal line, a third signal line, and a fourth signal line, respectively. The fourth wiring 5714 and the fifth wiring 5715 may be referred to as a first power supply line and a second power supply line, respectively.

FIG. 9 illustrates the detail of the flip-flop shown in FIG. 8. A flip-flop shown in FIG. 9 includes a first thin film transistor 5571, a second thin film transistor 5572, a third thin film transistor 5573, a fourth thin film transistor 5574, a fifth thin film transistor 5575, a sixth thin film transistor 5576, a seventh thin film transistor 5577, and an eighth thin film transistor 5578. Note that the first thin film transistor 5571, the second thin film transistor 5572, the third thin film transistor 5573, the fourth thin film transistor 5574, the fifth thin film transistor 5575, the sixth thin film transistor 5576, the seventh thin film transistor 5577, and the eighth thin film transistor 5578 are n-channel transistors and are turned on when the gate-source voltage ($V_{gs}$) exceeds the threshold voltage ($V_{th}$).

In FIG. 9, a gate electrode of the third thin film transistor 5573 is electrically connected to the power supply line. Further, it can be said that a circuit in which the third thin film transistor 5573 is connected to the fourth thin film transistor 5574 (a circuit surrounded by the chain line in FIG. 9) corresponds to a circuit having the structure illustrated in FIG. 2A. Although an example in which all the thin film transistors are n-channel enhancement transistors is described here, there is no particular limitation to this example. For example, the driver circuit can be driven even with the use of an n-channel depletion transistor as the third thin film transistor 5573.

Now, a connection structure of the flip-flop shown in FIG. 9 is described below.

A first electrode (one of a source electrode or a drain electrode) of the first thin film transistor 5571 is connected to the fourth wiring 5504, and a second electrode (the other of the source electrode or the drain electrode) of the first thin film transistor 5571 is connected to the third wiring 5503.

A first electrode of the second thin film transistor 5572 is connected to the sixth wiring 5506. A second electrode of the second thin film transistor 5572 is connected to the third wiring 5503.

A first electrode of the third thin film transistor 5573 is connected to the fifth wiring 5505. A second electrode of the third thin film transistor 5573 is connected to a gate electrode of the second thin film transistor 5572. A gate electrode of the third thin film transistor 5573 is connected to the fifth wiring 5505.

A first electrode of the fourth thin film transistor 5574 is connected to the sixth wiring 5506. A second electrode of the fourth thin film transistor 5574 is connected to the gate electrode of the second thin film transistor 5572. A gate electrode of the fourth thin film transistor 5574 is connected to a gate electrode of the first thin film transistor 5571.

A first electrode of the fifth thin film transistor 5575 is connected to the fifth wiring 5505. A second electrode of the fifth thin film transistor 5575 is connected to the gate electrode of the first thin film transistor 5571. A gate electrode of the fifth thin film transistor 5575 is connected to the first wiring 5501.

A first electrode of the sixth thin film transistor 5576 is connected to the sixth wiring 5506. A second electrode of the sixth thin film transistor 5576 is connected to the gate electrode of the first thin film transistor 5571. A gate electrode of the sixth thin film transistor 5576 is connected to the gate electrode of the second thin film transistor 5572.

A first electrode of the seventh thin film transistor 5577 is connected to the sixth wiring 5506. A second electrode of the seventh thin film transistor 5577 is connected to the gate electrode of the first thin film transistor 5571. A gate electrode of the seventh thin film transistor 5577 is connected to the second wiring 5502. A first electrode of the eighth thin film transistor 5578 is connected to the sixth wiring 5506. A second electrode of the eighth thin film transistor 5578 is connected to the gate electrode of the second thin film transistor 5572. A gate electrode of the eighth thin film transistor 5578 is connected to the first wiring 5501.

Note that the point at which the gate electrode of the first thin film transistor 5571, the gate electrode of the fourth thin film transistor 5574, the second electrode of the fifth thin film transistor 5575, the second electrode of the sixth thin film transistor 5576, and the second electrode of the seventh thin film transistor 5577 are connected is referred to as a node

5543. The point at which the gate electrode of the second thin film transistor 5572, the second electrode of the third thin film transistor 5573, the second electrode of the fourth thin film transistor 5574, the gate electrode of the sixth thin film transistor 5576, and the second electrode of the eighth thin film transistor 5578 are connected is referred to as a node 5544.

The first wiring 5501, the second wiring 5502, the third wiring 5503, and the fourth wiring 5504 may be referred to as a first signal line, a second signal line, a third signal line, and a fourth signal line, respectively. The fifth wiring 5505 and the sixth wiring 5506 may be referred to as a first power supply line and a second power supply line, respectively.

In addition, the signal line driver circuit and the scan line driver circuit can be formed using only the n-channel TFTs described in Embodiment 2. The n-channel TFT described in Embodiment 2 has a high mobility, and thus a driving frequency of a driver circuit can be increased. For example, a scan line driver circuit using the n-channel TFTs described in Embodiment 2 can operate at high speed, and thus a frame frequency can be increased and black insertion can be realized.

In addition, when the channel width of the transistor in the scan line driver circuit is increased or a plurality of scan line driver circuits are provided, for example, higher frame frequency can be realized. When a plurality of scan line driver circuits are provided, a scan line driver circuit for driving even-numbered scan lines is provided on one side and a scan line driver circuit for driving odd-numbered scan lines is provided on the opposite side; thus, an increase in frame frequency can be realized. Furthermore, the use of the plurality of scan line driver circuits for output of signals to the same scan line is advantageous in increasing the size of a display device.

In the case of manufacturing an active matrix light-emitting display device, which is an example of a semiconductor device, a plurality of scan line driver circuits are preferably provided because a plurality of thin film transistors are arranged in at least one pixel. An example of a block diagram of an active matrix light-emitting display device is illustrated in FIG. 4B.

Figure 4B:
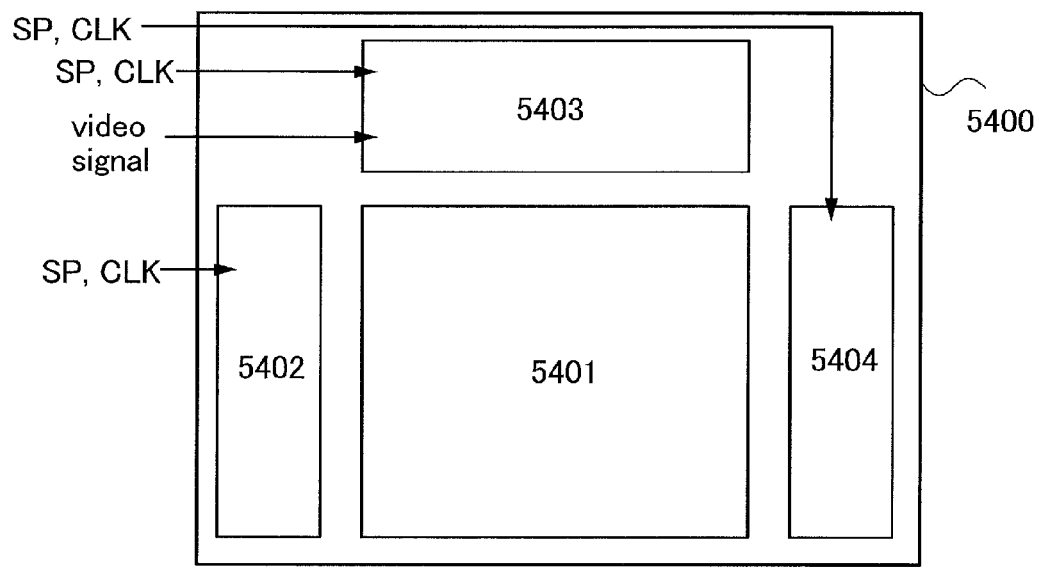

The light-emitting display device illustrated in FIG. 4B includes, over a substrate 5400, a pixel portion 5401 including a plurality of pixels each provided with a display element, a first scan line driver circuit 5402 and a second scan line driver circuit 5404 that select a pixel, and a signal line driver circuit 5403 that controls a video signal input to the selected pixel.

In the case of inputting a digital video signal to the pixel of the light-emitting display device of FIG. 4B, the pixel is put in a light-emitting state or non-light-emitting state by switching on/off of the transistor. Thus, grayscale can be displayed using an area ratio grayscale method or a time ratio grayscale method. An area ratio grayscale method refers to a driving method by which one pixel is divided into a plurality of subpixels and the respective subpixels are driven separately based on video signals so that grayscale is displayed. Further, a time ratio grayscale method refers to a driving method by which a period during which a pixel is in a light-emitting state is controlled so that grayscale is displayed.

Since the response time of light-emitting elements is shorter than that of liquid crystal elements or the like, the light-emitting elements are suitable for a time ratio grayscale method. Specifically, in the case of displaying by a time grayscale method, one frame period is divided into a plurality of subframe periods. Then, in accordance with video signals, the light-emitting element in the pixel is put in a light-emitting state or a non-light-emitting state in each subframe period. By dividing a frame period into a plurality of subframe periods, the total length of time in which pixels actually emit light in one frame period can be controlled with video signals to display grayscale.

Note that in an example of the light-emitting display device of FIG. 4B, in the case where one pixel includes two switching TFTs, a signal which is input to a first scan line which is a gate wiring of one of the switching TFTs is generated in the first scan line driver circuit 5402 and a signal which is input to a second scan line which is a gate wiring of the other switching TFT is generated in the second scan line driver circuit 5404. However, both of the signals which are input to the first scan line and the second scan line may be generated in one scan line driver circuit. In addition, for example, there is a possibility that a plurality of scan lines used for controlling the operation of the switching elements be provided in each pixel depending on the number of switching TFTs included in one pixel. In this case, the signals which are input to the scan lines may all be generated in one scan line driver circuit or may be generated in a plurality of scan line driver circuits.

Also in the light-emitting display device, part of the driver circuit which can be formed using the n-channel TFTs can be provided over one substrate together with the thin film transistors of the pixel portion. Moreover, the signal line driver circuit and the scan line driver circuit can be manufactured using only the n-channel TFTs described in Embodiment 2.

The above driver circuit may be used for not only a liquid crystal display device or a light-emitting display device but also an electronic paper in which electronic ink is driven by utilizing an element electrically connected to a switching element. The electronic paper is also called an electrophoretic display device (electrophoretic display) and has advantages in that it has the same level of readability as regular paper, it has less power consumption than other display devices, and it can be made thin and lightweight.

There are a variety of modes of electrophoretic displays. The electrophoretic display is a device in which a plurality of microcapsules each including first particles having positive charge and second particles having negative charge are dispersed in a solvent or a solute, and an electrical field is applied to the microcapsules so that the particles in the microcapsules move in opposite directions from each other, and only a color of the particles gathered on one side is displayed. Note that the first particles or the second particles include a colorant, and does not move when there is not electric field. Also, a color of the first particles is different from a color of the second particles (the particles may also be colorless).

Thus, the electrophoretic display utilizes a so-called dielectrophoretic effect, in which a substance with high dielectric constant moves to a region with high electric field. The electrophoretic display does not require a polarizing plate and a counter substrate, which are necessary for a liquid crystal display device, so that the thickness and weight thereof are about half.

A solution in which the above microcapsules are dispersed in a solvent is referred to as electronic ink. Electronic ink can be printed on a surface of glass, plastic, fabric, paper, or the like. Color display is also possible with the use of a color filter or particles including a coloring matter.

In addition, an active matrix display device can be completed by providing, as appropriate, a plurality of the microcapsules over an active matrix substrate so as to be interposed between two electrodes, and can perform display by application of electric field to the microcapsules. For example, the active matrix substrate obtained using the thin film transistors described in Embodiment 1 or 2 can be used.

Note that the first particles and the second particles in the microcapsules may be formed from any one of a conductive material, an insulating material, a semiconductor material, a magnetic material, a liquid crystal material, a ferroelectric material, an electroluminescent material, an electrochromic material, and a magnetophoretic material or a composite material thereof.

Through the above process, a highly reliable display device as a semiconductor device can be manufactured.

This embodiment can be implemented in appropriate combination with any of the structures described in the other embodiments.

Embodiment 4

This embodiment describes an example of a light-emitting display device as a semiconductor device. As a display element of the display device, here, a light-emitting element utilizing electroluminescence is described. Light-emitting elements utilizing electroluminescence are classified according to whether a light emitting material is an organic compound or an inorganic compound. The former is referred to as an organic EL element and the latter is referred to as an inorganic EL element.

In an organic EL element, by application of voltage to a light-emitting element, electrons and holes are separately injected from a pair of electrodes into a layer containing a light-emitting organic compound, and thus current flows. Then, those carriers (i.e., electrons and holes) are recombined, and thus, the light-emitting organic compound is excited. When the light-emitting organic compound returns to a ground state from the excited state, light is emitted. Owing to such a mechanism, this light emitting element is referred to as a current-excitation light emitting element.

The inorganic EL elements are classified according to their element structures into a dispersion type inorganic EL element and a thin-film type inorganic EL element. A dispersion type inorganic EL element has a light-emitting layer where particles of a light-emitting material are dispersed in a binder, and its light emission mechanism is donor-acceptor recombination type light emission that utilizes a donor level and an acceptor level. A thin-film type inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made here using an organic EL element as a light-emitting element.

Figure 10:
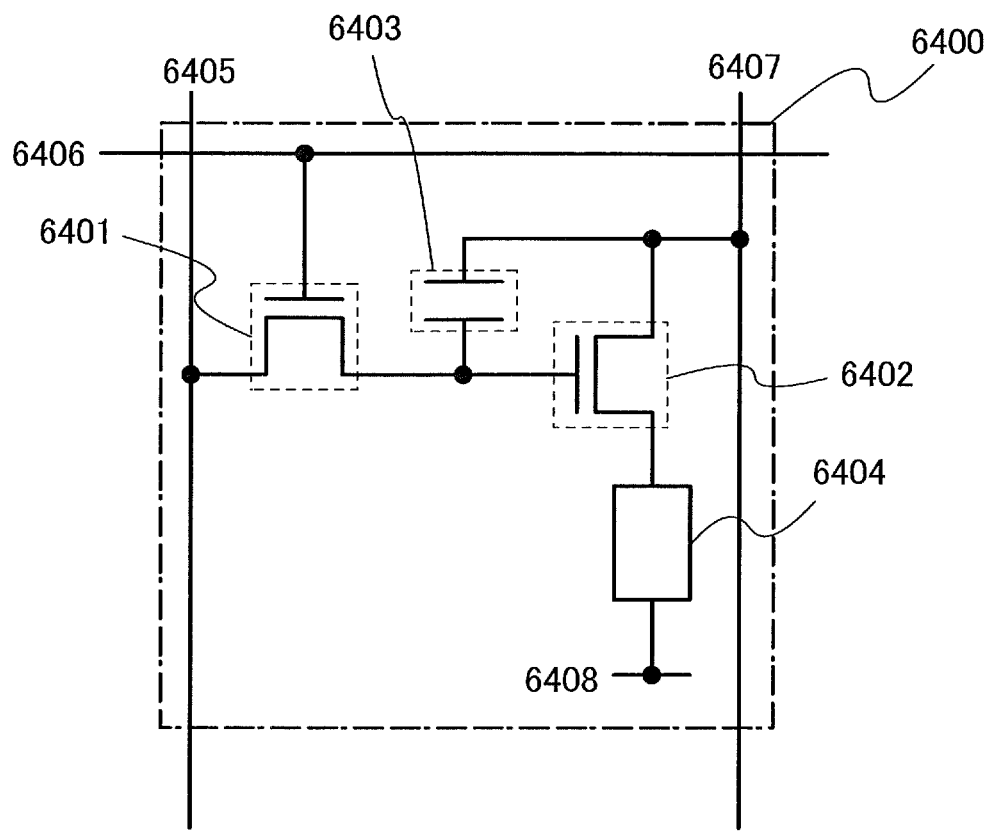
FIG. 10 illustrates an example of a pixel equivalent circuit of a semiconductor device.

FIG. 10 illustrates an example of a pixel structure to which digital time grayscale driving can be applied, as an example of a semiconductor device.

A structure and operation of a pixel to which digital time grayscale driving can be applied are described. In this example, one pixel includes two n-channel transistors in each of which an oxide semiconductor layer (typically, an In—Ga—Zn—O-based non-single-crystal film) in a channel formation region.

A pixel 6400 includes a switching transistor 6401, a driver transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driver transistor 6402. The gate of the driver transistor 6402 is connected to a power supply line 6407 through the capacitor 6403, a first electrode of the driver transistor 6402 is connected to the power supply line 6407, and a second electrode of the driver transistor 6402 is connected to a first electrode (pixel electrode) of the light-emitting element 6404. A second electrode of the light-emitting element 6404 corresponds to a common electrode 6408. The common electrode 6408 is electrically connected to a common potential line provided over the same substrate, and the connection portion may be used as a common connection portion.

Note that the second electrode (common electrode 6408) of the light-emitting element 6404 is set to a low power supply potential. The low power supply potential is a potential smaller than a high power supply potential when the high power supply potential set to the power supply line 6407 is a reference. As the low power supply potential, GND, 0 V, or the like may be employed, for example. In order to make the light-emitting element 6404 emit light by applying a potential difference between the high power supply potential and the low power supply potential to the light-emitting element 6404 so that current flows through the light-emitting element 6404, each of the potentials is set so that the potential difference between the high power supply potential and the low power supply potential is equal to or higher than the forward threshold voltage of the light-emitting element 6404.

Gate capacitance of the driver transistor 6402 may be used as a substitute for the capacitor 6403, so that the capacitor 6403 can be omitted. The gate capacitance of the driver transistor 6402 may be formed between the channel region and the gate electrode.

In the case of a voltage-input voltage driving method, a video signal is input to the gate of the driver transistor 6402 so that the driver transistor 6402 is either completely turned on or completely turned off. That is, the driver transistor 6402 operates in a linear region. Since the driver transistor 6402 operates in a linear region, voltage higher than the voltage of the power supply line 6407 is applied to the gate of the driver transistor 6402. Note that voltage which is equal to or higher than the sum of the voltage of the power supply line and the Vth of the driver transistor 6402 is applied to the signal line 6405.

In the case of performing analog grayscale driving instead of digital time grayscale driving, the same pixel structure as that in FIG. 10 can be used by changing signal input.

In the case of performing analog grayscale driving, voltage equal to or higher than the sum of the forward voltage of the light-emitting element 6404 and the Vth of the driver transistor 6402 is applied to the gate of the driver transistor 6402. The forward voltage of the light-emitting element 6404 indicates voltage at which a desired luminance is obtained, and includes at least a forward threshold voltage. By inputting a video signal to allow the driver transistor 6402 to operate in a saturation region, current can flow through the light-emitting element 6404. In order for the driver transistor 6402 to operate in a saturation region, the potential of the power supply line 6407 is set higher than the gate potential of the driver transistor 6402. When an analog video signal is used, current can be fed to the light-emitting element 6404 in accordance with the video signal and analog grayscale driving can be performed.

Note that the pixel structure shown in FIG. 10 is not limited thereto. For example, a switch, a resistor, a capacitor, a transistor, a logic circuit, or the like may be added to the pixel shown in FIG. 10.

Next, structures of a light-emitting element are described with reference to FIGS. 11A to 11C. A cross-sectional structure of a pixel is described here by taking an n-channel driver TFT as an example. TFTs 7001, 7011, and 7021 serving as driver TFTs used for semiconductor devices illustrated in FIGS. 11A to 11C can be formed by a method similar to the method for forming the second thin film transistor 170 described in Embodiment 1. The TFTs 7001, 7011, and 7021 each include an oxide semiconductor film as a semiconductor layer.

In order to extract light emitted from the light-emitting element, at least one of an anode and a cathode is required to be transparent. A thin film transistor and a light-emitting element are formed over a substrate. A light-emitting element can have a top-emission structure in which light is extracted through the surface opposite to the substrate; a bottom-emission structure in which light is extracted through the surface of the substrate; or a dual-emission structure in which light is extracted through the surface opposite to the substrate and the surface of the substrate. The pixel structure can be applied to a light-emitting element having any of these emission structures.

A light-emitting element with a top-emission structure is described with reference to FIG. 11A.

Figure 11A:
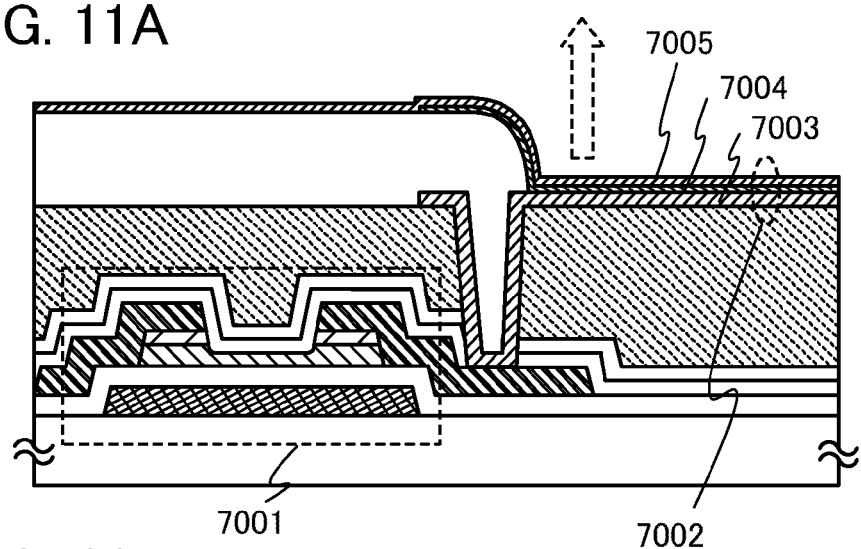
FIGS. 11A to 11C are cross-sectional views of examples of semiconductor devices.
Figure 11B:
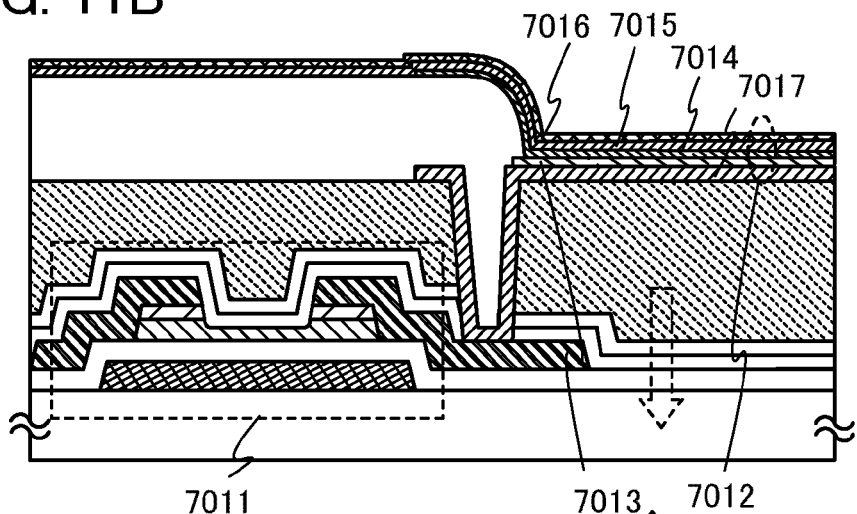
Figure 11C:
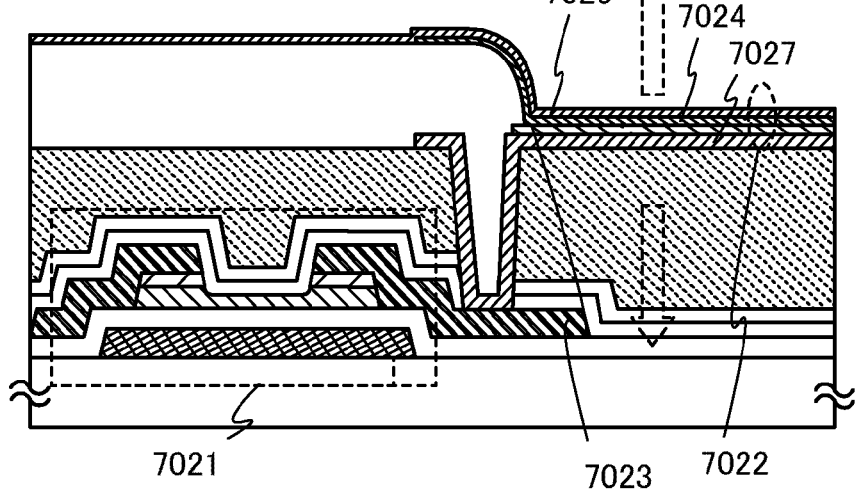

FIG. 11A is a cross-sectional view of a pixel in the case where the TFT 7001 serving as a driver TFT is an n-channel TFT and light generated in a light-emitting element 7002 is emitted through an anode 7005. The TFT 7001 includes an In—Sn—Zn—O-based oxide semiconductor to which silicon oxide is added as its semiconductor layer. If the In—Sn—Zn—O-based oxide semiconductor contains an impurity such as silicon oxide, crystallization of the In—Sn—Zn—O-based oxide semiconductor or generation of microcrystal grains can be prevented even when the In—Sn—Zn—O-based oxide semiconductor is subjected to heat treatment at 300° C. to 600° C. In FIG. 11A, a cathode 7003 of the light-emitting element 7002 is electrically connected to the TFT 7001 serving as a driver TFT, and a light-emitting layer 7004 and the anode 7005 are stacked in this order over the cathode 7003. The cathode 7003 can be formed using any of conductive materials which have a low work function and a film of which reflects light. For example, Ca, Al, CaF, MgAg, AlLi, or the like is preferably used. The light-emitting layer 7004 may be formed using a single layer or by stacking a plurality of layers. When the light-emitting layer 7004 is formed using a plurality of layers, the light-emitting layer 7004 is formed by stacking an electron-injecting layer, an electron-transporting layer, a light-emitting layer, a hole-transporting layer, and a hole-injecting layer in this order over the cathode 7003. It is not necessary to form all of these layers. The anode 7005 is formed using a light-transmitting conductive film formed from a light-transmitting conductive material such as indium oxide containing tungsten oxide, indium zinc oxide containing tungsten oxide, indium oxide containing titanium oxide, indium tin oxide containing titanium oxide, indium tin oxide (hereinafter, referred to as ITO), indium zinc oxide, or indium tin oxide to which silicon oxide is added.

The light-emitting element 7002 corresponds to a region where the cathode 7003 and the anode 7005 sandwich the light-emitting layer 7004. In the pixel illustrated in FIG. 11A, light is emitted from the light-emitting element 7002 to the anode 7005 side as indicated by an arrow.

Next, a light-emitting element having a bottom-emission structure is described with reference to FIG. 11B. FIG. 11B is a cross-sectional view of a pixel in the case where the driver TFT 7011 is an n-channel TFT, and light generated in a light-emitting element 7012 is emitted through a cathode 7013. The TFT 7001 includes an In—Al—Zn—O-based oxide semiconductor to which silicon oxide is added as its semiconductor layer. If the In—Al—Zn—O-based oxide semiconductor contains an impurity such as silicon oxide, crystallization of the In—Al—Zn—O-based oxide semiconductor or generation of microcrystal grains can be prevented even when the In—Al—Zn—O-based oxide semiconductor is subjected to heat treatment at 300° C. to 600° C. In FIG. 11B, the cathode 7013 of the light-emitting element 7012 is formed over a conductive film 7017 having a light-transmitting property which is electrically connected to the driver TFT 7011, and a light-emitting layer 7014 and an anode 7015 are stacked in this order over the cathode 7013. Note that a light-blocking film 7016 for reflecting or blocking light may be formed so as to cover the anode 7015 when the anode 7015 has a light-transmitting property. For the cathode 7013, any of conductive materials which have a low work function can be used as in the case of FIG. 11A. Note that the cathode 7013 is formed to have a thickness with which the cathode 7013 can transmit light (preferably, approximately from 5 nm to 30 nm). For example, an aluminum film with a thickness of 20 nm can be used as the cathode 7013. The light-emitting layer 7014 may be formed of a single layer or by stacking a plurality of layers as in the case of FIG. 11A. The anode 7015 is not required to transmit light, but can be formed using a light-transmitting conductive material as in the case of FIG. 11A. For the light-blocking film 7016, metal or the like that reflects light can be used; however, it is not limited to a metal film. For example, a resin or the like to which black pigment is added can be used.

The light-emitting element 7012 corresponds to a region where the cathode 7013 and the anode 7015 sandwich the light-emitting layer 7014. In the pixel illustrated in FIG. 11B, light is emitted from the light-emitting element 7012 to pass through the cathode 7013 as indicated by an arrow.

Next, a light-emitting element having a dual-emission structure is described with reference to FIG. 11C. In FIG. 11C, a cathode 7023 of a light-emitting element 7022 is formed over a conductive film 7027 having a light-transmitting property which is electrically connected to the driver TFT 7021, and a light-emitting layer 7024 and an anode 7025 are stacked in this order over the cathode 7023. The TFT 7001 includes a Sn—Al—Zn—O-based oxide semiconductor to which silicon oxide is added as its semiconductor layer. If the Sn—Al—Zn—O-based oxide semiconductor contains an impurity such as silicon oxide, crystallization of the Sn—Al—Zn—O-based oxide semiconductor or generation of microcrystal grains can be prevented even when the Sn—Al—Zn—O-based oxide semiconductor is subjected to heat treatment at 300° C. to 600° C. As in the case of FIG. 11A, the cathode 7023 can be formed of any of conductive materials which have a low work function. Note that the cathode 7023 is formed to have a thickness with which the cathode 7023 can transmit light. For example, an Al film having a thickness of 20 nm can be used as the cathode 7023. The light-emitting layer 7024 may be formed using a single layer or by stacking a plurality of layers as in the case of FIG. 11A. In a manner similar to FIG. 11A, the anode 7025 can be formed using a light-transmitting conductive material.

The light-emitting element 7022 corresponds to a region where the cathode 7023, the light-emitting layer 7024, and the anode 7025 overlap with each other. In the pixel illustrated in FIG. 11C, light is emitted from the light-emitting element 7022 to pass through both the anode 7025 and the cathode 7023 as indicated by arrows.

Although an organic EL element is described here as a light-emitting element, an inorganic EL element can alternatively be provided as a light-emitting element.

Note that this embodiment describes an example in which a thin film transistor (a driver TFT) which controls the driving of a light-emitting element is electrically connected to the light-emitting element, but a structure may be employed in which a current control TFT is connected between the driver TFT and the light-emitting element.

Next, the appearance and cross section of a light-emitting display panel (also referred to as a light-emitting panel) which is one mode of a semiconductor device will be described with reference to FIGS. 12A and 12B. FIG. 12A is a top view of a panel in which a light-emitting element and a thin film transistor over a first substrate are sealed with a sealant between the first substrate and a second substrate. FIG. 12B is a cross-sectional view along H-I of FIG. 12A.

A sealant 4505 is provided so as to surround a pixel portion 4502, signal line driver circuits 4503a and 4503b, and scan line driver circuits 4504a and 4504b, which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, with the first substrate 4501, the sealant 4505, and the second substrate 4506. In this manner, it is preferable that the light-emitting display panel be packaged (sealed) with a protective film (such as an attachment film or an ultraviolet curable resin film) or a cover material with high air-tightness and little degasification so that at least the pixel portion 4502 is not exposed to external air.

The pixel portion 4502, the signal line driver circuits 4503a and 4503b, and the scan line driver circuits 4504a and 4504b which are formed over the first substrate 4501 each include a plurality of thin film transistors. A thin film transistor 4510 included in the pixel portion 4502 and a thin film transistor 4509 included in the signal line driver circuit 4503a are illustrated as an example in FIG. 12B.

As the thin film transistor 4509, the first thin film transistor described in Embodiment 1 which includes a stack of oxide semiconductor layers as its semiconductor layer is employed. As the thin film transistor 4510, the second thin film transistor described in Embodiment 1 which includes a single layer of an In—Ga—Zn—O-based non-single-crystal film is employed. In this embodiment, the thin film transistors 4509 and 4510 are n-channel thin film transistors.

Moreover, reference numeral 4511 denotes a light-emitting element. A first electrode layer 4517 which is a pixel electrode included in the light-emitting element 4511 is electrically connected to a source or drain electrode layer of the thin film transistor 4510. Note that although the light-emitting element 4511 has a stacked structure of the first electrode layer 4517, an electroluminescent layer 4512, and a second electrode layer 4513 in this embodiment, the structure of the light-emitting element 4511 is not limited thereto. The structure of the light-emitting element 4511 can be changed as appropriate depending on a direction in which light is extracted from the light-emitting element 4511, or the like.

A partition wall 4520 is formed using an organic resin film, an inorganic insulating film, or organic polysiloxane. It is particularly preferable that the partition wall 4520 be formed using a photosensitive material to have an opening portion on the first electrode layer 4517 so that a sidewall of the opening portion is formed as an inclined surface with a continuous curvature.

The electroluminescent layer 4512 may be formed using a single layer or a plurality of layers stacked.

In order to prevent entry of oxygen, hydrogen, moisture, carbon dioxide, or the like into the light-emitting element 4511, a protective film may be formed over the second electrode layer 4513 and the partition wall 4520. As the protective film, a silicon nitride film, a silicon nitride oxide film, a DLC film, or the like can be formed.

In addition, a variety of signals and potentials are supplied from FPCs 4518a and 4518b to the signal line driver circuits 4503a and 4503b, the scan line driver circuits 4504a and 4504b, or the pixel portion 4502.

In this embodiment, a connecting terminal electrode 4515 is formed using the same conductive film as the first electrode layer 4517 included in the light-emitting element 4511. A terminal electrode 4516 is formed using the same conductive film as the source and drain electrode layers included in the thin film transistors 4509 and 4510.

The connecting terminal electrode 4515 is electrically connected to a terminal included in the FPC 4518a through an anisotropic conductive film 4519.

The second substrate located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin can be used as well as inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used. In this embodiment, nitrogen is used for the filler.

In addition, if needed, an optical film such as a polarizing plate, a circularly polarizing plate (including an elliptically polarizing plate), a retardation plate (a quarter-wave plate or a half-wave plate), and a color filter may be provided as appropriate on an emission surface of the light-emitting element. Further, the polarizing plate or the circularly polarizing plate may be provided with an anti-reflection film. For example, anti-glare treatment by which reflected light is diffused by depressions and projections of the surface so as to reduce the glare can be performed.

As the signal line driver circuits 4503a and 4503b and the scan line driver circuits 4504a and 4504b, driver circuits formed by using a single crystal semiconductor film or a polycrystalline semiconductor film over a substrate separately prepared may be mounted. In addition, only the signal line driver circuits or part thereof, or only the scan line driver circuits or part thereof may be separately formed and then mounted. This embodiment is not limited to the structure shown in FIGS. 12A and 12B.

Through the above steps, a highly reliable light-emitting device (display panel) as a semiconductor device can be manufactured.

This embodiment can be implemented in appropriate combination with any of the structures described in the other embodiments.

Embodiment 5

Figure 13A:
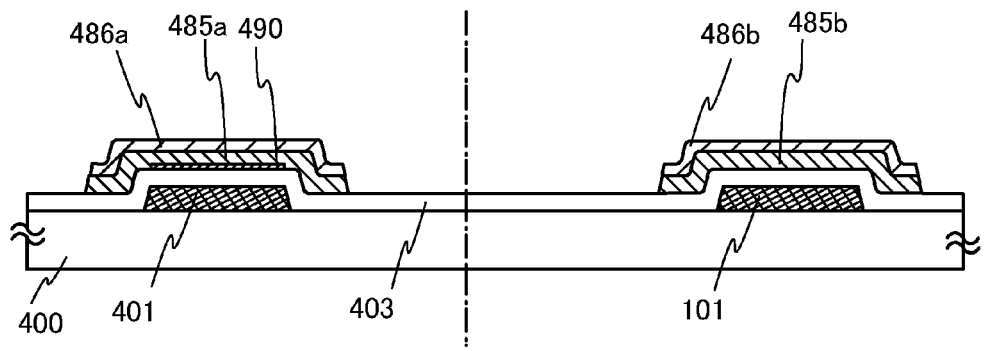
FIGS. 13A to 13C are cross-sectional views of an example of a manufacturing process of a semiconductor device.
Figure 13B:
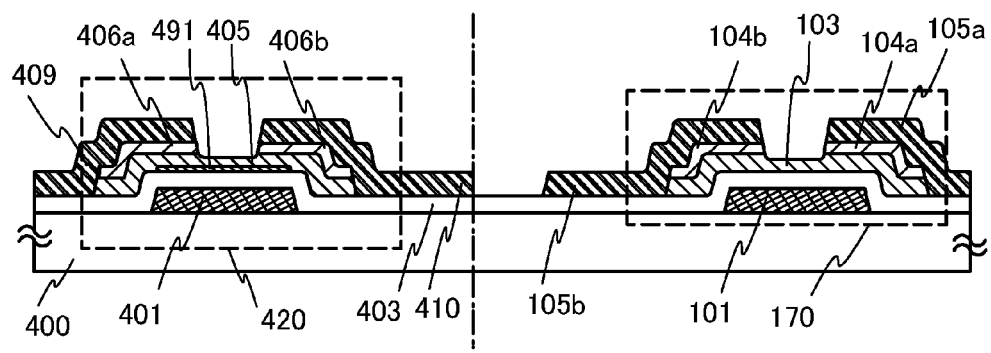

In this embodiment, an example is described with reference to FIGS. 13A to 13C in which the area of the top surface of the metal thin film is different from that in Embodiment 1; in other words, end portions of the metal thin film are located away from end portions of the second oxide semiconductor layer. Note that except for the shape of the metal thin film, this example is same as the example in FIGS. 1A to 1C and the same reference numerals designate the same parts.

First, as in Embodiment 1, the first gate electrode 401 and the second gate electrode 101 are provided over the substrate 400 having an insulating surface. Note that in formation of the first gate electrode 401 and the second gate electrode 101, a capacitor wiring 108 in a pixel portion and a first terminal 121 in a terminal portion are also formed.

Then, the gate insulating layer 403 covering the first gate electrode 401 and the second gate electrode 101 is formed.

Then, a metal thin film of indium, zinc, tin, molybdenum, tungsten, or the like is formed over the gate insulating layer 403. Alternatively, an alloy thin film or a stacked-layer film of any of those elements can be formed. The metal thin film is formed by a sputtering method, a vacuum vapor deposition method, or a coating method. Here, a zinc film is formed by a sputtering method to have a thickness of more than 0 nm and equal to or less than 10 nm, preferably, 3 nm to 5 nm inclusive.

Then, the metal thin film is removed as selected by a photolithography technique. In this etching step, a metal thin film 490 is formed to have an area smaller than an area of a patterned shape of an oxide semiconductor layer to be formed later. Note that the metal thin film 490 is formed in a position at least part of which overlaps with the first gate electrode 401 with the gate insulating layer 403 interposed therebetween. When the metal thin film 490 is formed in such a manner, side surfaces of the metal thin film 490 are covered with the oxide semiconductor layer. Therefore, even if the metal thin film is not sufficiently oxidized by subsequent heat treatment, a short circuit between the first wiring 409 and the second wiring 410 by the metal thin film can be prevented.

Then, an oxide semiconductor layer is formed to cover the top and side surfaces of the metal thin film 490. In this embodiment, a first In—Ga—Zn—O-based non-single-crystal film is formed by a sputtering method as the oxide semiconductor layer.

In the case where a first In—Ga—Zn—O-based oxide semiconductor layer is formed by a sputtering method, an oxide semiconductor target containing In, Ga, and Zn may contain an insulating impurity. The impurity is insulating oxide typified by silicon oxide, germanium oxide, aluminum oxide, or the like; insulating nitride typified by silicon nitride, aluminum nitride, or the like; insulating oxynitride such as silicon oxynitride or aluminum oxynitride; or the like. For example, $SiO_2$ is preferably mixed into the oxide semiconductor target at 0.1 wt % to 10 wt % inclusive, more preferably 1 wt % to 6 wt % inclusive.

Next, an oxide semiconductor film (in this embodiment, a second In—Ga—Zn—O-based non-single-crystal film) which has lower resistivity than the first In—Ga—Zn—O-based non-single-crystal film is formed by a sputtering method without exposure to air.

Next, a photolithography step is performed to form a resist mask, and the first In—Ga—Zn—O-based non-single-crystal film and the second In—Ga—Zn—O-based non-single-crystal film are etched. Unnecessary portions are removed by etching, thereby forming the oxide semiconductor films 485a and 485b, which are the first In—Ga—Zn—O-based non-single-crystal films, and the oxide semiconductor films 486a and 486b, which are the second In—Ga—Zn—O-based non-single-crystal films. FIG. 13A is a cross-sectional view of this stage. As illustrated in FIG. 13A, the oxide semiconductor film 485a, which is the first In—Ga—Zn—O-based non-single-crystal film, covers the top and side surfaces of the metal thin film 490 so that the metal thin film 490 is not exposed.

Note that an example in which the second In—Ga—Zn—O-based non-single-crystal film is provided is described without limitation in this embodiment. The second In—Ga—Zn—O-based non-single-crystal film is not necessarily provided.

Next, a photolithography step is performed to form a resist mask, and unnecessary portions are removed by etching, thereby forming a contact hole reaching a wiring or electrode layer which is formed from the same material as the gate electrode layer. This contact hole is provided for direct contact with a conductive film formed later. For example, a contact hole is formed when a thin film transistor whose gate electrode layer is in direct contact with the source or drain electrode layer is formed in a driver circuit portion, or when a terminal that is electrically connected to a gate wiring of a terminal portion is formed.

Then, a conductive film is formed from a metal material by a sputtering method over the oxide semiconductor films 486a and 486b, which are the second In—Ga—Zn—O-based non-single-crystal films, and over the gate insulating layer 403.

Then, a resist mask is formed by a photolithography step, and unnecessary portions are removed by etching. Thus, the source and drain electrode layers 105a and 105b and the $n^+$-type layers 104a and 104b serving as source and drain regions are formed in the pixel portion while the first and second wirings 409 and 410 serving as source and drain electrode layers and the $n^+$-type layers 406a and 406b serving as source and drain regions are formed in the driver circuit portion. In this etching step, an exposed region of the oxide semiconductor film is partly etched to be the oxide semiconductor layer 103. Thus, a channel region of the oxide semiconductor layer 103 between the $n^+$-type layers 104a and 104b has a small thickness. Through the above steps, the second thin film transistor 170 including the oxide semiconductor layer 103 as its channel formation region can be formed in the pixel portion. In the photolithography step, a second terminal 122 that is made of the same material as the source and drain electrode layers 105a and 105b is left in the terminal portion. Note that the second terminal 122 is electrically connected to a source wiring (a source wiring including the source and drain electrode layers 105a and 105b).

Figure 15:
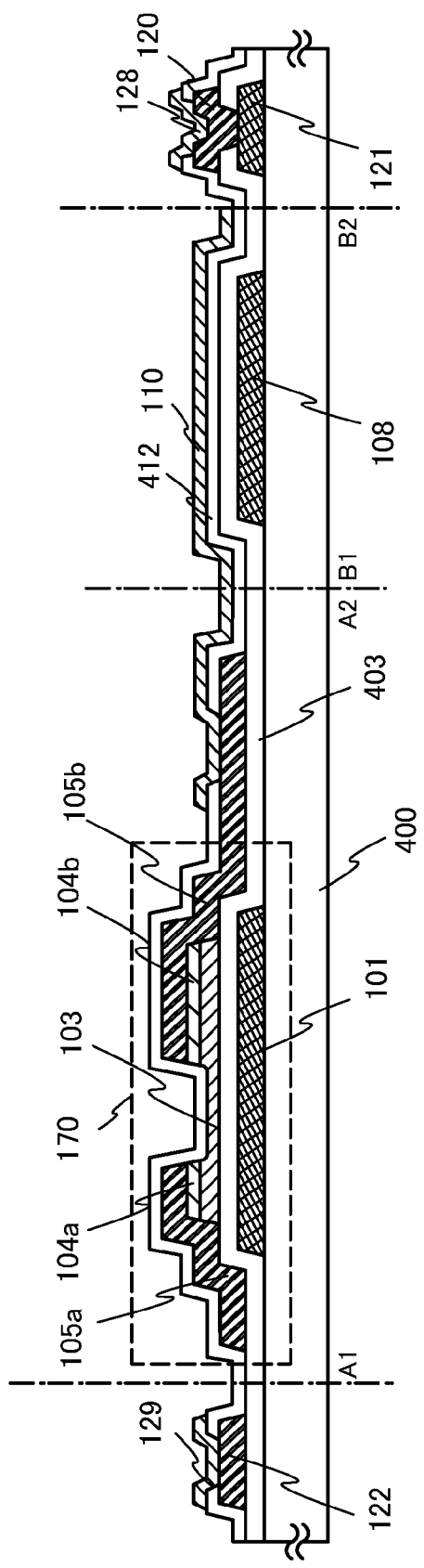
FIG. 15 is a cross-sectional view of an example of a pixel portion, a capacitor portion, and a terminal portion.

In addition, in the terminal portion, the connection electrode 120 is directly connected to the first terminal 121 of the terminal portion through a contact hole formed in the gate insulating film (see FIG. 15). Note that although not illustrated here, a source or drain wiring of the thin film transistor of the driver circuit is directly connected to the gate electrode through the same steps as the above steps.

Next, heat treatment is preferably performed at 200° C. to 600° C., typically, 300° C. to 500° C. (the heat treatment may be annealing with light)). Here, heat treatment is performed in air in a furnace at 350° C. for 1 hour. This heat treatment is also called oxidation treatment which oxidizes the metal thin film 490 partly or entirely. In this embodiment, the metal thin film 490 becomes a zinc oxide film having conductivity, a first oxide semiconductor layer 491. Through the above steps, the first thin film transistor 420 including a stack of the first oxide semiconductor layer 491 and the second oxide semiconductor layer 405 can be manufactured in the driver circuit. FIG. 13B is a cross-sectional view of this stage. Further, through this heat treatment, rearrangement at the atomic level occurs in the In—Ga—Zn—O-based non-single-crystal film. Note that there is no particular limitation on the timing of the heat treatment and the heat treatment may be performed anytime after formation of the second In—Ga—Zn—O-based non-single-crystal film, and for example, the heat treatment may be performed after formation of a pixel electrode.

Next, the resist mask is removed, and the protective insulating layer 412 is formed to cover the first thin film transistor 420 and the second thin film transistor 170.

Then, a photolithography step is performed to form a resist mask, and the protective insulating layer 412 is etched to form a contact hole which reaches the source or drain electrode layer 105b. In addition, by the etching here, a contact hole which reaches the second terminal 122 and a contact hole which reaches the connection electrode 120 are formed.

Then, after the resist mask is removed, a transparent conductive film is formed. The transparent conductive film is formed using indium oxide ($In_2O_3$), indium tin oxide ($In_2O_3$—$SnO_2$, abbreviated as ITO), or the like by a sputtering method, a vacuum evaporation method, or the like. Etching treatment of such a material is performed with a hydrochloric acid based solution. However, because a residue tends to be generated particularly in etching of ITO, an alloy of indium oxide and zinc oxide ($In_2O_3$—ZnO) may be used in order to improve etching processability.

Next, a photolithography step is performed to form a resist mask, and unnecessary portions are removed by etching, thereby forming a pixel electrode layer 110. Further, in this photolithography step, a storage capacitor is formed with the capacitor wiring 108 and the pixel electrode layer 110. The storage capacitor includes the gate insulating layer 403 and the protective insulating layer 412 in the capacitor portion as dielectrics. In addition, in this photolithography step, the first terminal and the second terminal are covered with the resist mask, and transparent conductive films 128 and 129 are left in the terminal portion. The transparent conductive films 128 and 129 serve as electrodes or wirings that are used for connection with an FPC. The transparent conductive film 128 formed over the connection electrode 120 that is directly connected to the first terminal 121 serves as a terminal electrode for connection which serves as an input terminal for the gate wiring. The transparent conductive film 129 formed over the second terminal 122 serves as a terminal electrode for connection which serves as an input terminal for the source wiring (see FIG. 15).

Note that an example in which the storage capacitor is formed from the capacitor wiring 108 and the pixel electrode layer 110 by using the gate insulating layer 403 and the protective insulating layer 412 as the dielectrics is described here. However, there is no particular limitation and a structure may also be employed in which an electrode formed of the same material as the source electrode or the drain electrode is provided above the capacitor wiring and a storage capacitor is formed from the electrode, the capacitor wiring, and the gate insulating layer 403 therebetween as a dielectric, and the electrode and the pixel electrode are electrically connected.

Figure 13C:
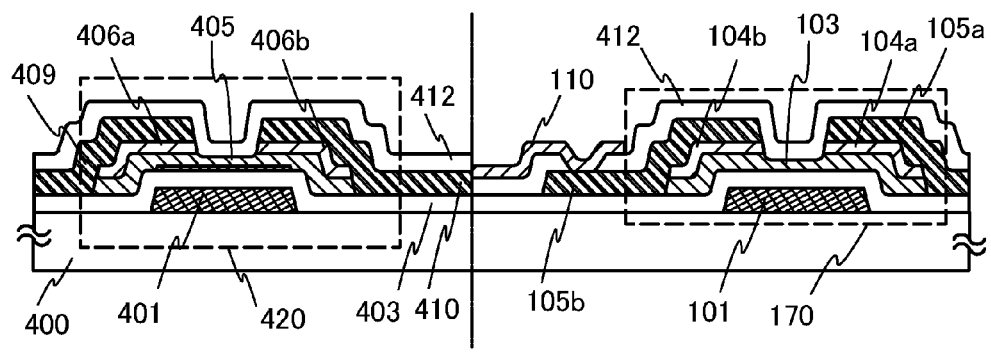

Then, the resist mask is removed, and a cross-sectional view at this stage is illustrated in FIG. 13C. Note that a top view of the second thin film transistor 170 in the pixel portion at this stage corresponds to FIG. 14.

Figure 14:
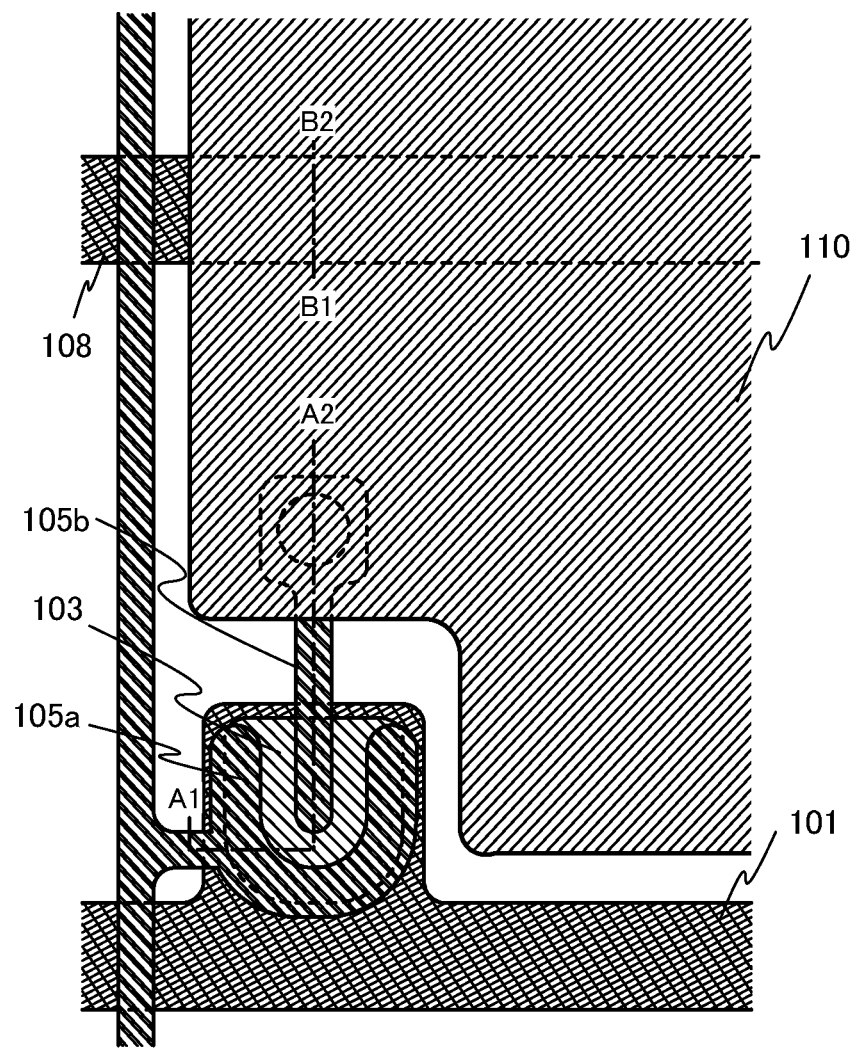
FIG. 14 is a top view of an example of a pixel.

FIG. 15 is a cross-sectional view taken along the lines A1-A2 and B1-B2 in FIG. 14. FIG. 15 illustrates a cross-sectional structure of the second thin film transistor 170 in the pixel portion, a cross-sectional structure of the capacitor portion in the pixel portion, and a cross-sectional structure of the terminal portion.

Figure 16A:
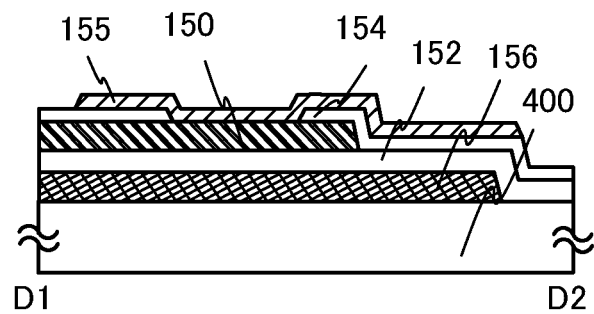
FIGS. 16A and 16B are respectively a top view and a cross-sectional view of an example of a terminal portion.
Figure 16B:
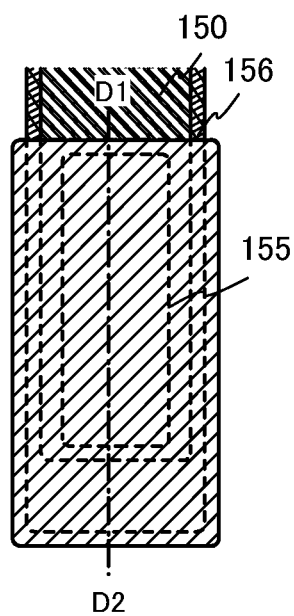

Further, FIGS. 16A and 16B are respectively a cross-sectional view of a source wiring terminal portion and a top view thereof. FIG. 16A is a cross-sectional view taken along the line D1-D2 in FIG. 16B. In FIG. 16A, the transparent conductive film 155 formed over the protective insulating film 154 is a connection terminal electrode which functions as an input terminal. Furthermore, in FIG. 16A, in the terminal portion, an electrode 156 formed from the same material as the gate wiring is located below and overlapped with a second terminal 150, which is electrically connected to the source wiring, with a gate insulating layer 152 interposed therebetween. The electrode 156 is not electrically connected to the second terminal 150. When the electrode 156 is set to, for example, floating, GND, or 0 V such that the potential of the electrode 156 is different from the potential of the second terminal 150, a capacitor for preventing noise or static electricity can be formed. In addition, the second terminal 150 is electrically connected to the transparent conductive film 155 with the protective insulating film 154 interposed therebetween. Note that the protective insulating film 154 is identical to the protective insulating layer 412.

A plurality of gate wirings, source wirings, and capacitor wirings are provided depending on the pixel density. Also in the terminal portion, the first terminal at the same potential as the gate wiring, the second terminal at the same potential as the source wiring, the third terminal at the same potential as the capacitor wiring, and the like are each arranged in plurality. There is no particular limitation on the number of terminals, and the number of terminals may be determined by a practitioner as appropriate.

In the above manner, a driver circuit including the first thin film transistor 420 in which oxide semiconductor layers are stacked, a pixel portion including the second thin film transistor 170 which is a bottom-gate n-channel thin film transistor and the storage capacitor, and a terminal portion can be completed.

When an active matrix liquid crystal display device is manufactured, an active matrix substrate and a counter substrate provided with a counter electrode are fixed to each other with a liquid crystal layer interposed therebetween. Note that a common electrode electrically connected to the counter electrode on the counter substrate is provided over the active matrix substrate, and a terminal electrically connected to the common electrode is provided in the terminal portion. This terminal is provided so that the common electrode is fixed to a predetermined potential such as GND or 0 V.

Figure 17:
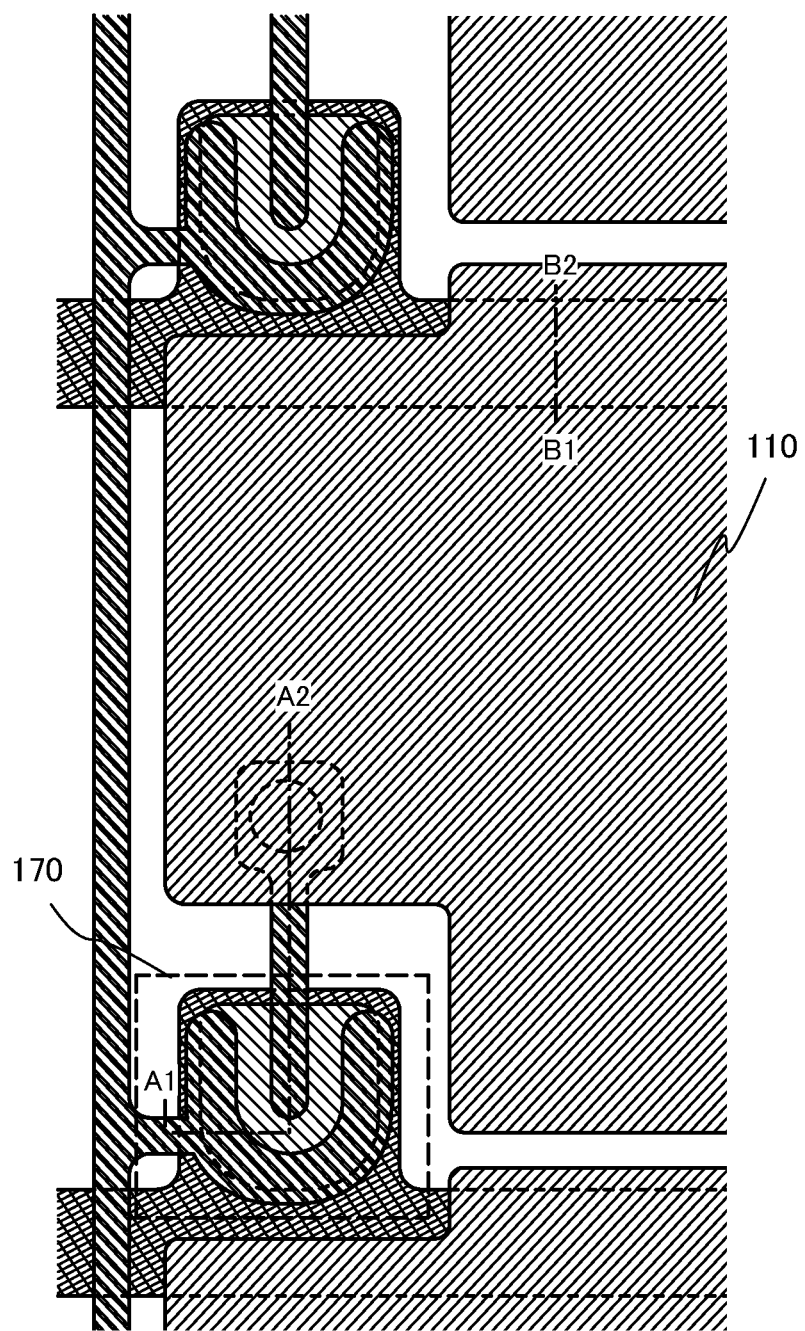
FIG. 17 is a top view of an example of a pixel.

Further, this embodiment is not limited to a pixel structure in FIG. 14, and an example of a top view different from FIG. 14 is illustrated in FIG. 17. FIG. 17 illustrates an example in which a capacitor wiring is not provided and a pixel electrode overlaps with a gate wiring of an adjacent pixel with a protective insulating film and a gate insulating layer interposed therebetween to form a storage capacitor. In this case, the capacitor wiring and the third terminal connected to the capacitor wiring can be omitted. Note that in FIG. 17, portions same as those in FIG. 14 are designated by the same reference numerals.

In an active matrix liquid crystal display device, pixel electrodes arranged in a matrix are driven to form a display pattern on a screen. Specifically, when voltage is applied between a selected pixel electrode and a counter electrode corresponding to the selected pixel electrode, a liquid crystal layer provided between the pixel electrode and the counter electrode is optically modulated, and this optical modulation is recognized as a display pattern by an observer.

In displaying moving images, a liquid crystal display device has a problem that a long response time of liquid crystal molecules causes afterimages or blurring of moving images. In order to improve the moving-image characteristics of a liquid crystal display device, a driving method called black insertion is employed in which black is displayed on the whole screen every other frame period.

Alternatively, a driving method called double-frame rate driving may be employed in which a vertical synchronizing frequency is 1.5 times or more, preferably, 2 times or more as high as a usual vertical synchronizing frequency, whereby the moving-image characteristics are improved.

Further alternatively, in order to improve the moving-image characteristics of a liquid crystal display device, a driving method may be employed in which a plurality of LEDs (light-emitting diodes) or a plurality of EL light sources are used to form a surface light source as a backlight, and each light source of the surface light source is independently driven in a pulsed manner in one frame period. As the surface light source, three or more kinds of LEDs may be used or an LED emitting white light may be used. Since a plurality of LEDs can be controlled independently, the light emission timing of LEDs can be synchronized with the timing at which the liquid crystal layer is optically modulated. According to this driving method, LEDs can be partly turned off; therefore, an effect of reducing power consumption can be obtained particularly in the case of displaying an image having a large black part.

By combining these driving techniques, the display characteristics of a liquid crystal display device, such as moving-image characteristics, can be improved as compared to those of conventional liquid crystal display devices.

The first thin film transistor 420 obtained in this embodiment includes a stack of oxide semiconductor layers having different electrical conductivity and has good dynamic characteristics. Accordingly, those driving techniques can be employed in combination.

In addition, according to this embodiment, a display device having high electrical properties and high reliability can be provided at low costs.

Embodiment 6

Thin film transistors including a stack of oxide semiconductor layers having different electrical conductivity can be manufactured and a liquid crystal display device having a display function can be manufactured using the thin film transistors not only in a driver circuit but also in a pixel portion. Further, part or the whole of the driver circuit using the thin film transistors is formed over the same substrate as the pixel portion, whereby a system-on-panel can be obtained.

The liquid crystal display device includes a liquid crystal element (also referred to as a liquid crystal display element) as a display element.

In addition, the liquid crystal display device includes a panel in which a display element is sealed, and a module in which an IC and the like including a controller are mounted on the panel. This embodiment further relates to one mode of an element substrate before the display element is completed in a process for manufacturing the liquid crystal display device, and the element substrate is provided with a plurality of pixels each having a means for supplying current to the display element. Specifically, the element substrate may be in a state after only a pixel electrode of the display element is formed, a state after a conductive film to be a pixel electrode is formed but before the conductive film is etched to be the pixel electrode, or any other states.

A liquid crystal display device in this specification refers to an image display device, a display device, or a light source (including a lighting device). Further, the liquid crystal display device also includes any of the following modules in its category: a module to which a connector such as a flexible printed circuit (FPC), a tape automated bonding (TAB) tape, or a tape carrier package (TCP) is attached; a module having a TAB tape or a TCP at the end of which a printed wiring board is provided; and a module in which an integrated circuit (IC) is directly mounted on a display element by a chip-on-glass (COG) method.

An appearance and a cross section of a liquid crystal display panel, which is one embodiment of liquid crystal display device, will be described with reference to FIGS. 18A1, 18A2, and 18B. FIGS. 18A1 and 18A2 are top views of panels in which a liquid crystal element 4013 is sealed with a sealant 4005 between a first substrate 4001 and a second substrate 4006. FIG. 18B is a cross-sectional view taken along M-N of FIGS. 18A1 and 18A2.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Thus, the pixel portion 4002 and the scan line driver circuit 4004 as well as a liquid crystal layer 4008 are sealed with the sealant 4005 between the first substrate 4001 and the second substrate 4006. A blue-phase liquid crystal material is used for the liquid crystal layer 4008 in this embodiment without particular limitation. A liquid crystal material exhibiting a blue phase has a short response time of 1 millisecond or less from the state of applying no voltage to the state of applying voltage, whereby short-time response is possible. A blue-phase liquid crystal material includes liquid crystal and a chiral agent. The chiral agent is employed to align the liquid crystal in a helical structure and to make the liquid crystal exhibit a blue phase. For example, a liquid crystal material into which a chiral agent is mixed at 5 wt % or more may be used for the liquid crystal layer. As a liquid crystal, a thermotropic liquid crystal, a low molecular liquid crystal, a high molecular liquid crystal, a ferroelectric liquid crystal, an anti-ferroelectric liquid crystal, or the like is used.

In FIG. 18A1, a signal line driver circuit 4003 that is formed using a single crystal semiconductor film or a polycrystalline semiconductor film over a substrate separately prepared is mounted in a region that is different from the region surrounded by the sealant 4005 over the first substrate 4001. In contrast, FIG. 18A2 illustrates an example in which part of a signal line driver circuit is formed over the first substrate 4001 with use of a thin film transistor including a stack of oxide semiconductor layers having different electrical conductivity. In FIG. 18A2, a signal line driver circuit 4003$b$ is formed over the first substrate 4001 and a signal line driver circuit 4003$a$ that is formed using a single crystal semiconductor film or a polycrystalline semiconductor film over the substrate separately prepared is mounted on the first substrate 4001.

Note that there is no particular limitation on a connection method of the driver circuit which is separately formed, and a COG method, a wire bonding method, a TAB method, or the like can be used. FIG. 18A1 illustrates an example in which the signal line driver circuit 4003 is mounted by a COG method and FIG. 18A2 illustrates an example in which the signal line driver circuit 4003 is mounted by a TAB method.

Each of the pixel portion 4002 and the scan line driver circuit 4004 which are provided over the first substrate 4001 includes a plurality of thin film transistors. FIG. 18B illustrates a thin film transistor 4010 included in the pixel portion 4002 and the thin film transistor 4011 included in the scan line driver circuit 4004. An insulating layer 4020 and an interlayer film 4021 are provided over the thin film transistors 4010 and 4011. As the thin film transistor 4010, the first thin film transistor described in Embodiment 1 which includes a stack of oxide semiconductor layers having different electrical conductivity as its semiconductor layer is employed. As the thin film transistor 4011, the second thin film transistor described in Embodiment 1 which includes a single layer of an In—Ga—Zn—O-based non-single-crystal film is employed. In this embodiment, the thin film transistors 4010 and 4011 are n-channel thin film transistors.

In addition, a pixel electrode layer 4030 and a common electrode layer 4031 are provided over the first substrate 4001. The pixel electrode layer 4030 is electrically connected to the thin film transistor 4010. The liquid crystal element 4013 includes the pixel electrode layer 4030, the common electrode layer 4031, and the liquid crystal layer 4008. In this embodiment, a method is used in which grayscale is controlled by generating an electric field which is substantially parallel to a substrate (i.e., in a lateral direction) to move liquid crystal molecules in a plane parallel to the substrate. In such a method, an electrode structure used in an in plane switching (IPS) mode or a fringe field switching (FFS) mode can be used. Note that polarizing plates 4032 and 4033 are provided on outer sides of the first substrate 4001 and the second substrate 4006, respectively.

As the first substrate 4001 and the second substrate 4006, glass, plastic, or the like having a light-transmitting property can be used. As plastic, a fiberglass-reinforced plastics (FRP) plate, a polyvinyl fluoride (PVF) film, a polyester film, or an acrylic resin film can be used. Alternatively, a sheet in which aluminum foil is sandwiched by PVF films or polyester films can be used.

Reference numeral 4035 denotes a columnar spacer obtained by selective etching of an insulating film and is provided in order to control the thickness (a cell gap) of the liquid crystal layer 4008. Note that a spherical spacer may be used.

FIGS. 18A1, 18A2, and 18B illustrate examples of liquid crystal display devices in which a polarizing plate is provided on the outer side (the view side) of a substrate; however, the polarizing plate may be provided on the inner side of the substrate. The position of the polarizing plate may be determined as appropriate depending on the material of the polarizing plate and conditions of the manufacturing process. Further, a light-blocking layer serving as a black matrix may be provided.

The interlayer film 4021 is a light-transmitting resin layer. Part of the interlayer film 4021 is a light-blocking layer 4012. The light-blocking layer 4012 covers the thin film transistors 4010 and 4011. In FIG. 18B, a light-blocking layer 4034 is provided on the second substrate 4006 to overlap with the thin film transistors 4010 and 4011. By the light-blocking layer 4012 and the light-blocking layer 4034, further improvement in contrast and in stabilization of the thin film transistors can be achieved.

When the light-blocking layer 4034 is provided, the intensity of incident light on the semiconductor layers of the thin film transistors can be attenuated. Accordingly, electric characteristics of the thin film transistors can be stabilized and prevented from being varied due to photosensitivity of the oxide semiconductor.

The thin film transistors may be covered with the insulating layer 4020 which serves as a protective film of the thin film transistors; however, there is no particular limitation to such a structure.

Note that the protective film is provided to prevent entry of impurities floating in air, such as an organic substance, a metal substance, or moisture, and is preferably a dense film. The protective film may be formed using a single layer or a stack of layers of a silicon oxide film, a silicon nitride film, a silicon oxynitride film, a silicon nitride oxide film, an aluminum oxide film, an aluminum nitride film, an aluminum oxynitride film, or an aluminum nitride oxide film by a sputtering method.

Further, in the case of forming another light-transmitting insulating layer as a planarizing insulating film, the light-transmitting insulating layer can be formed from an organic material having heat resistance, such as polyimide, acrylic, benzocyclobutene, polyamide, or epoxy. As an alternative to such organic materials, it is possible to use a low-dielectric constant material (a low-k material), a siloxane-based resin, phosphosilicate glass (PSG), borophosphosilicate glass (BPSG), or the like. Note that the insulating layer may be formed by stacking a plurality of insulating films formed of any of these materials.

The method for the formation of the stacked insulating layers is not limited to a particular method and the following method can be used depending on the material: a sputtering method, an SOG method, spin coating, dip coating, spray coating, a droplet discharging method (e.g., an ink jetting method, screen printing, or offset printing), a doctor knife, a roll coater, a curtain coater, a knife coater, or the like. In the case of forming the insulating layers with the use of a material solution, the semiconductor layer may be annealed (at 200° C. to 400° C.) at the same time of a baking step. When the baking step of the insulating layers and the annealing of the semiconductor layer are combined, a liquid crystal display device can be manufactured efficiently.

The pixel electrode layer 4030 and the common electrode layer 4031 can be formed from a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

A conductive composition containing a conductive high molecule (also referred to as a conductive polymer) can also be used for the pixel electrode layer 4030 and the common electrode layer 4031.

In addition, a variety of signals and potentials are supplied to the signal line driver circuit 4003 which is formed separately, the scan line driver circuit 4004, or the pixel portion 4002 from an FPC 4018.

Further, since the thin film transistor is easily broken by static electricity and the like, a protective circuit for protecting the driver circuits is preferably provided over the same substrate for a gate line or a source line. The protective circuit is preferably formed using a nonlinear element in which an oxide semiconductor is used.

In FIGS. 18A1, 18A2, and 18B, a connecting terminal electrode 4015 is formed using the same conductive film as that of the pixel electrode layer 4030, and a terminal electrode 4016 is formed using the same conductive film as that of source and drain electrode layers of the thin film transistors 4010 and 4011.

The connection terminal electrode 4015 is electrically connected to a terminal included in the FPC 4018 through an anisotropic conductive film 4019.

FIGS. 18A1, 18A2, and 18B illustrate an example in which the signal line driver circuit 4003 is formed separately and mounted on the first substrate 4001 without limitation. The scan line driver circuit may be formed separately and then mounted, or only part of the signal line driver circuit or part of the scan line driver circuit may be formed separately and then mounted.

Figure 19:
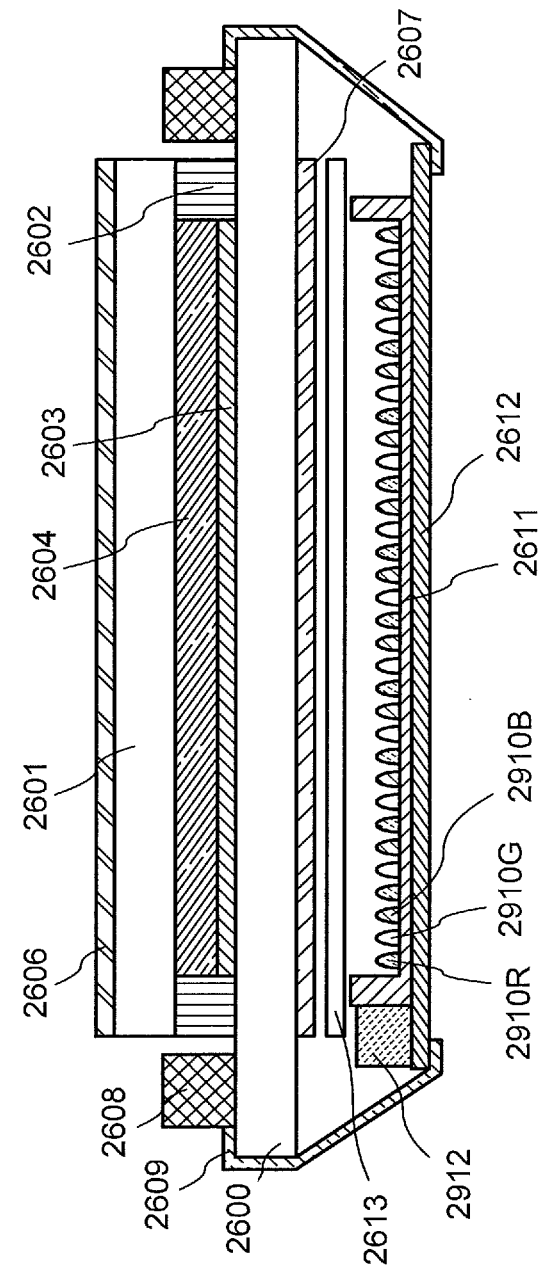
FIG. 19 is a cross-sectional view of an example of a semiconductor device.

FIG. 19 illustrates an example of a cross-sectional structure of a liquid crystal display device in which an element substrate 2600 and a counter substrate 2601 are attached to each other with a sealant 2602, and an element layer 2603 including a TFT or the like and a liquid crystal layer 2604 are provided between the substrates.

In the case where color display is performed, light-emitting diodes which emit light of plural colors are arranged in a backlight portion. In the case of an RGB mode, a red light-emitting diode 2910R, a green light-emitting diode 2910G, and a blue light-emitting diode 2910B are disposed in each of the regions into which a display area of the liquid crystal display device is divided.

A polarizing plate 2606 is provided on the outer side of the counter substrate 2601, and a polarizing plate 2607 and an optical sheet 2613 are provided on the outer side of the element substrate 2600. A light source is formed using the red light-emitting diode 2910R, the green light-emitting diode 2910G, the blue light-emitting diode 2910B, and a reflective plate 2611. An LED control circuit 2912 provided for a circuit substrate 2612 is connected to a wiring circuit portion 2608 of the element substrate 2600 through a flexible wiring board 2609 and further includes an external circuit such as a control circuit or a power source circuit.

This embodiment describes a field-sequential liquid crystal display device in which the LEDs are individually made to emit light by this LED control circuit 2912 without particular limitation. It is also possible to use a cold cathode fluorescent lamp or a white LED as a light source of the backlight and to provide a color filter.

Further, this embodiment employs an electrode structure used in an in plane switching (IPS) mode without particular limitation. A twisted nematic (TN) mode, a multi-domain vertical alignment (MVA) mode, a patterned vertical alignment (PVA) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

This embodiment can be implemented in appropriate combination with any of the structures described in the other embodiments.

Embodiment 7

In this embodiment, an example in which exposure using a multi-tone mask is performed in order to reduce the number of masks is described. Note that a multi-tone mask can perform three levels of light exposure to obtain an exposed portion, a half-exposed portion, and an unexposed portion. Light has a plurality of intensities after passing through a multi-tone mask. One-time light exposure and development process with a multi-tone mask can form a resist mask with regions of plural thicknesses (typically, two kinds of thicknesses). Accordingly, by using a multi-tone mask, the number of photomasks can be reduced.

As typical examples of a multi-tone mask, there are a gray-tone mask, a half-tone mask, and the like.

A gray-tone mask includes a substrate having a light-transmitting property, and a light-blocking portion and a diffraction grating which are formed thereover. The light transmittance of the light-blocking portion is 0%. On the other hand, the diffraction grating has a light-transmitting portion in a slit form, a dot form, a mesh form, or the like with intervals which are equal to or less than the resolution limit of light used for the light exposure; thus, light transmittance can be controlled. The diffraction grating can have regularly-arranged slits, dots, or meshes, or irregularly-arranged slits, dots, or meshes.

A half-tone mask includes a substrate having a light-transmitting property, and a semi-light-transmitting portion and a light-blocking portion which are formed thereover. The semi-light-transmitting portion can be formed using MoSiN, MoSi, MoSiO, MoSiON, CrSi, or the like. The light-blocking portion can be formed using a light-blocking material which absorbs light, such as chromium or chromium oxide. When the half-tone mask is irradiated with light for exposure, the light transmittance of the light-blocking portion is 0% and the light transmittance of a region where the light-blocking portion and the semi-light-transmitting portion are not provided is 100%. The light transmittance of the semi-light-transmitting portion can be controlled in the range of from 10% to 70%. The light transmittance of the semi-light-transmitting portion can be controlled by controlling a material used for the semi-light-transmitting portion.

FIGS. 20A to 20E are cross-sectional views of a manufacturing process of a thin film transistor 360.

Figure 20A:
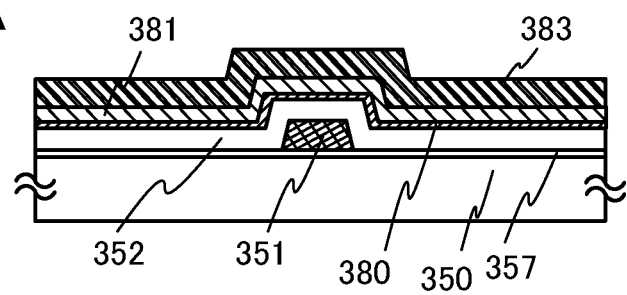
FIGS. 20A to 20E are cross-sectional views of an example of a manufacturing process of a semiconductor device.

In FIG. 20A, a gate electrode layer 351 is formed over a substrate 350 on which an insulating film 357 is formed. In this embodiment, a silicon oxide film (having a thickness of 100 nm) is used as the insulating film 357. A gate insulating layer 352, a metal thin film 380, an oxide semiconductor film 381, and a conductive film 383 are stacked in that order over the gate electrode layer 351. In this embodiment, as the metal thin film 380, a stack of a 3-nm-thick indium film formed by a sputtering method and a 3-nm-thick zinc film formed by a sputtering method is employed.

A mask 384 is formed over the gate insulating layer 352, the metal thin film 380, the oxide semiconductor film 381, and the conductive film 383.

In this embodiment, an example in which light exposure using a multi-tone (high-tone) mask is performed for forming the mask 384 is described.

Figure 20B:
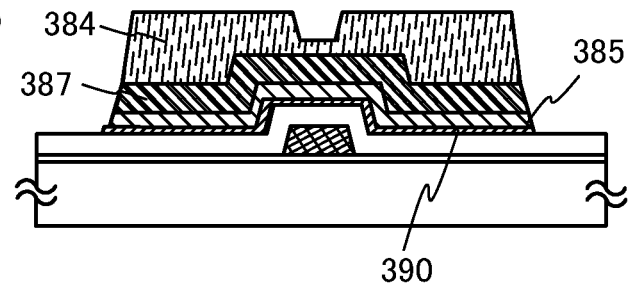
Figure 20C:
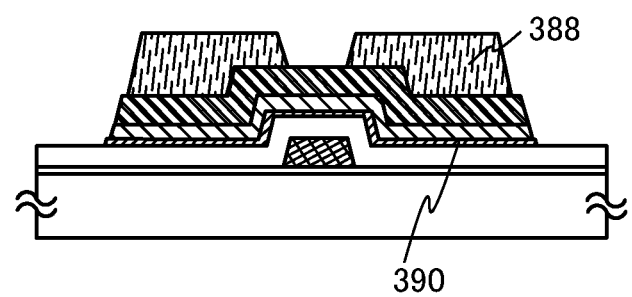

The light exposure is performed using the multi-tone mask through which light is transmitted so as to have a plurality of intensities, and then development is performed, whereby the mask 384 having regions with different thicknesses can be formed as illustrated in FIG. 20B. By using a multi-tone mask, the number of light-exposure masks can be reduced.

Next, a first etching step is performed using the mask 384 to etch the metal thin film 380, the oxide semiconductor film 381, and the conductive film 383 into island shapes. As a result, a metal thin film 390, an oxide semiconductor layer 385 and a conductive layer 387 which are patterned can be formed (see FIG. 20B).

Then, the resist mask 384 is subjected to ashing. As a result, the area and thickness of the mask are reduced. At this time, a region of the mask with a smaller thickness (a region overlapping with a part of the gate electrode layer 351) is removed and masks 388 which are separated from each other can be formed (see FIG. 20C).

Figure 20D:
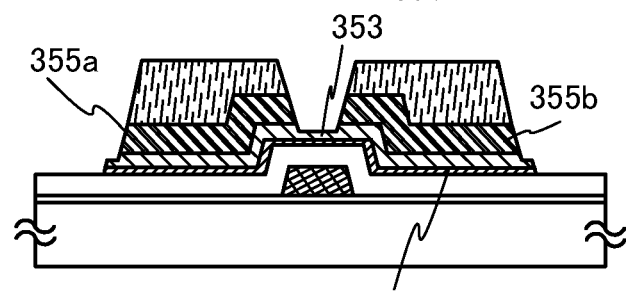

A second etching step is performed using the masks 388; whereby the oxide semiconductor layer 385 and the conductive layer 387 are etched into a semiconductor layer 353 and source and drain electrode layers 355a and 355b (see FIG. 20D). Note that the semiconductor layer 353 is a partly etched semiconductor layer having a groove (depression) and having an end portion which is partly etched and exposed.

When the etching is performed using a chlorine-based gas ($Cl_2$) to which an oxygen gas ($O_2$) is added (preferably at 15% or higher), in the case of using a silicon oxynitride film as the gate insulating layer 352, the selectivity of the In—Ga—Zn—O-based non-single-crystal film of the oxide semiconductor layer 385 with respect to the gate insulating layer 352 can be increased. Therefore, only the oxide semiconductor film 381 can be selectively etched.

When the oxide semiconductor film 381 and the conductive film 383 are dry-etched in the first etching step, the oxide semiconductor film 381 and the conductive film 383 are etched anisotropically. In this manner, the end portion of the mask 384 is aligned with end portions of the oxide semiconductor layer 385 and the conductive layer 387, and these end portions become continuous.

In a manner similar to the above, when the oxide semiconductor layer 385 and the conductive layer 387 are dry-etched in the second etching step, the oxide semiconductor layer 385 and the conductive layer 387 are etched anisotropically. In this manner, the end portions of the masks 388 are aligned with end portions and side surfaces of the depression of the semiconductor layer 353 and end portions of the source and drain electrode layers 355a and 355b to become continuous.

In this embodiment, the semiconductor layer 353 and the source and drain electrode layers 355a and 355b have the same tapered angle at the respective end portions and are stacked so that the end portions are continuous. However, since the etching rates of these layers change depending on the etching conditions or materials for the oxide semiconductor layer and the conductive layer, the tapered angles are different and the end portions are not continuous in some cases.

Then, the mask 388 is removed.

Figure 20E:
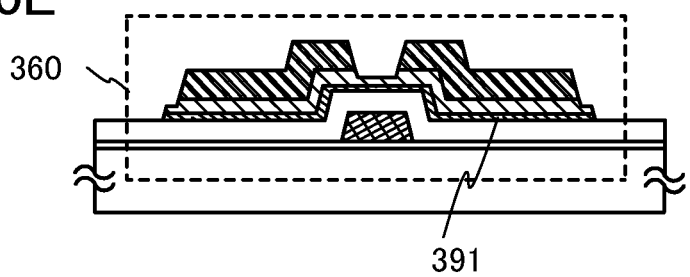

Then, heat treatment is performed in an atmosphere containing oxygen at 200° C. to 600° C. to oxidize the metal thin film 390; thus, a first oxide semiconductor layer 391 is formed (see FIG. 20E). In this embodiment, the first oxide semiconductor layer 391 is a mixed layer of indium oxide and zinc oxide.

Through the above steps, an inverted staggered thin film transistor 360 including a stack of the first oxide semiconductor layer 391 and the overlaying semiconductor layer 353, which is a second oxide semiconductor layer, can be manufactured.

The use of a resist mask having regions of plural thicknesses (typically, two kinds of thicknesses) formed with use of a multi-tone mask as in this embodiment enables the number of resist masks to be reduced; therefore, the process can be simplified and cost can be reduced. Accordingly, a highly reliable semiconductor device can be manufactured at a low cost with high productivity.

In this embodiment, an example is described in which both the thin film transistor in the driver circuit and the thin film transistor in the pixel portion are inverted staggered thin film transistors 360 including a stack of the first oxide semiconductor layer 391 and the overlaying semiconductor layer 353, which is the second oxide semiconductor layer. In other words, this embodiment describes an example in which substantially the same structure is employed for the thin film transistors in the driver circuit and in the pixel portion, and the manufacturing method does not differ between the circuits.

This embodiment can be implemented in appropriate combination with any of the structures described in the other embodiments.

Embodiment 8

Different from the example of a bottom-gate structure described in Embodiment 1 or Embodiment 2, an example of a bottom-contact structure (also referred to as an inverted-coplanar structure) will be described in this embodiment below with reference to FIGS. 21A to 21C.

Figure 21A:
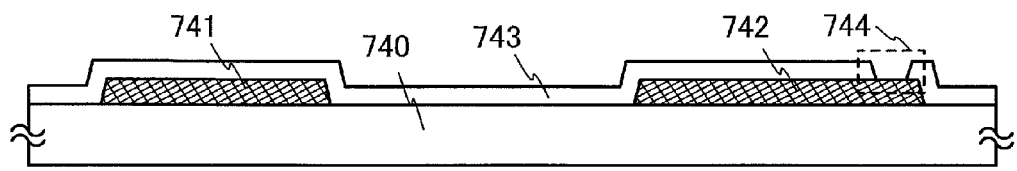
FIGS. 21A to 21C are cross-sectional views of an example of a manufacturing process of a semiconductor device.
Figure 21B:
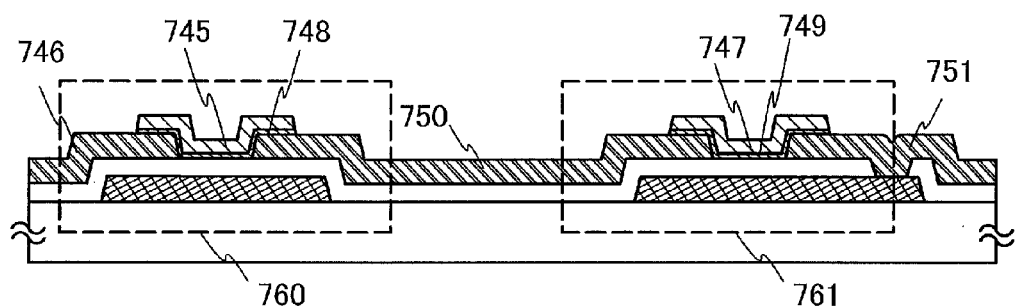
Figure 21C:
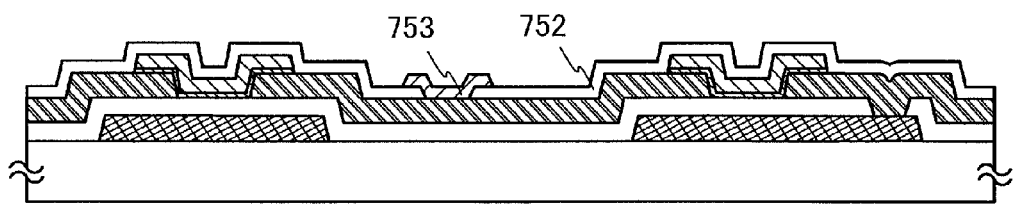

An example of a manufacturing process of an inverter circuit is illustrated in FIGS. 21A to 21C.

A first conductive film is formed over a substrate 740 by a sputtering method and the first conductive film is etched as selected using a first photomask to form a first gate electrode 741 and a second gate electrode 742. Next, a gate insulating layer 743 covering the first gate electrode 741 and the second gate electrode 742 is formed by a plasma CVD method or a sputtering method. The gate insulating layer 743 can be formed to have a single layer or a stack of a silicon oxide layer, a silicon nitride layer, a silicon oxynitride layer, or a silicon nitride oxide layer by a CVD method, a sputtering method, or the like. Alternatively, the gate insulating layer 743 can be formed of a silicon oxide layer by a CVD method using an organosilane gas.

Next, the gate insulating layer 743 is etched as selected using a second photomask to form a contact hole 744 that reaches the second gate electrode 742. A cross-sectional view of the steps so far corresponds to FIG. 21A.

Then, a second conductive film is formed by a sputtering method and the second conductive film is etched as selected using a third photomask to form a first wiring 746, a second wiring 750, and a third wiring 751. The third wiring 751 is directly in contact with the second gate electrode 742 through the contact hole 744.

Next, a stack of a metal thin film and an oxide semiconductor film is formed by a sputtering method. Note that reverse sputtering in which plasma is generated after introduction of an argon gas is preferably performed to remove dust attached to a surface of the gate insulating layer 743 and the bottom surface of the contact hole 744 before the metal thin film is formed by a sputtering method. The reverse sputtering refers to a method in which, without application of voltage to a target side, an RF power source is used for application of voltage to a substrate side in an argon atmosphere to modify a surface. Note that nitrogen, helium, or the like may be used instead of an argon atmosphere. Alternatively, the reverse sputtering may be performed in an argon atmosphere to which oxygen, hydrogen, $N_2O$, or the like is added. Further alternatively, the reverse sputtering may be performed in an argon atmosphere to which $Cl_2$, $CF_4$, or the like is added.

Next, the metal thin film and the oxide semiconductor film are etched as selected using the fourth photomask.

Next, heat treatment is performed at 200° C. to 600° C. in air or a nitrogen atmosphere. By the heat treatment, the metal thin film is oxidized to be a first oxide semiconductor layer 748 and a third oxide semiconductor layer 749. After the heat treatment, the second oxide semiconductor layer 745 is formed over the first oxide semiconductor layer 748, whereby a first thin film transistor 760 is formed. Note that the electrical conductivity of the first oxide semiconductor layer 748 is different from that of the second oxide semiconductor layer 745. The electrical conductivity of the first oxide semiconductor layer 748 is higher, which contributes to an improvement in electrical field mobility of the first thin film transistor 760. Similarly, a fourth oxide semiconductor layer 747 is formed over the third oxide semiconductor layer 749, whereby a second thin film transistor 761 is formed. Note that the timing of this heat treatment is not particularly limited and the heat treatment may be performed anytime after the formation of the second oxide semiconductor film. For example, if the heat treatment is performed before etching using the fourth photomask to oxidize the metal thin film and form the first oxide semiconductor film, the stack of the oxide semiconductor films is etched in the following etching using the fourth photomask; thus, etching with reduced etching residue can be performed.

Next, a protective layer 752 is formed and the protective layer 752 is etched as selected using a fifth photomask to form a contact hole. After that, a third conductive film is formed. Lastly, the third conductive film is etched as selected using a sixth photomask to form a connection wiring 753 that is electrically connected to the second wiring 750. A cross-sectional view of the steps so far corresponds to FIG. 21C.

Note that the order of the steps described above is merely an example and there is no limitation. For example, although the number of photomasks increases by one, etching of the metal thin film and etching of part of the oxide semiconductor film may be separately performed using different photomasks.

Further, it is also possible to form an In—Ga—Zn—O—N-based non-single-crystal film by a sputtering method over the second conductive film and then pattern the In—Ga—Zn—O—N-based non-single-crystal film so as to serve as n$^+$-type layers between second oxide semiconductor layer 745 and the first wiring 746 and the second wiring 750, and n$^+$-type layers between the fourth oxide semiconductor layer 747 and the second wiring 750 and the third wiring 751. In that case, In—Ga—Zn—O—N-based non-single-crystal films are provided in a region overlapping with the first wiring 746 and the second oxide semiconductor layer 745, a region overlapping with the second wiring 750 and the second oxide semiconductor layer 745, a region overlapping with the second wiring 750 and the fourth oxide semiconductor layer 747, and a region overlapping with the third wiring 751 and the fourth oxide semiconductor layer 747.

This embodiment can be implemented in appropriate combination with any of the structures described in the other embodiments.

Embodiment 9

In this embodiment, an example of an electronic paper will be described as a semiconductor device.

Figure 22A:
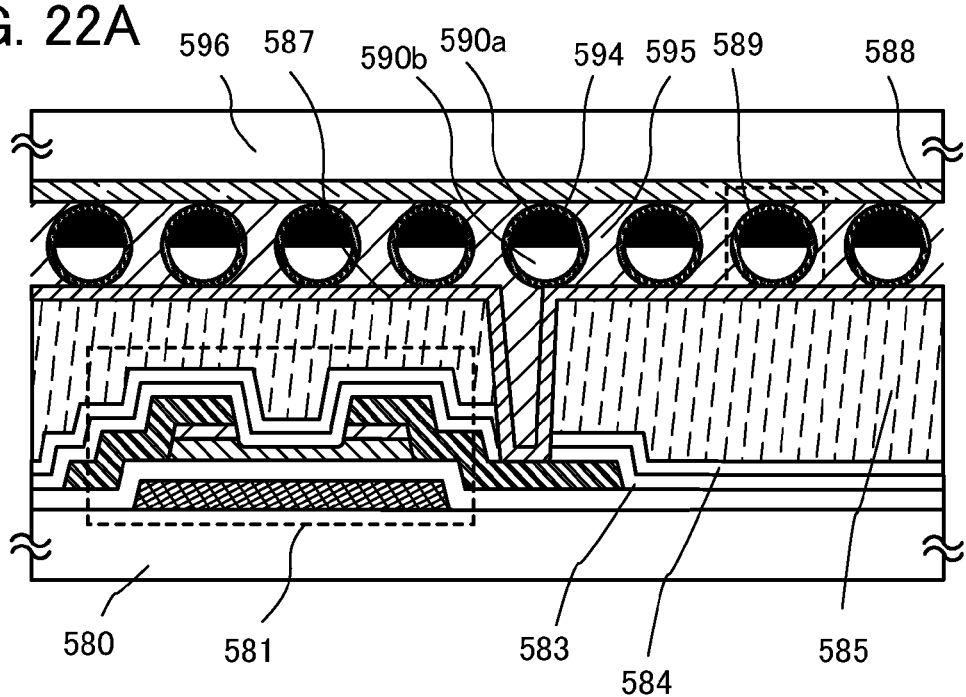
FIGS. 22A and 22B are respectively a cross-sectional view and an external view of an electronic appliance which are examples of semiconductor devices.

FIG. 22A is a cross-sectional view illustrating an active matrix electronic paper. A thin film transistor 581 used for a display portion of this semiconductor device can be manufactured in a manner similar to that of the second thin film transistor described in Embodiment 1. The thin film transistor 581 includes an oxide semiconductor film as its semiconductor layer and has high electrical characteristics. In this embodiment, a thin film transistor including a Zn—O—Si-based oxide semiconductor as its semiconductor layer and having high electrical characteristics is used. Further, a driver circuit which includes a thin film transistor including a Zn—O—Si-based oxide semiconductor as its semiconductor layer and having high electrical characteristics may optionally be provided over the same substrate. Further, it is also possible to use the first thin film transistor in Embodiment 1 which has a stack of oxide semiconductor layers as the thin film transistor 581 in this embodiment.

The electronic paper of FIG. 22A is an example of a display device in which a twisting ball display system is employed. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 sealed between a substrate 580 and a substrate 596 is a thin film transistor with a bottom-gate structure, and a source or drain electrode layer thereof is in contact with a first electrode layer 587 through an opening formed in insulating layers 583, 584, and 585, whereby the thin film transistor 581 is electrically connected to the first electrode layer 587. Between the first electrode layer 587 and a second electrode layer 588, spherical particles 589 each having a black region 590a, a white region 590b, and a cavity 594 around the regions which is filled with liquid are provided. A space around the spherical particles 589 is filled with a filler 595 such as a resin (see FIG. 22A). In this embodiment, the first electrode layer 587 corresponds to a pixel electrode, and the second electrode layer 588 corresponds to a common electrode. The second electrode layer 588 is electrically connected to a common potential line provided over the same substrate as the thin film transistor 581. With the use of a common connection portion, the second electrode layer 588 can be electrically connected to the common potential line through conductive particles provided between a pair of substrates.

Instead of the twisting ball, an electrophoretic element can be used. A microcapsule having a diameter of about 10 μm to 200 μm in which transparent liquid, positively-charged white microparticles, and negatively-charged black microparticles are encapsulated is used. In the microcapsules which are provided between the first electrode layer and the second electrode layer, when an electric field is applied between the first electrode layer and the second electrode layer, the white microparticles and the black microparticles move to opposite sides from each other, so that white or black can be displayed. A display element using this principle is an electrophoretic display element and is called an electronic paper. The electrophoretic display element has higher reflectance than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

By manufacturing the thin film transistor in the process described in Embodiment 1, an electronic paper can be manufactured as a semiconductor device at low cost. An electronic paper can be used for electronic appliances of a variety of fields for displaying information. For example, an electronic paper can be used for an electronic book reader (an e-book reader), posters, advertisement in vehicles such as trains, or displays of various cards such as credit cards. Examples of such electronic appliances are illustrated in FIG. 22B.

Figure 22B:
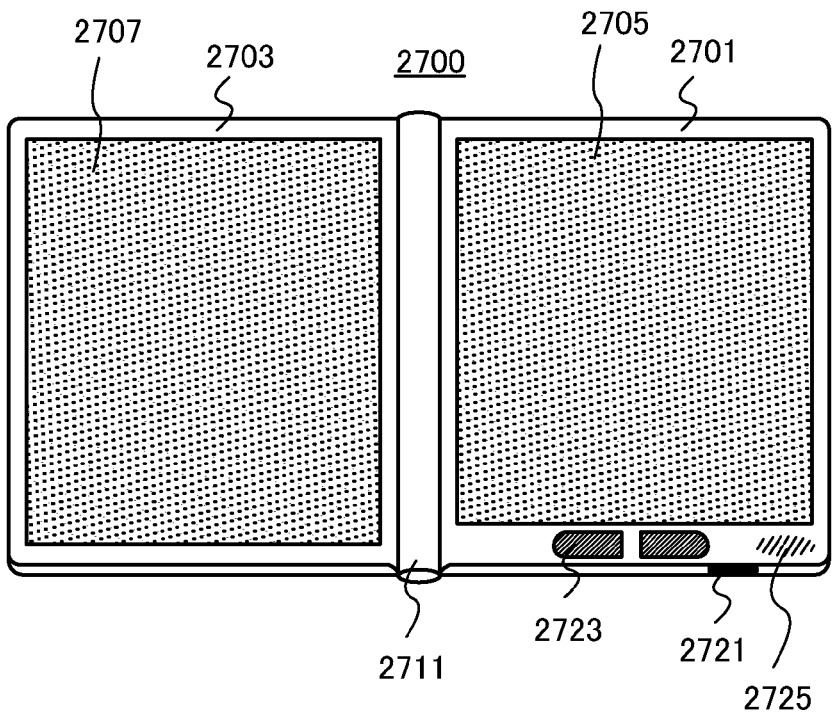

FIG. 22B illustrates an example of an electronic book reader 2700. For example, the electronic book reader 2700 includes two housings 2701 and 2703. The housings 2701 and 2703 are combined with a hinge 2711 so that the electronic book reader 2700 can be opened and closed along the hinge 2711. With such a structure, the electronic book reader 2700 can be handled like a paper book.

A display portion 2705 is incorporated in the housing 2701 and a display portion 2707 is incorporated in the housing 2703. The display portion 2705 and the display portion 2707 may display one image, or may display different images. In the structure where different images are displayed on the display portion 2705 and the display portion 2707, for example, the right display portion (the display portion 2705 in FIG. 22B) can display text and the left display portion (the display portion 2707 in FIG. 22B) can display images.

FIG. 22B illustrates an example in which the housing 2701 is provided with an operation portion and the like. For example, the housing 2701 is provided with a power supply switch 2721, an operation key 2723, a speaker 2725, and the like. The page can be turned with the operation key 2723. Note that a keyboard, a pointing device, and the like may be provided on the same plane as the display portion of the housing. Further, a rear surface or a side surface of the housing may be provided with an external connection terminal (an earphone terminal, a USB terminal, a terminal which can be connected with a variety of cables such as an AC adapter or a USB cable, and the like), a storage medium inserting portion, or the like. Moreover, the electronic book reader 2700 may have a function of an electronic dictionary.

Further, the electronic book reader 2700 may send and receive information wirelessly. Desired book data or the like can be purchased and downloaded from an electronic book server wirelessly.

This embodiment can be implemented in appropriate combination with any of the structures described in the other embodiments.

Embodiment 10

A semiconductor device which has a thin film transistor including an oxide semiconductor layer can be applied to a variety of electronic appliances (including game machines). Examples of electronic appliances are a television set (also referred to as a television or a television receiver), a monitor of a computer or the like, a camera such as a digital camera or a digital video camera, a digital photo frame, a cellular phone (also referred to as a mobile phone or a mobile phone set), a portable game console, a portable information terminal, an audio playback device, a large-sized game machine such as a pachinko machine, and the like.

FIG. 23A illustrates an example of a television device 9600. A display portion 9603 is incorporated in a housing 9601 of the television device 9600. The display portion 9603 can display images. Here, the back of the housing 9601 is supported so that the television device 9600 is fixed to a wall.

The television device 9600 can be operated with an operation switch of the housing 9601 or a separate remote control 9610. The channel and volume can be controlled with operation keys 9609 of the remote control 9610 and images displayed on the display portion 9603 can be controlled. Moreover, the remote control 9610 may have a display portion 9607 on which the information outgoing from the remote control 9610 is displayed.

Note that the television device 9600 is provided with a receiver, a modem, and the like. With the receiver, general television broadcasting can be received. Moreover, when the display device is connected to a communication network with or without wires via the modem, one-way (from a sender to a receiver) or two-way (e.g., between a sender and a receiver or between receivers) information communication can be performed.

FIG. 23B illustrates a portable game console including a housing 9881 and a housing 9891 which are jointed with a connector 9893 so as to be opened and closed. A display portion 9882 and a display portion 9883 are incorporated in the housing 9881 and the housing 9891, respectively. The portable game console illustrated in FIG. 23B additionally includes a speaker portion 9884, a storage medium inserting portion 9886, an LED lamp 9890, an input means (operation keys 9885, a connection terminal 9887, a sensor 9888 (having a function of measuring force, displacement, position, speed, acceleration, angular speed, rotational frequency, distance, light, liquid, magnetism, temperature, chemical substance, sound, time, hardness, electric field, current, voltage, electric power, radiation, flow rate, humidity, gradient, vibration, smell, or infrared ray), and a microphone 9889), and the like. Needless to say, the structure of the portable game console is not limited to the above, and may be any structure which is provided with at least a semiconductor device. The portable game console may include other accessory equipment as appropriate. The portable game console illustrated in FIG. 23B has a function of reading a program or data stored in a storage medium to display it on the display portion, and a function of sharing information with another portable game console via wireless communication. The portable game console of FIG. 23B can have a variety of functions other than those above.

Figure 24A:
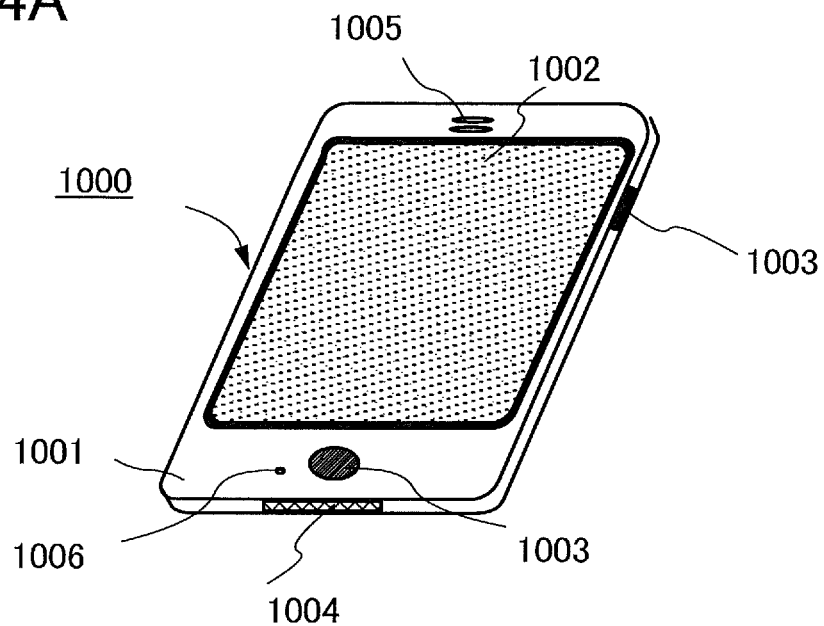
FIGS. 24A and 24B are examples of electronic appliances.

FIG. 24A illustrates an example of a cellular phone 1000. The cellular phone 1000 includes a housing 1001 in which a display portion 1002 is incorporated, an operation button 1003, an external connection port 1004, a speaker 1005, a microphone 1006, and the like.

Information can be input to the cellular phone 1000 illustrated in FIG. 24A by touching the display portion 1002 with a finger or the like. Moreover, users can make a call or write an e-mail by touching the display portion 1002 with their fingers or the like.

There are mainly three screen modes of the display portion 1002. The first mode is a display mode mainly for displaying images. The second mode is an input mode mainly for inputting information such as text. The third mode is a display-and-input mode in which two modes of the display mode and the input mode are mixed.

For example, in the case of making a call or writing an e-mail, the display portion 1002 is set to a text input mode mainly for inputting text, and characters displayed on a screen can be input. In this case, it is preferable to display a keyboard or number buttons on almost the entire screen of the display portion 1002.

When a detection device including a sensor for detecting inclination, such as a gyroscope or an acceleration sensor, is provided inside the cellular phone 1000, display on the screen of the display portion 1002 can be automatically switched by detecting the direction of the cellular phone 1000 (whether the cellular phone 1000 is placed horizontally or vertically for a landscape mode or a portrait mode).

Further, the screen modes are switched by touching the display portion 1002 or operating the operation button 1003 of the housing 1001. Alternatively, the screen modes can be switched depending on kinds of images displayed on the display portion 1002. For example, when a signal for an image displayed on the display portion is data of moving images, the screen mode is switched to the display mode. When the signal is text data, the screen mode is switched to the input mode.

Further, in the input mode, a signal is detected by an optical sensor in the display portion 1002 and if input by touching the display portion 1002 is not performed for a certain period, the screen mode may be controlled so as to be switched from the input mode to the display mode.

The display portion 1002 can also function as an image sensor. For example, an image of a palm print, a fingerprint, or the like is taken by touching the display portion 1002 with the palm or the finger, whereby personal authentication can be performed. Moreover, when a backlight or sensing light source which emits near-infrared light is provided in the display portion, an image of finger veins, palm veins, or the like can be taken.

Figure 24B:
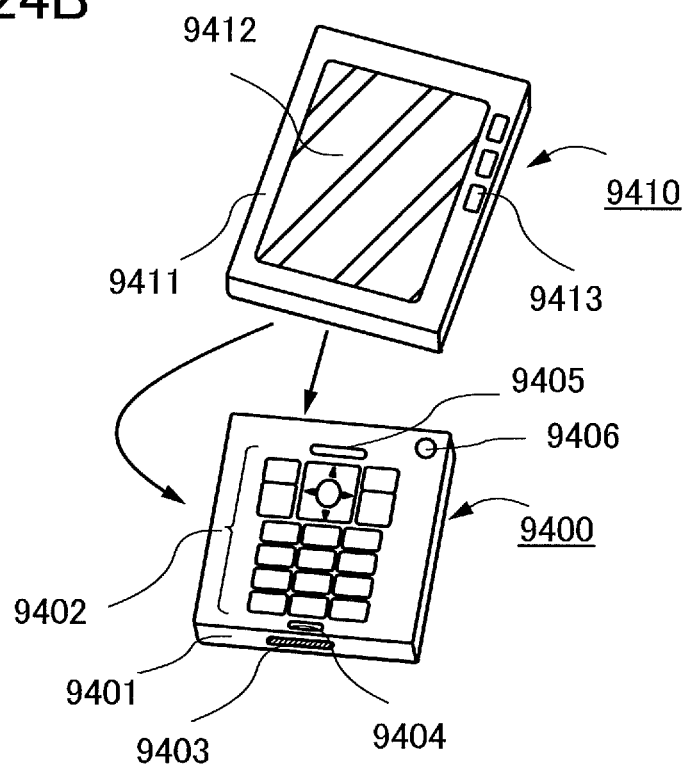

FIG. 24B illustrates another example of a cellular phone. The cellular phone in FIG. 24B has a display device 9410 provided with a housing 9411 including a display portion 9412 and operation buttons 9413, and a communication device 9400 provided with a housing 9401 including operation buttons 9402, an external input terminal 9403, a microphone 9404, a speaker 9405, and a light-emitting portion 9406 that emits light when a phone call is received. The display device 9410 which has a display function can be detachably attached to the communication device 9400 which has a phone function in two directions represented by the arrows. Thus, the display device 9410 and the communication device 9400 can be attached to each other along their short sides or long sides. In addition, when only the display function is needed, the display device 9410 can be detached from the communication device 9400 and used alone. Images or input information can be transmitted or received by wireless or wire communication between the communication device 9400 and the display device 9410, each of which has a rechargeable battery.

This embodiment can be implemented in appropriate combination with any of the structures described in the other embodiments.

This application is based on Japanese Patent Application serial no. 2008-333788 filed with Japan Patent Office on Dec. 26, 2008, the entire contents of which are hereby incorporated by reference.

What is claimed is:

1. An active matrix display device comprising:
   a transistor which comprises:
      a gate electrode over a substrate;
      a gate insulating layer over the gate electrode; and
      an oxide semiconductor layer having a channel formation region over the gate electrode with the gate insulating layer interposed therebetween, the oxide semiconductor layer comprising indium, tin and zinc;
   an insulating layer comprising aluminum oxide over the oxide semiconductor layer;
   a pixel electrode in electrical contact with the oxide semiconductor layer; and
   a terminal portion which comprises:
      a first conductive layer over the substrate;
      an insulating layer over the first conductive layer; and
      a transparent conductive film over the insulating layer, wherein the transparent conductive film is overlapped with the first conductive layer,
   wherein the oxide semiconductor layer includes a first oxide semiconductor layer and a second oxide semiconductor layer on the first oxide semiconductor layer, the first oxide semiconductor layer having a lower resistivity than the second oxide semiconductor layer, and
   wherein the first conductive layer is electrically floating.

2. An active matrix display device comprising:
   a pixel comprising:
      a transistor over a substrate; and
      a pixel electrode in electrical contact with the transistor;
   a terminal portion; and
   a driver circuit operationally connected to the pixel, the driver circuit comprising an inverter circuit, the inverter circuit comprising:
      a first transistor; and
      a second transistor,
      wherein a source of the first transistor is electrically connected to a drain of the second transistor; and
      wherein a gate of the first transistor is electrically connected to the source of the first transistor,
   each of the transistor of the pixel, the first transistor and the second transistor comprising:
      a gate electrode;
      a gate insulating layer over the gate electrode; and
      an oxide semiconductor layer having a channel formation region over the gate electrode with the gate insulating layer interposed therebetween, the oxide semiconductor layer comprising indium, tin and zinc,
   the terminal portion comprising:
      a first conductive layer over the substrate;
      an insulating layer over the first conductive layer; and
      a transparent conductive film over the insulating layer, wherein the transparent conductive film is overlapped with the first conductive layer,
   wherein the oxide semiconductor layer includes a first oxide semiconductor layer and a second oxide semiconductor layer on the first oxide semiconductor layer, the first oxide semiconductor layer having a lower resistivity than the second oxide semiconductor layer, and
   wherein the first conductive layer is electrically floating.

3. An active matrix display device comprising:
   a pixel comprising:
      a transistor over a substrate; and
      a pixel electrode in electrical contact with the transistor;
   a terminal portion; and
   a driver circuit operationally connected to the pixel, the driver circuit comprising an inverter circuit, the inverter circuit comprising:
      a first transistor; and
      a second transistor;
      wherein a source of the first transistor is electrically connected to a drain of the second transistor; and
      wherein a gate of the first transistor is electrically connected to a drain of the first transistor,
   wherein each of the transistor of the pixel, the first transistor and the second transistor comprises:
      a gate electrode;
      a gate insulating layer over the gate electrode; and
      an oxide semiconductor layer having a channel formation region over the gate electrode with the gate insulating layer interposed therebetween, the oxide semiconductor layer comprising indium, tin and zinc,
   wherein the terminal portion comprises:
      a first conductive layer over the substrate;
      an insulating layer over the first conductive layer; and
      a transparent conductive film over the insulating layer, wherein the transparent conductive film is overlapped with the first conductive layer,
   wherein the oxide semiconductor layer includes a first oxide semiconductor layer and a second oxide semiconductor layer on the first oxide semiconductor layer, the first oxide semiconductor layer having a lower resistivity than the second oxide semiconductor layer, and
   wherein the first conductive layer is electrically floating.

4. The active matrix display device according to any one of claims 1, 2 and 3, wherein the active matrix display device is a liquid crystal device.

5. The active matrix display device according to any one of claims 1, 2 and 3, wherein the active matrix display device is a light emitting device.

6. The active matrix display device according to any one of claims 1, 2 and 3, wherein the oxide semiconductor layer is amorphous.

7. The active matrix display device according to any one of claims 1, 2 and 3, wherein the oxide semiconductor layer contains an insulating impurity.

8. The active matrix display device according to claim 1, wherein, in a plan view, the oxide semiconductor layer is completely overlapped by the gate electrode.

9. The active matrix display device according to claim 2, wherein, in a plan view, in at least the transistor of the pixel, the oxide semiconductor layer is completely overlapped by the gate electrode.

10. The active matrix display device according to claim 3, wherein, in a plan view, in at least the transistor of the pixel, the oxide semiconductor layer is completely overlapped by the gate electrode.

11. The active matrix display device according to claim 1, further comprising an FPC connected with the transparent conductive film of the terminal portion.

12. The active matrix display device according to claim 2, further comprising an FPC connected with the transparent conductive film of the terminal portion.

13. The active matrix display device according to claim 3, further comprising an FPC connected with the transparent conductive film of the terminal portion.

* * * * *